US009711433B2

(12) United States Patent
Taniguchi et al.

(10) Patent No.: US 9,711,433 B2
(45) Date of Patent: Jul. 18, 2017

(54) SEMICONDUCTOR DEVICE, METHOD OF MANUFACTURING THE SAME, AND ELECTRONIC DEVICE

(71) Applicant: FUJITSU LIMITED, Kawasaki-shi, Kanagawa (JP)

(72) Inventors: Jun Taniguchi, Isehara (JP); Takeshi Shioga, Atsugi (JP); Yoshihiro Mizuno, Kobe (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/931,012

(22) Filed: Nov. 3, 2015

(65) Prior Publication Data

US 2016/0056089 A1 Feb. 25, 2016

Related U.S. Application Data

(63) Continuation of application No. PCT/JP2014/051524, filed on Jan. 24, 2014.

(30) Foreign Application Priority Data

May 17, 2013 (JP) ................................ 2013-104824

(51) Int. Cl.
*H01L 23/473* (2006.01)
*H01L 23/367* (2006.01)
(Continued)

(52) U.S. Cl.
CPC ........ *H01L 23/473* (2013.01); *H01L 21/3081* (2013.01); *H01L 21/30625* (2013.01);
(Continued)

(58) Field of Classification Search
CPC ....... H01L 23/473; H01L 24/81; H01L 23/12; H01L 2924/15787; H01L 2924/351;
(Continued)

(56) References Cited

U.S. PATENT DOCUMENTS 5,091,772 A * 2/1992 Kohara .................. H01L 23/13 257/692
5,458,716 A * 10/1995 Alfaro .................... H01L 21/50 156/245

(Continued)

FOREIGN PATENT DOCUMENTS

JP 2005-180871 7/2005
JP 2008-153423 7/2008

(Continued)

OTHER PUBLICATIONS

International Search Report and Written Opinion of the International Searching Authority (Form PCT/ISA/210, Form PCT/ISA/237), mailed in connection with PCT/JP2014/051524 and mailed Apr. 28, 2014. Partial English translation (7 pages).

(Continued)

*Primary Examiner* — Jarrett Stark
(74) *Attorney, Agent, or Firm* — Fujitsu Patent Center

(57) ABSTRACT

A semiconductor device includes: a first semiconductor element; a first substrate provided on the first semiconductor element and including a cavity with reduced pressure; coolant held inside the cavity; a second semiconductor element provided on the first substrate; and a heat spreading member thermally connected to the first substrate and provided with a hole communicated with the cavity.

12 Claims, 49 Drawing Sheets

62
63
61
42
41
30
30x
30y
39a
39
46
45
46
21
48
48
22
23
24
25
26
C
C
S
S

(51) Int. Cl.

| | |
|---|---|
| ***H01L 21/48*** | (2006.01) |
| ***H01L 25/065*** | (2006.01) |
| ***H01L 21/306*** | (2006.01) |
| ***H01L 21/308*** | (2006.01) |
| ***H01L 21/322*** | (2006.01) |
| ***H01L 21/54*** | (2006.01) |
| ***H01L 23/427*** | (2006.01) |
| ***H01L 23/522*** | (2006.01) |
| *H01L 23/40* | (2006.01) |
| *H01L 23/10* | (2006.01) |
| *H01L 23/16* | (2006.01) |

(52) U.S. Cl.
CPC ...... *H01L 21/3223* (2013.01); *H01L 21/4882* (2013.01); *H01L 21/54* (2013.01); *H01L 23/3677* (2013.01); *H01L 23/427* (2013.01); *H01L 23/5226* (2013.01); *H01L 25/0657* (2013.01); *H01L 23/10* (2013.01); *H01L 23/16* (2013.01); *H01L 23/4006* (2013.01); *H01L 2224/73204* (2013.01); *H01L 2225/06517* (2013.01); *H01L 2225/06541* (2013.01); *H01L 2225/06548* (2013.01); *H01L 2225/06572* (2013.01); *H01L 2225/06589* (2013.01); *H01L 2924/15311* (2013.01)

(58) Field of Classification Search
CPC ... H01L 2924/1305; H01L 2224/81085; H01L 2924/13055; H01L 2224/32225; H01L 23/3735
See application file for complete search history.

(56) References Cited

U.S. PATENT DOCUMENTS 5,701,033 A * 12/1997 Ueda .................... H01L 23/057 257/704
6,890,798 B2 * 5/2005 McMahon ........ H01L 23/49833 257/E23.063
7,569,957 B2 * 8/2009 Aoki .................... H01L 23/473 310/52
7,859,103 B2 * 12/2010 Aoki .................... H01L 23/473 257/714
8,987,893 B1 * 3/2015 Sutardja ................ H01L 23/427 257/713
9,159,645 B2 * 10/2015 Mori .................... H01L 23/473
2001/0014029 A1 * 8/2001 Suzuki .................. H02M 7/003 363/141
2005/0155745 A1 7/2005 Kawahara et al.
2005/0168947 A1 * 8/2005 Mok .................... H01L 23/427 361/698
2005/0280141 A1 * 12/2005 Zhang ................ H01L 23/3128 257/707
2006/0060963 A1 * 3/2006 Chang ................ H01L 25/0652 257/706
2009/0057881 A1 * 3/2009 Arana .................. H01L 23/473 257/714
2009/0065178 A1 * 3/2009 Kasezawa ............ H01L 23/473 165/104.19
2010/0187682 A1 7/2010 Pinjala et al.
2010/0230805 A1 9/2010 Refai-Ahmed
2012/0018741 A1 * 1/2012 Sato ...................... H02M 7/003 257/77
2012/0268877 A1 10/2012 Rice et al.
2013/0069218 A1 * 3/2013 Seah ...................... H01L 23/13 257/712
2014/0268548 A1 9/2014 Rice et al.
2015/0255427 A1 * 9/2015 Sung .................. H01L 25/0652 257/737

FOREIGN PATENT DOCUMENTS

| | | |
|---|---|---|
| JP | 2010-087461 | 4/2010 |
| JP | 2011-145044 | 7/2011 |
| JP | 2011-205018 | 10/2011 |
| JP | 2012-089642 | 5/2012 |
| JP | 2012-520575 | 9/2012 |
| JP | 2012-229909 | 11/2012 |
| JP | 3181382 | 1/2013 |

OTHER PUBLICATIONS

JPOA—Office Action mailed on Sep. 13, 2016 for corresponding to Japanese Patent Application No. 2015-516924, with partial English translation of the Office Action. ** All remaining references were previously submitted in the IDS filed on Nov. 3, 2015.

JPOA—Office Action of Japanese Patent Application No. 2015-516924 dated Jun. 21, 2016, with partial translation of the Office Action. Remaining references were previously submitted in the IDS filed on Nov. 3, 2015. .

JPOA—Office Action mailed on May 9, 2017 for corresponding to Japanese Patent Application No. 2015-516924, with full machine translation of the Office Action. **All references cited in the JPOA were previously submitted in the IDS.

* cited by examiner 46
45
46
30x
30y
41
42
25
26
59
24
24
23
22
30
39
30c
59
25
59
39
39
30b
39
30a
21
46
45
46

62
61
63
41
42
30x
30y
39a
39
S
C
S
C
26
25
30
24
23
22
48
48
21
46
45
46

60
41
42
26
V
IV
25
25y
S
C
29
35
32
25z
A
26z
24
23
22
30
48
21
45

80
81
82
83
82
83
85
30
42
41
26
25
24
23
22
48
48
21
20
84
86

LIQUID PHASE
GAS-LIQUID TWO PHASE
P
51d
B
25
EMBODIMENT

LIQUID PHASE
GAS-LIQUID TWO PHASE
P
51d
B
25
COMPARATIVE EXAMPLE

S
92
51a
91
55b
51b
51d
25x
51
55

S
92
51a
91
C
58
32
55a
25x
51
55
25

51x
51x
51x
D1
D2
D3
92
51a
51a
92
51a
51

SEMICONDUCTOR DEVICE, METHOD OF MANUFACTURING THE SAME, AND ELECTRONIC DEVICE

CROSS-REFERENCE TO RELATED APPLICATION

This application is a continuation of International Patent Application No. PCT/JP2014/051524 filed Jan. 24, 2014, which claims priority to Japanese Patent Application No. 2013-104824, filed May 17, 2013, and designated the U.S., the entire contents of which are incorporated herein by reference.

FIELD

The embodiments discussed herein are related to a semiconductor device, a method of manufacturing the same, and an electronic device.

BACKGROUND

With advances in functions of electronic devices such as servers, a three-dimensional packaging technique is attracting attention as a packaging technique for semiconductor devices mounted on the electronic devices. The three-dimensional packaging technique is a technique of stacking a plurality of semiconductor elements in one semiconductor device and may achieve advances in functions of the semiconductor device.

The semiconductor device using the three-dimensional packaging technique is preferably provided with a heat dissipation mechanism for rapidly releasing heat generated in the plurality of semiconductor elements to the outside. Regarding the heat dissipation mechanism, there are air-cooling heat dissipation mechanisms which cool the semiconductor device by using outside air and liquid-cooling heat dissipation mechanisms which cool the semiconductor device by using coolant such as water.

Among them, as the liquid-cooling heat dissipation mechanism, there is proposed a type of heat dissipation mechanism in which a flow passage formed by finely processing a silicon substrate is arranged between the stacked semiconductor elements to efficiently cool the semiconductor device. However, due to technical difficulties, productization of such a heat dissipation mechanism has not been achieved.

Note that techniques relating to the present application are disclosed in Japanese Laid-open Patent Publication Nos. 2012-520575, 2008-153423 and 2005-180871.

SUMMARY

One aspect of the following disclosure provides a semiconductor device including: a first semiconductor element; a first substrate provided on the first semiconductor element and including a cavity with reduced pressure; a coolant held inside the cavity; a second semiconductor element provided on the first substrate; and a heat spreading member thermally connected to the first substrate and provided with a hole communicated with the cavity.

Moreover, another aspect of the disclosure provides an electronic device including a semiconductor device having: a first semiconductor element; a substrate provided on the first semiconductor element and including a cavity with reduced pressure; a coolant held inside the cavity; a second semiconductor element provided on the substrate; and a heat spreading member thermally connected to the substrate and provided with a hole communicated with the cavity.

Furthermore, yet another aspect of the disclosure provides a method of manufacturing a semiconductor device, the method including: attaching a substrate, where a cavity being provided in the substrate, onto a first semiconductor element; attaching a second semiconductor element onto the substrate; thermally connecting a heat spreading member to the substrate, the heat spreading member being provided with a hole communicated with the cavity; supplying a coolant from the hole into the cavity; after the supplying a coolant, reducing a pressure in the cavity via the hole; and after the reducing a pressure in the cavity, closing the hole.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to the description of embodiments, results of research made by the inventors of the present application are described.

Figure 1:
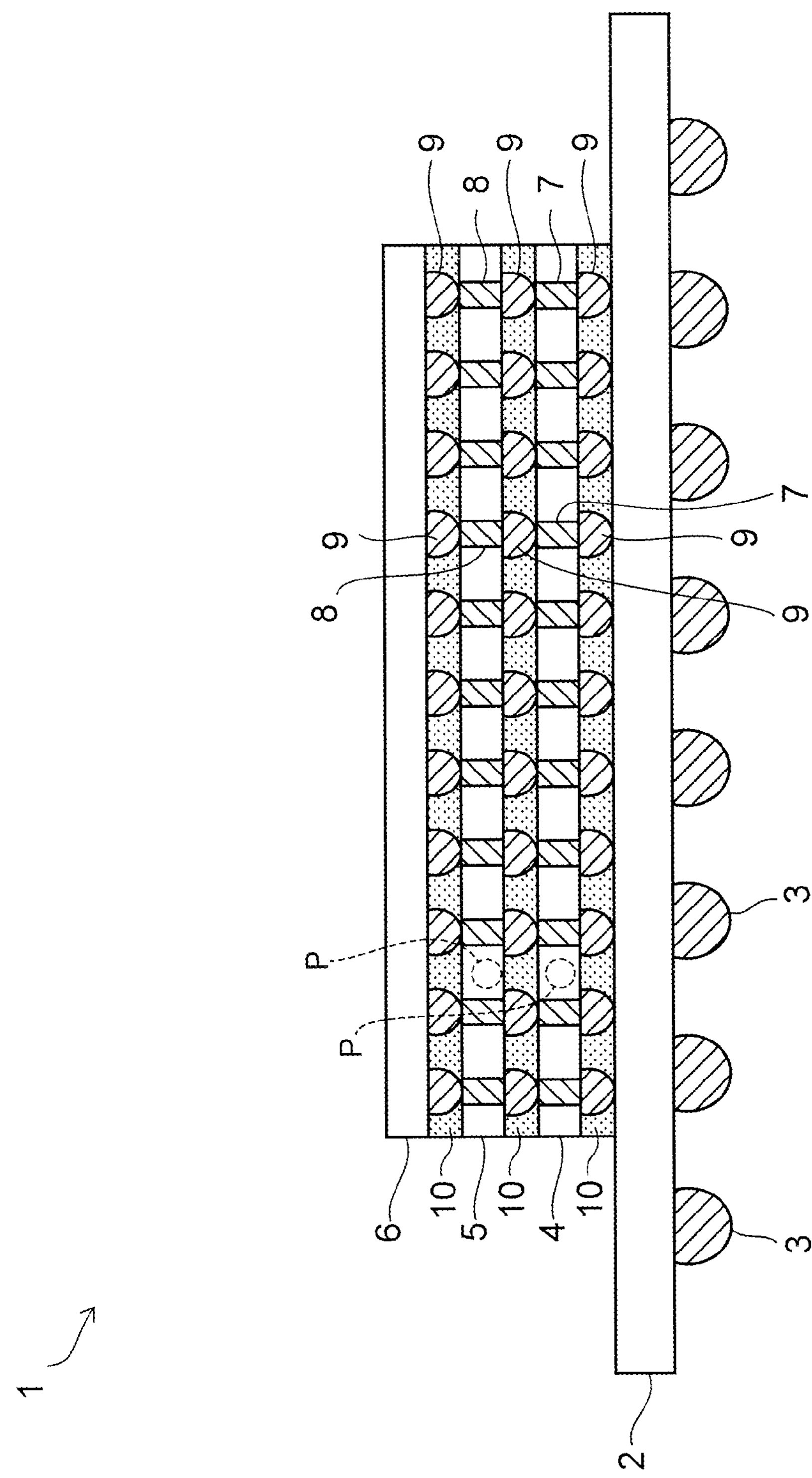
FIG. 1 is a cross-sectional view of a semiconductor device used in research made by the inventors of the present application.

FIG. 1 is a cross-sectional view of a semiconductor device used in the research.

The semiconductor device 1 is formed by stacking first to third semiconductor elements 4 to 6 on a circuit board 2 in this order by using a three-dimensional packaging technique.

The circuit board 2 is, for example, a multi-layer wiring board, and a plurality of bumps are provided on a main surface side of the circuit board 2 as external connection terminals 3.

Meanwhile, the first to third semiconductor elements 4 to 6 are electrically connected to one another via terminals 9 such as solder bumps, and bonding strength of the semiconductor elements 4 to 6 is increased by an underfill resin 10 provided between each adjacent two of the semiconductor elements 4 to 6.

Note that, out of the first to third semiconductor elements 4 to 6, the first and second semiconductor elements 4 and 5 of the lower two stages are provided with first and second conductive plugs 7 and 8. The conductive plugs 7 and 8 penetrate the semiconductor elements 4 and 5 and are bonded to the aforementioned terminals 9. The conductive plugs 7 and which penetrate the semiconductor elements as described above are also referred to as TSVs (Through Silicon Vias).

The first to third semiconductor elements 4 to 6 generate heat while operating, and portions P where the heat is generated in the respective semiconductor elements 4 to 6 are sometimes locally concentrated. The portions P where the heat generation is concentrated are referred to as hotspots. When the hotspots P respectively in an upper semiconductor element and a lower semiconductor element overlap each other, the temperature of the semiconductor device 1 locally becomes very high.

Figure 2:
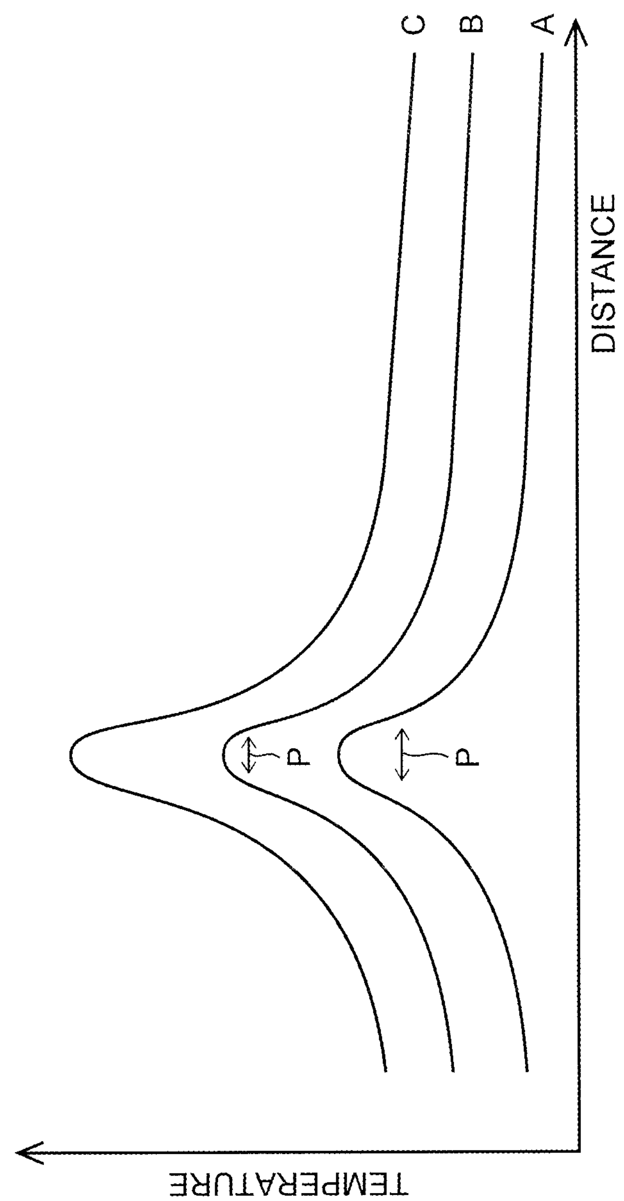
FIG. 2 is a graph schematically depicting temperature increase in the semiconductor device.

FIG. 2 is a graph schematically depicting such temperature increase in the semiconductor device 1. Graphs A to C in FIG. 2 respectively represent the temperatures of the first to third semiconductor elements 4 to 6. Note that the horizontal axis of the graphs A to C represents the position in the semiconductor elements 4 to 6 measured from a certain origin in a horizontal direction of the board.

As depicted in FIG. 2, overlapping of the hotspots of the respective semiconductor elements 4 to 6 causes the temperatures of the semiconductor elements 4 to 6 to locally become very high.

When the temperatures of the semiconductor elements 4 to 6 become high, there are risks of an increase in leakage currents in the semiconductor elements 4 to 6 and degradation of the semiconductor elements 4 to 6.

The semiconductor device 1 fabricated by using the three-dimensional packaging technique is thus preferably provided with a cooling mechanism which prevents local concentration of heat generation in the semiconductor elements 4 to 6 like one described above.

Embodiments using such a cooling mechanism are described below.

(First Embodiment) In the embodiment, a plurality of semiconductor elements are stacked one on top of another by using a three-dimensional packaging technique, and are cooled by a two-phase flow utilizing latent heat as described below.

Figure 3:
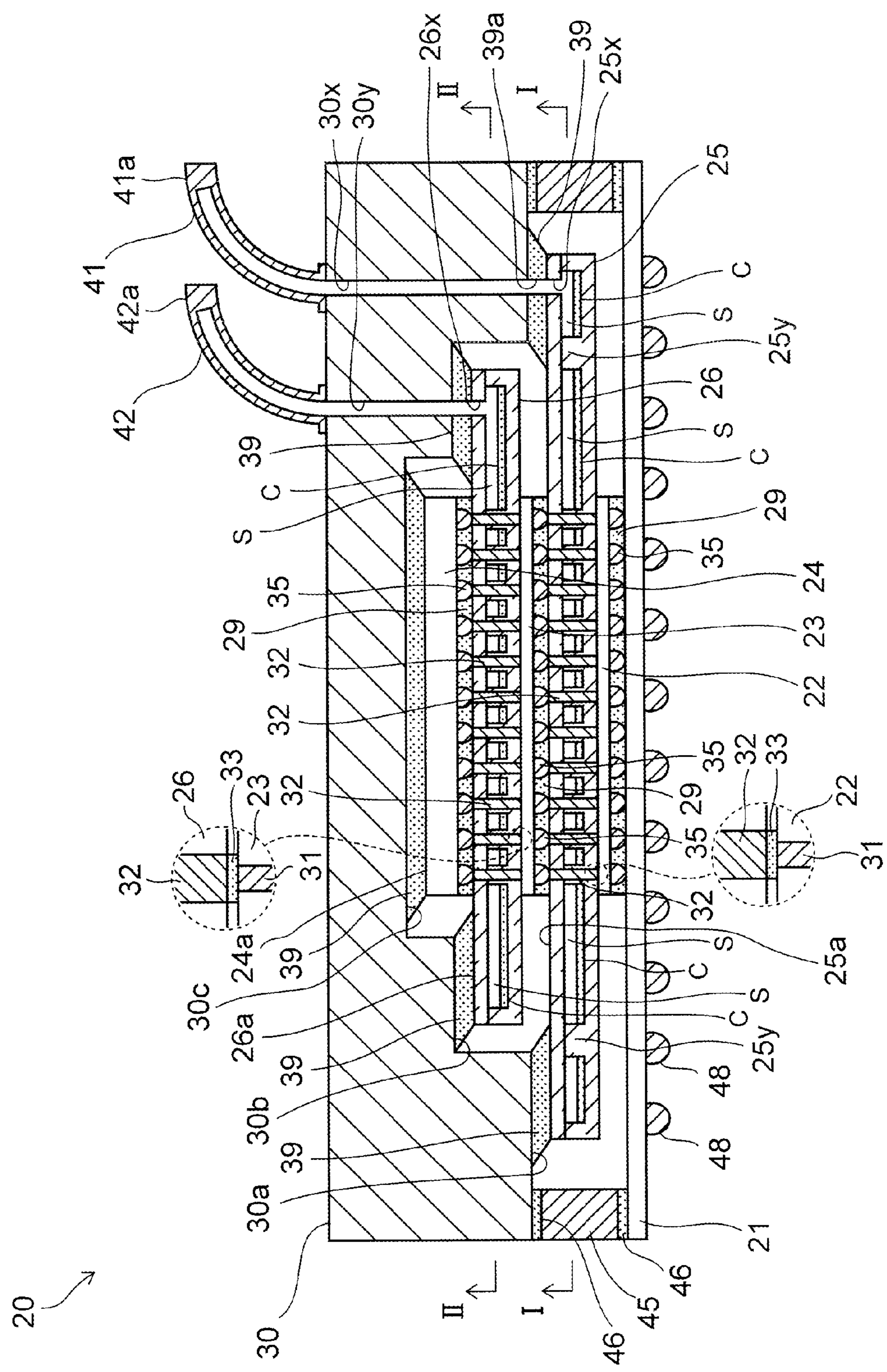
FIG. 3 is a cross-sectional view of a semiconductor device according to a first embodiment.

FIG. 3 is a cross-sectional view of a semiconductor device 20 according to the embodiment.

The semiconductor device 20 includes a circuit board 21, first to third semiconductor elements 22 to 24, first and second substrates 25 and 26, and a heat spreading member 30.

Among them, the first to third semiconductor elements 22 to 24 are each fabricated by forming a circuit on a silicon substrate by means of a semiconductor process. Moreover, as illustrated in dotted-line circles, the first and second semiconductor elements 22 and 23 are provided with first conductive plugs 31 which are TSVs penetrating these elements. The material of the first conductive plugs 31 is not limited to a particular material. In this example, copper which has excellent conductivity is used as the material of the first conductive plugs 31.

Meanwhile, the first and second substrates 25 and 26 are each fabricated by processing a silicon substrate as in the case of the first to third semiconductor elements 22 to 24. Inside each of the first and second substrates 25 and 26, there is defined a cavity S with reduced pressure which holds coolant C such as water or ethanol.

A substrate provided between each adjacent two of the semiconductor elements 22 to 24 such as the substrates 25 and 26 is also referred to as interposer. In the embodiment, the substrates 25 and 26 hold the aforementioned coolant C and are thereby made to have a cooling function achieved by the two-phase flow utilizing the latent heat.

Moreover, copper plugs penetrating the first and second substrates 25 and 26 are provided as second conductive plugs 32.

A connection mode of the aforementioned circuit board 21, first to third semiconductor elements 22 to 24, and first and second substrates 25 and 26 is not limited to a particular mode.

In the embodiment, solder bumps are provided between the circuit board 21 and the first semiconductor element 22 as terminals 35. The circuit board 21 and the first semiconductor element 22 are electrically and mechanically connected to each other via the terminals 35.

An underfill resin 29 for improving the bonding strength between the circuit board 21 and the first semiconductor element 22 is provided therebetween. The underfill resin 29 is also filled between the first semiconductor element 22 and the first substrate 25 and between the second semiconductor element 23 and the first substrate 25.

The underfill resin 29 is also filled between the second semiconductor element 23 and the second substrate 26 and between the third semiconductor element 24 and the second substrate 26.

Moreover, terminals 35 for connecting the first semiconductor element 22 and the first substrate 25 to each other are provided therebetween.

The terminals 35 are bonded to the first conductive plugs 31 of the first semiconductor element and the second conductive plugs 32 of the first substrate 25, and the first semiconductor element 22 and the first substrate 25 are thereby electrically and mechanically connected to each other. This is the same for the connection between the second semiconductor element 23 and the second substrate 26.

Note that it is possible to omit the terminals 35 and directly connect the first conductive plugs 31 and the second conductive plugs 32 to one another.

Moreover, terminals 35 are bonded to the second conductive plugs 32 of the first board 25, and the first board 25 and the second semiconductor element are thereby connected to each other. This is the same for the connection between the second board 26 and the third semiconductor element 24.

The size of each of the first to third semiconductor elements 22 to 24 and the first and second substrates 25 and 26 in a plan view is not limited to a particular size.

In the embodiment, an upper surface 25*a* of the first substrate 25 is made to extend beyond the second semiconductor element 23 by setting the size of the second semiconductor element 23 in the plan view smaller than that of the first substrate 25.

Similarly, an upper surface 26*a* of the second substrate 26 is made to extend beyond the third semiconductor element 24 by setting the size of the third semiconductor element 24 in the plan view smaller than that of the second substrate 26.

Meanwhile, the heat spreading member 30 has a function of releasing the heat generated inside the first to third semiconductor elements 22 to 24 to the outside, and metal with an excellent heat transfer property such as copper is used as the material of the heat spreading member 30. Note that the heat spreading member 30 also has a role of a lid covering the first and second substrates 25 and 26 and the first to third semiconductor elements 22 to 24.

Furthermore, an inner surface of the heat spreading member 30 includes first to third lower surfaces 30*a* to 30*c* varying in height.

The first lower surface 30*a* is thermally connected to the upper surface 25*a* of the first substrate 25 extending beyond the second semiconductor element 23 as described above, via a bonding member 39 made of materials such as solder and indium.

Meanwhile, the second lower surface 30*b* is located above the first lower surface 30*a*, and is thermally connected to the upper surface 26*a* of the second substrate 26 extending beyond the third semiconductor element 24 as described above, via a bonding member 39.

Moreover, the third lower surface 30*c* is located above the second lower surface 30*b*, and is thermally connected to an upper surface 24*a* of the third semiconductor element 24 via a bonding member 39.

Furthermore, a first hole 30*x* and a second hole 30*y* are provided in the heat spreading member 30. A first opening 25*x* is formed in the first substrate 25 below the first hole 30*x*, and the first hole 30*x* leads to the cavity S of the first substrate 25 via the first opening 25*x*.

Similarly, a second opening 26*x* is formed in the second substrate 26 below the second hole 30*y*, and the second hole 30*y* leads to the cavity S of the second substrate 26 via the second opening 26*x*.

Third openings 39*a* are provided in the bonding members 39 below the holes 30*x* and 30*y*. Since the bonding members 39 around the third openings 39*a* have an excellent adhesion property with the heat spreading member 30 and the substrates 25 and 26, there is no leakage of a reduced-pressure atmosphere inside the cavities S to the outside via the bonding members 39 around the openings 39*a*.

Moreover, a first pipe 41 and a second pipe 42 leading respectively to the first hole 30*x* and the second hole 30*y* are provided on the aforementioned heat spreading member 30. For example, metal such as copper may be used as the material of the first pipe 41 and second pipe 42. Furthermore, since terminal ends 41*a* and 42*a* of the pipes 41 and 42 are closed, air-tightness inside the cavities S of the first and second substrates 25 and 26 is maintained.

Moreover, the heat spreading member 30 is connected to a peripheral edge of the circuit board 21 via a metal stiffener 45. The stiffener 45 has a function of preventing warping of the circuit board 21 and is bonded to the circuit board 21 and the heat spreading member 30 by an adhesive 46. Note that functions of the stiffener 45 include a function of a spacer used to align the heights of the contact surfaces of the heat spreading member 30 with the heights of the semiconductor elements 22 to 24.

Furthermore, a plurality of solder bumps are provided on a back surface of the circuit board 21 as external connection terminals 48 of the semiconductor device 20.

Figure 4:
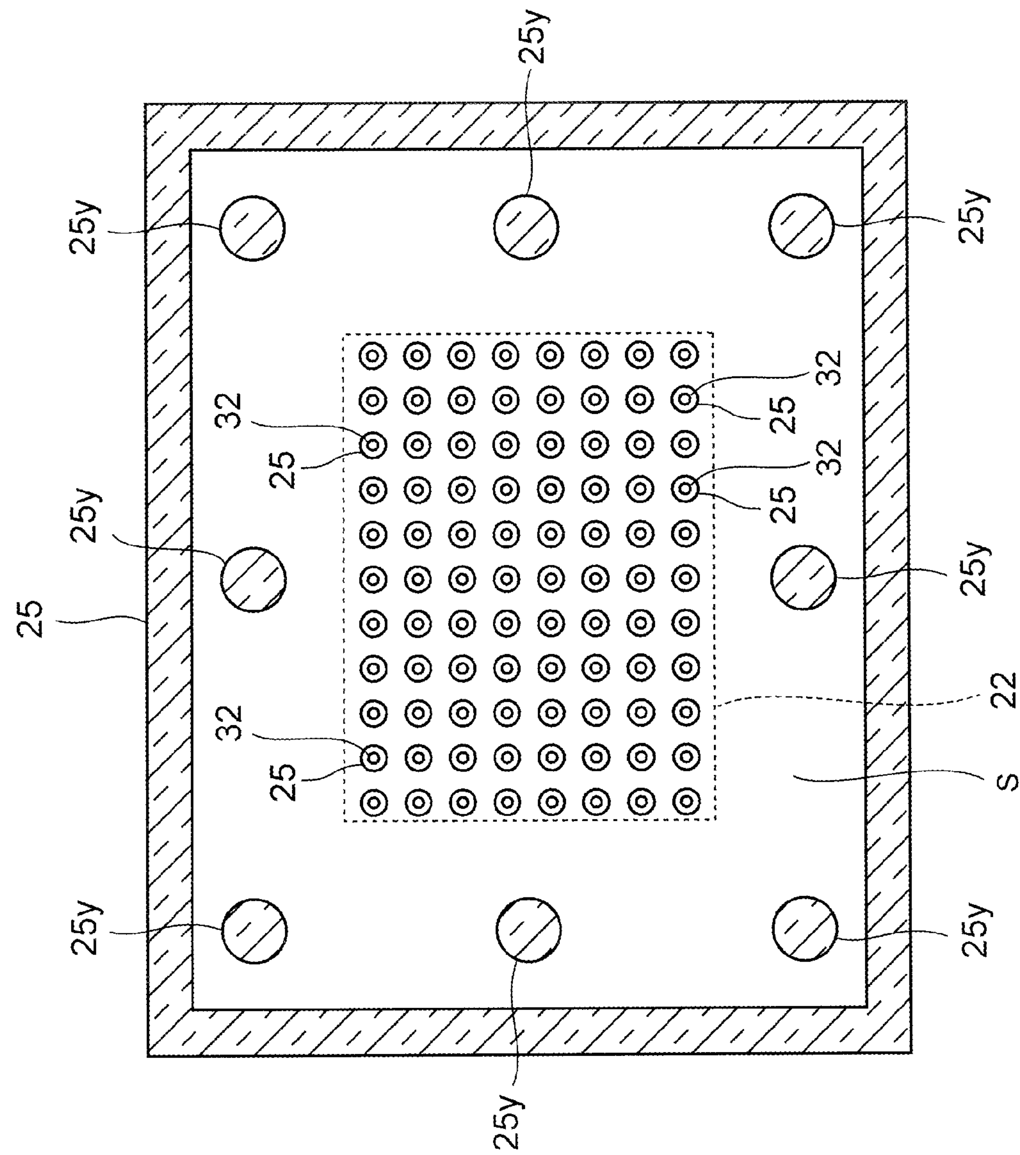
FIG. 4 is a plan view of a first substrate according to the first embodiment in which the first substrate is cut along the line I-I in FIG. 3.

FIG. 4 is a plan view of the aforementioned first substrate 25 in which the first substrate 25 is cut along the line I-I in FIG. 3.

As illustrated in FIG. 4, the aforementioned second conductive plugs 32 are provided at intervals in the plan view.

Furthermore, the cavity S is larger than the first semiconductor element 22 in the plan view. A plurality of pillars 25*y* are provided inside the cavity S to prevent decrease of the strength of the first substrate 25 due to the large cavity S. The strength of the first substrate 25 is thus increased by the pillars 25*y*.

Figure 5:
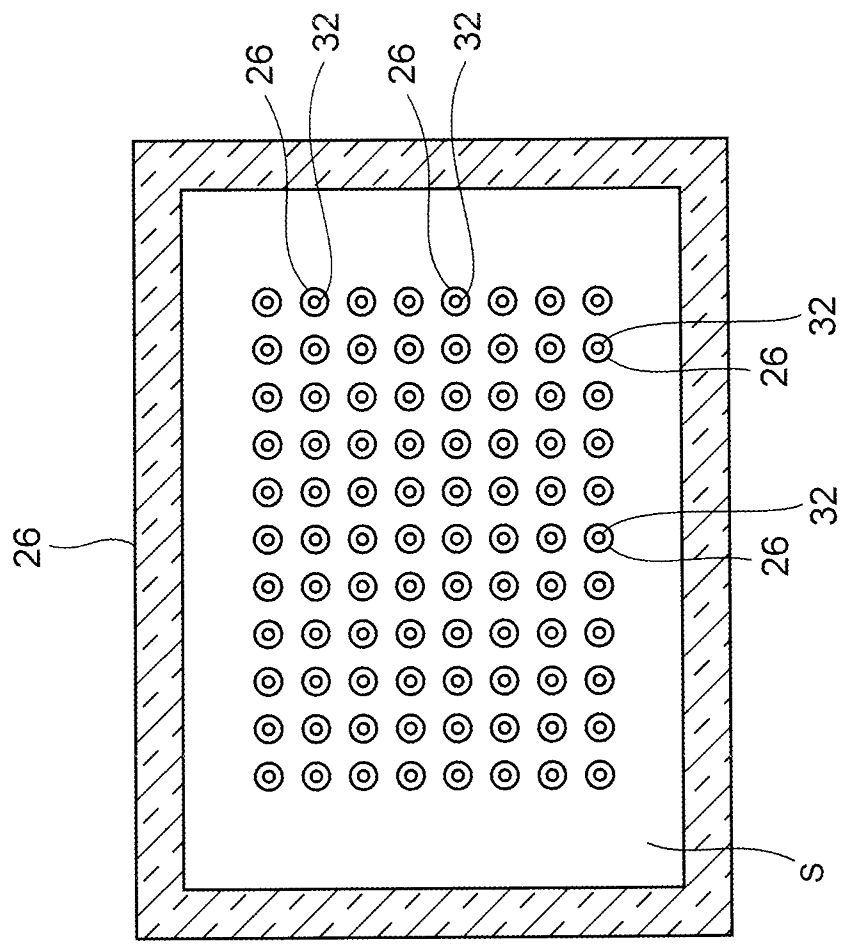
FIG. 5 is a plan view of a second substrate according to the first embodiment in which the second substrate is cut along the line II-II in FIG. 3.

FIG. 5 is a plan view of the aforementioned second substrate 26 in which the second substrate 26 is cut along the line II-II in FIG. 3.

Unlike the first substrate 25, the second substrate 26 of FIG. 5 is provided with no pillars. However, pillars may be provided in the cavity S of the second substrate 26 to reinforce the second substrate 26.

Next, operations of the aforementioned first substrate 25 and second substrate 26 are described with reference to FIGS. 6A and 6B.

Figure 6A:
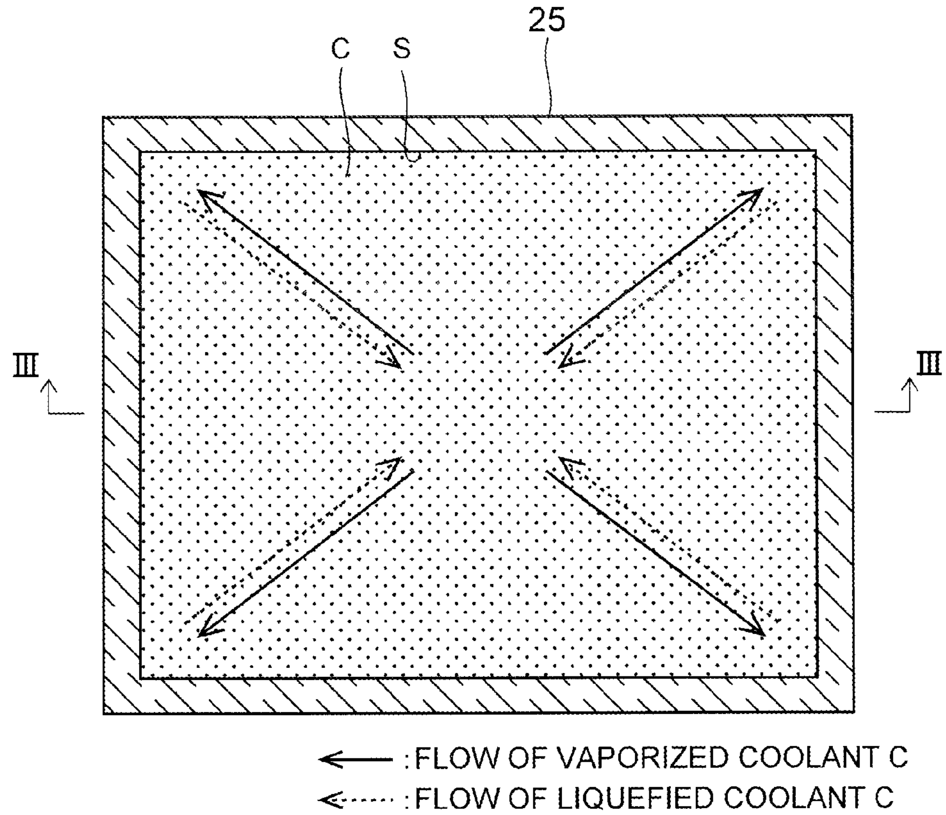
FIG. 6A is a schematic plan view of the first substrate according to the first embodiment.

FIG. 6A is a schematic plan view of the first substrate 25. In FIG. 6A, the pillars 25*y* and the second conductive plugs 32 are omitted to prevent the drawing from becoming complicated.

Figure 6B:
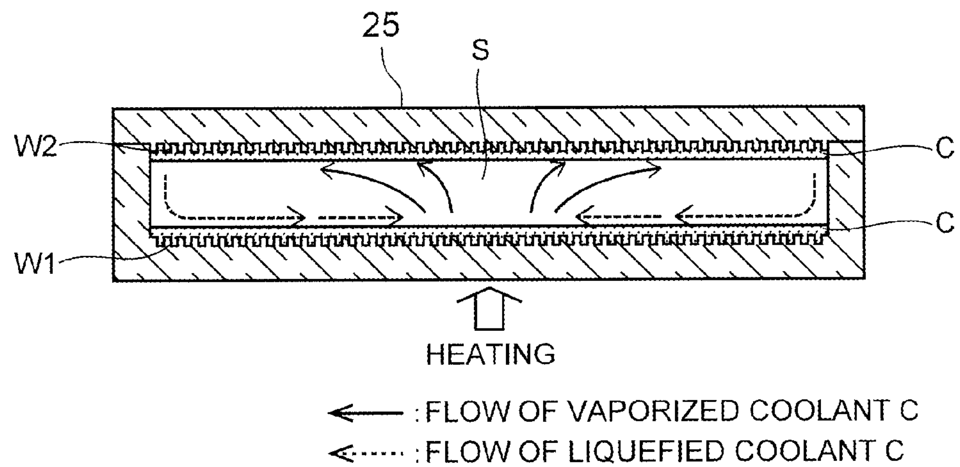
FIG. 6B is a cross-sectional view taken along the line III-III in FIG. 6A.

Meanwhile, FIG. 6B is a cross-sectional view taken along the line III-III in FIG. 6A.

As illustrated in FIG. 6B, in this example, first wicks W1 and second wicks W2 are provided on upper and lower surfaces of the cavity S. Among them, the first wicks W1 have a function of holding the coolant C in a liquid phase by using surface tension, and the second wicks W2 have a function of promoting condensation of the coolant C in a gas phase.

When the coolant C may be held and condensed without the wicks W1 and W2, the wicks W1 and W2 may be omitted.

When the first semiconductor element 22 (see FIG. 3) under the first substrate 25 generates heat, the lower surface of the first substrate 25 is heated.

The coolant C in the first wicks W1 is vaporized in the cavity S due to this heating. However, since the peripheral edge of the first substrate 25 is cooled by the heat spreading member 30 (see FIG. 3), the vaporized coolant C is cooled in the second wicks W2 in the peripheral edge of the first substrate 25 and is liquefied.

Moreover, when the first wicks W1 are heated as described above, the coolant C becomes scarce in the heated portion due to the vaporization of the coolant C and the coolant C flows into the heated portion from the surrounding portions.

As described above, in the first substrate 25, the coolant C is circulated inside the cavity S by being repeatedly heated and cooled and transfers the heat of the first semiconductor element 22 to the peripheral edge of the first substrate 25, and the first semiconductor element 22 may be thereby cooled.

Particularly, since the pressure inside the cavity S is reduced in this example, the vaporization of the coolant C by heating is facilitated and the circulation of the coolant C in the first substrate 25 may be promoted.

Furthermore, since the condensation of the coolant C is promoted by the second wicks W2, the coolant C in the liquid phase is rapidly moved along the second wicks W2 to the peripheral edge portion of the first substrate 25, and the amount of heat transferred by the coolant C may be increased.

Note that the coolant C also circulates inside the second substrate 26 as in the first substrate 25, and may cool the second semiconductor element 23.

As described above, in the embodiment, the semiconductor elements 22 to 24 may be cooled by the coolant C inside the substrates 25 and 26 by inserting the first substrate 25 between the first and second semiconductor elements 22 and 23 and inserting the second substrate 26 between the second and third semiconductor elements 23 and 24.

Accordingly, a case where the temperatures of the semiconductor elements 22 to 24 locally become very high may be suppressed even when the hot spots of the respective semiconductor elements 22 to 24 overlap one another as in FIG. 2. Hence, degradation of the semiconductor elements 22 to 24 due to heat may be prevented.

In addition, since the material of the first substrate 25 and the second substrate 26 is silicon like the first to third semiconductor elements 22 to 24, the amount of thermal expansion is less likely to vary among the substrates 25 and 26 and the semiconductor elements 22 to 24. Hence, it is possible to suppress contact failure among the substrates 25 and 26 and the semiconductor elements 22 to 24 due to variations in the amount of thermal expansion, and improve the reliability of the semiconductor device 20.

Next, a method of manufacturing the semiconductor device according to the embodiment is described.

First, a method of fabricating the first substrate 25 is described with reference to FIGS. 7A to 7I.

FIGS. 7A to 7I are cross-sectional views of the first substrate in the course of manufacturing thereof according to the embodiment.

Figure 7A:
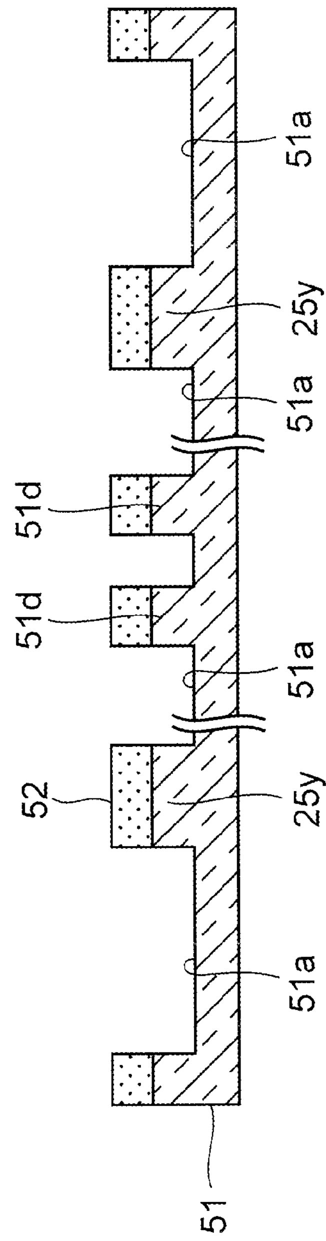
FIGS. 7A to 7I are cross-sectional views of the first substrate in the course of manufacturing thereof according to the first embodiment.

First, as illustrated in FIG. 7A, a first silicon substrate 51 having a thickness of about 300 μm to 500 μm is prepared, and a first resist film 52 is formed on the first silicon substrate 51. A wafer-like substrate which is not cut into individual pieces by dicing may be used as the first silicon substrate 51.

Then, the first silicon substrate 51 is dry-etched with the first resist film 52 used as a mask, and recess portions 51*a* are formed in the first silicon substrate 51.

Note that portions of the first silicon substrate 51 which are not etched and left are used as protrusions 51*d* and the aforementioned pillars 25*y* (see FIG. 4).

Moreover, an etching gas used in the etching is not limited to a particular gas. In this example, a mixed gas of $SF_6$ gas and $C_4F_8$ gas is used as the etching gas.

Thereafter, the first resist film 52 is removed.

Figure 7B:
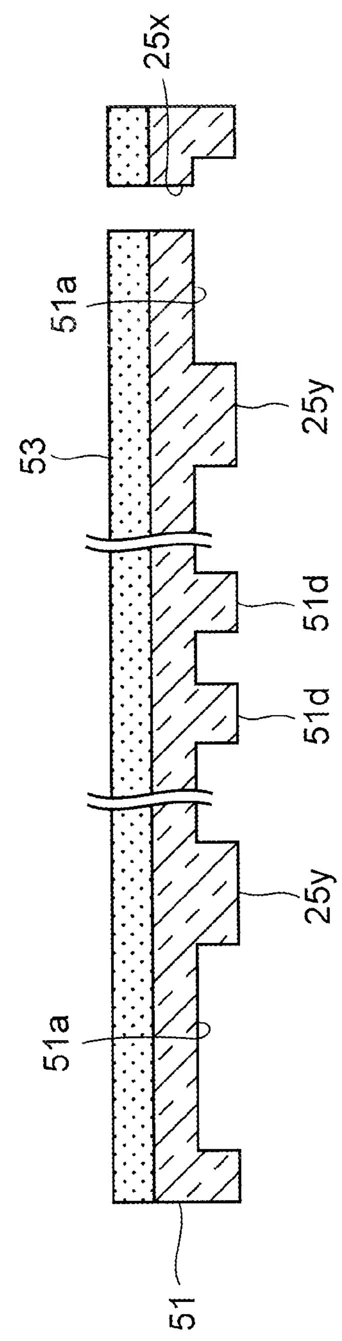

Next, as illustrated in FIG. 7B, a second resist film 53 is formed on the first silicon substrate 51 which is turned upside down from the state illustrated in FIG. 7A. Then, the first silicon substrate 51 is dry-etched with the second resist film 53 used as a mask, and the aforementioned first opening 25*x* is thereby formed in the first silicon substrate 51.

The diameter of the first opening 25*x* is not limited to a particular diameter, but is about 1 mm in this example.

Moreover, in the dry-etching, the mixed gas of $SF_6$ gas and $C_4F_8$ gas may be used as the etching gas as in FIG. 7A.

Thereafter, the second resist film 53 is removed.

Figure 7C:
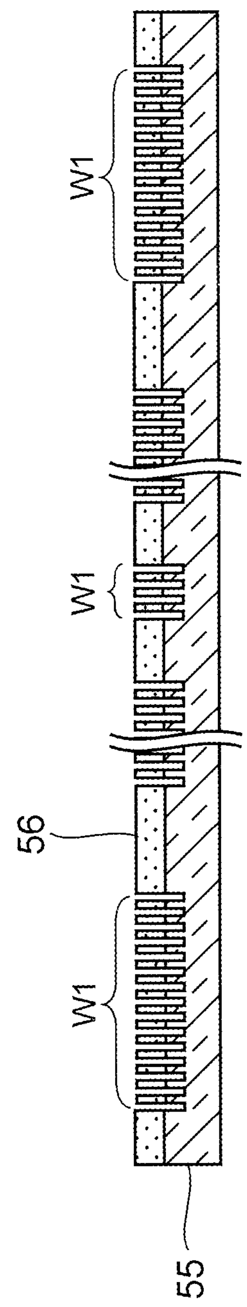

Then, as illustrated in FIG. 7C, a second silicon substrate 55 different from the aforementioned first silicon substrate 51 is prepared, and a third resist film 56 is formed on the second silicon substrate 55. A wafer-like substrate which is not cut into individual pieces by dicing may be used as the second silicon substrate 55 as in the case of the first silicon substrate 51.

Next, the second silicon substrate 55 is etched by dry etching using the mixed gas of $SF_6$ gas and $C_4F_8$ gas as an etching gas, with the third resist film 56 used as a mask.

A plurality of fine grooves are formed in the second silicon substrate 55 by this etching. These grooves form the aforementioned first wicks W1. The second wicks W2 (see FIG. 6B) may be formed in the first silicon substrate 51 (see FIG. 7B) in a similar method.

Thereafter, the third resist film 56 is removed.

Figure 7D:
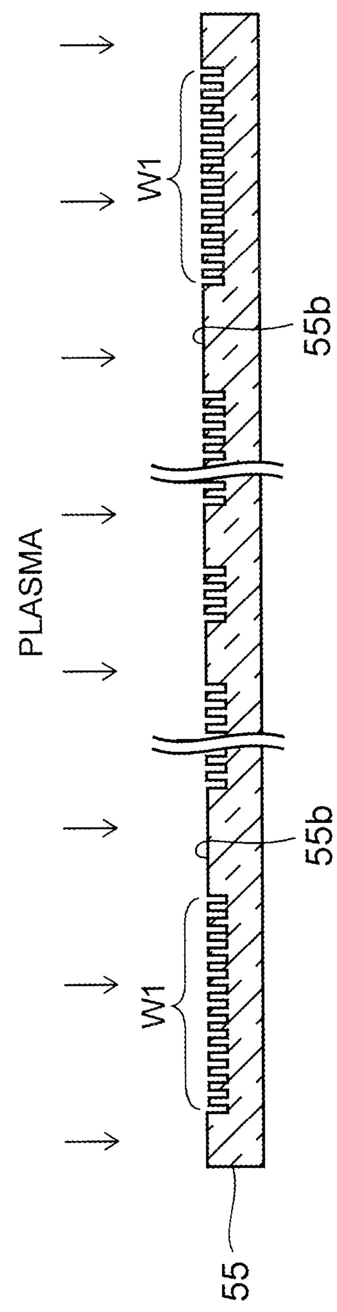

Then, as illustrated in FIG. 7D, an upper surface 55*b* of the second silicon substrate 55 is activated by being exposed to nitrogen plasma or oxygen plasma.

Figures 7E, 7F:
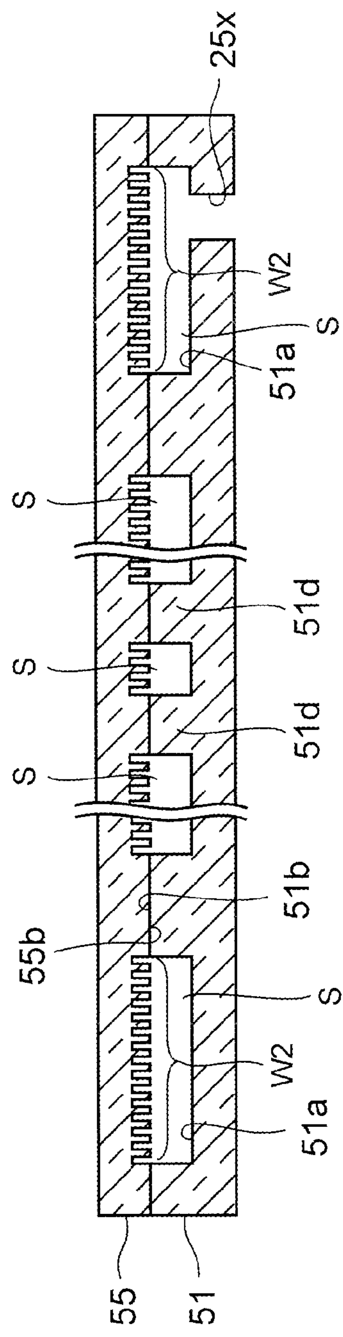

Next, steps performed to obtain a cross-sectional structure illustrated in FIG. 7E are described.

First, an upper surface 51*b* of the first silicon substrate 51 is activated by being exposed to nitrogen plasma or oxygen plasma as in the step of FIG. 7D.

Then, the first silicon substrate 51 and the second silicon substrate 55 are each cut into individual pieces by dicing, and the upper surfaces 51*b* and 55*b* activated by the aforementioned plasma processing are made to adhere to each other. Then, the silicon substrates 51 and 55 are bonded to each other by being heated at a temperature of about 300° C. for about two to three hours in this state. Such bonding method is also referred to as plasma activated bonding method.

The aforementioned upper surfaces 51*b* and 55*b* may be bonded to each other by a method of irradiating the upper surfaces 51*b* and 55*b* with argon ion beam, instead of the plasma activated bonding method. In this case, the heating of the first silicon substrate 51 and the second silicon substrate 55 is unnecessary, and the substrates may be bonded to each other at a room temperature.

Bonding the first silicon substrate 51 and the second silicon substrate 55 as described above forms the cavity S which is partially defined by the recess portions 51*a*.

Next, as illustrated in FIG. 7F, a fourth resist film 57 is formed on the second silicon substrate 55. Then, the first silicon substrate 51 and the second silicon substrate 55 are etched with the fourth resist film 57 used as a mask, and holes 55*a* are thereby formed in the protrusions 51*d*.

An etching gas usable in this dry etching includes, for example, the mixed gas of $SF_6$ gas and $C_4F_8$ gas.

Thereafter, the fourth resist film 57 is removed.

Figure 7G:
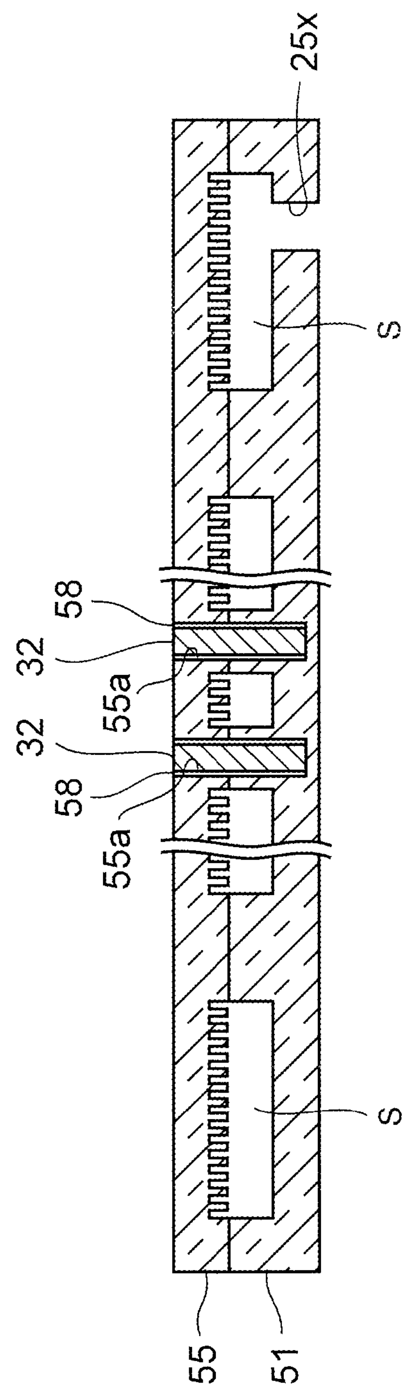

Next, as illustrated FIG. 7G, a silicon oxide film is formed on the second silicon substrate 55 and inside the holes 55*a* as an insulating film 58 by a CVD (Chemical Vapor Deposition) method, and then the insulating film 58 is etched back such that the insulating film 58 is left on side surfaces of the holes 55*a*.

Thereafter, a not-illustrated copper seed layer is formed in the holes 55*a* by a sputtering method, and a copper electroplating film is formed as the second conductive plugs 32 in the holes 55*a* with the seed layer used as an electricity supplying layer.

Figure 7H:
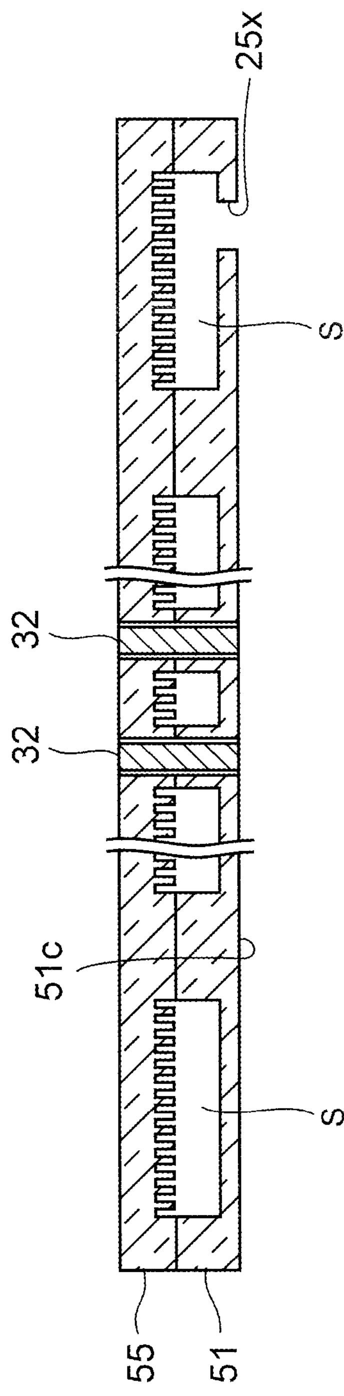

Next, as illustrated in FIG. 7H, a back surface 51*c* of the first silicon substrate 51 is subjected to back grind, and the second conductive plugs 32 is thereby exposed on the back surface 51*c*.

Figure 7I:
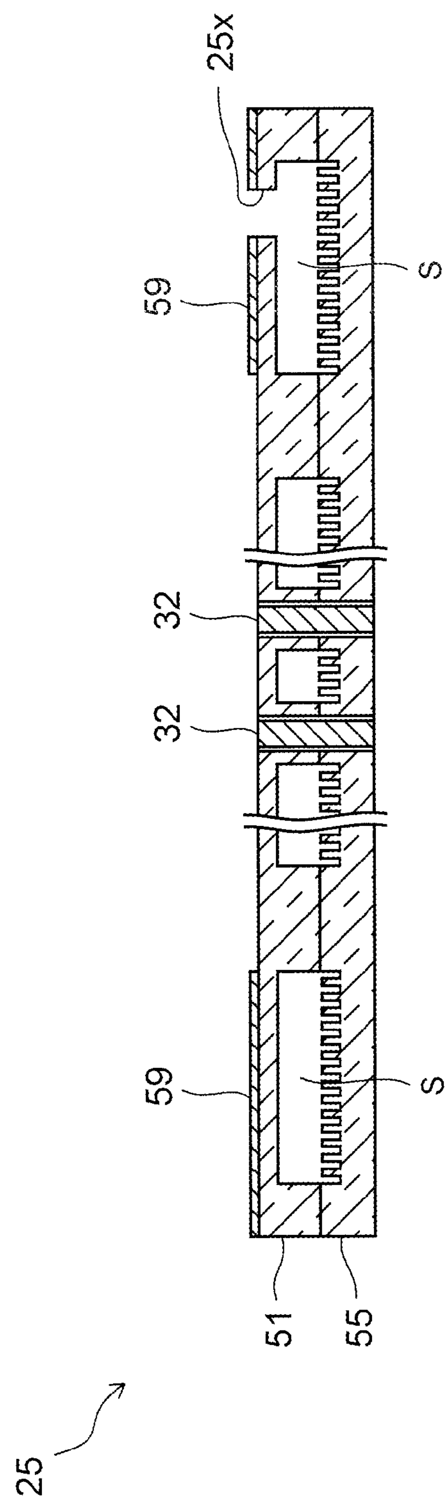

Then, as illustrated in FIG. 7I, a metal layer 59 is formed on the first silicon substrate 51 to improve wettability of the aforementioned bonding member 39 (see FIG. 3).

The metal layer 59 may be formed by, for example, forming a nickel layer and a titanium layer in this order from the lower side by a sputtering method and performing a lift-off method or the like such that these stacked films are left in a peripheral edge of the first silicon substrate 55.

A basic structure of the first substrate 25 is completed by the steps described above.

Note that the second substrate 26 (see FIG. 3) may be also fabricated in the same method as the first substrate 25.

Subsequent steps are described with reference to FIGS. 8A to 8D. FIGS. 8A to 8D are cross-sectional views of the semiconductor device in the course of manufacturing thereof according to the embodiment.

Figure 8A:
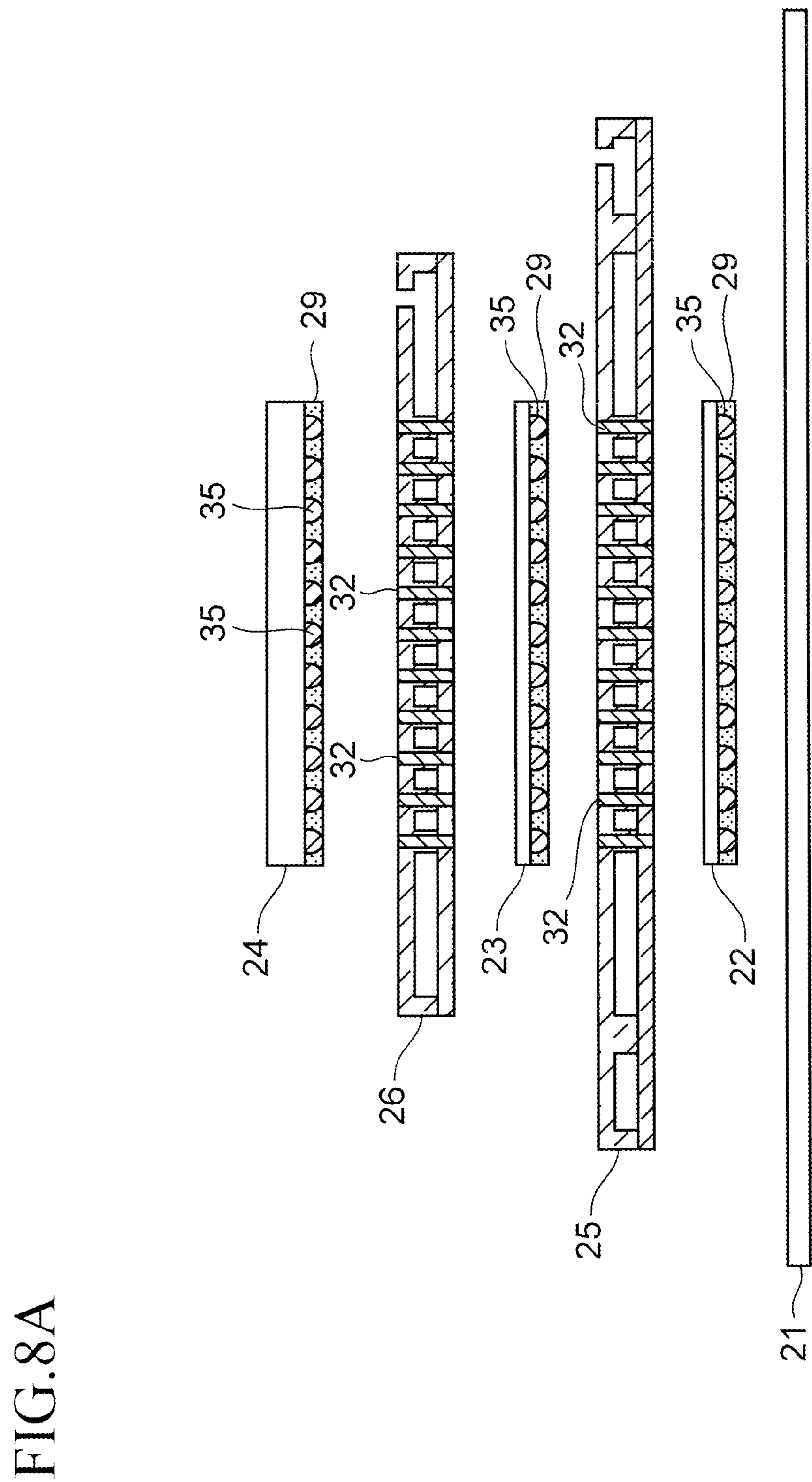
FIGS. 8A to 8D are cross-sectional views of the semiconductor device in the course of manufacturing thereof according to the first embodiment.

First, as illustrated in FIG. 8A, the first semiconductor element 22, the first substrate 25, the second semiconductor element 23, the second substrate 26, and the third semiconductor element 24 are stacked on the circuit board 21 in this order from the lower side.

Note that the terminals 35 such as solder bumps are bonded to each of the lower surfaces of the first substrate 25 and the second substrate 26 and the underfill resin 29 is provided around the terminals 35 in advance.

Then, the terminals 35 are melted by reflow, and the circuit board 21, the semiconductor elements 22 to 24, the first and second substrates 25 and 26 are fixedly attached to one another via the terminals 35.

Note that the underfill resin 29 is provided on the lower surface of the first semiconductor element in advance to improve the bonding strength between the first semiconductor element 22 and the circuit board 21. This is the same for the second semiconductor element 23 and the third semiconductor element 24.

Figure 8B:
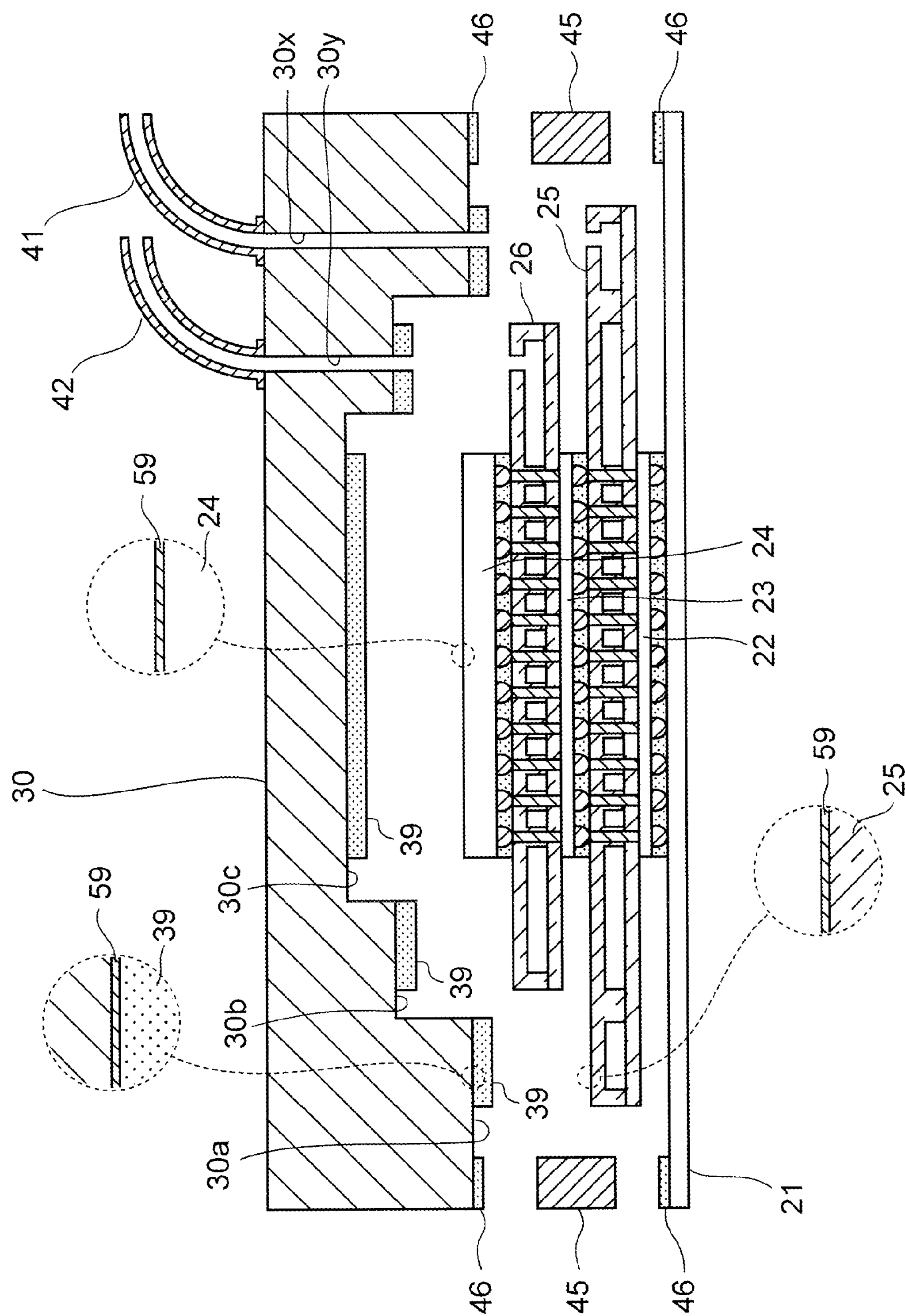

Next, as illustrated in FIG. 8B, the heat spreading member 30 provided with the aforementioned first and second pipes 41 and 42 made of metal is disposed on the circuit board 21 on which the first to third semiconductor elements 22 to 24 are stacked as described above.

The heat spreading member 30 has the first to third lower surfaces 30*a* to 30*c* varying in height as described above. Prior to the step of FIG. 8B, the aforementioned metal layer 59 is provided on each of the lower surfaces 30*a* to 30*c*. Moreover, the metal layer 59 is also provided on the third semiconductor element 24 in advance.

In this step, the bonding member 39 is disposed on the metal layer 59 of the first substrate and is heated and melted to connect the first substrate 25 and the heat spreading member 30 to each other via the bonding member 39. Solder and indium may be used as the material of the bonding member 39 as described above.

Moreover, the second substrate 26 and the heat spreading member 30 are connected to each other and the third semiconductor element 24 and the heat spreading member 30 are connected to each other in the same way.

Meanwhile, the circuit board 21 and the heat spreading member 30 are connected to each other via the adhesive 46 and the stiffener 45 as described above.

Figure 8C:
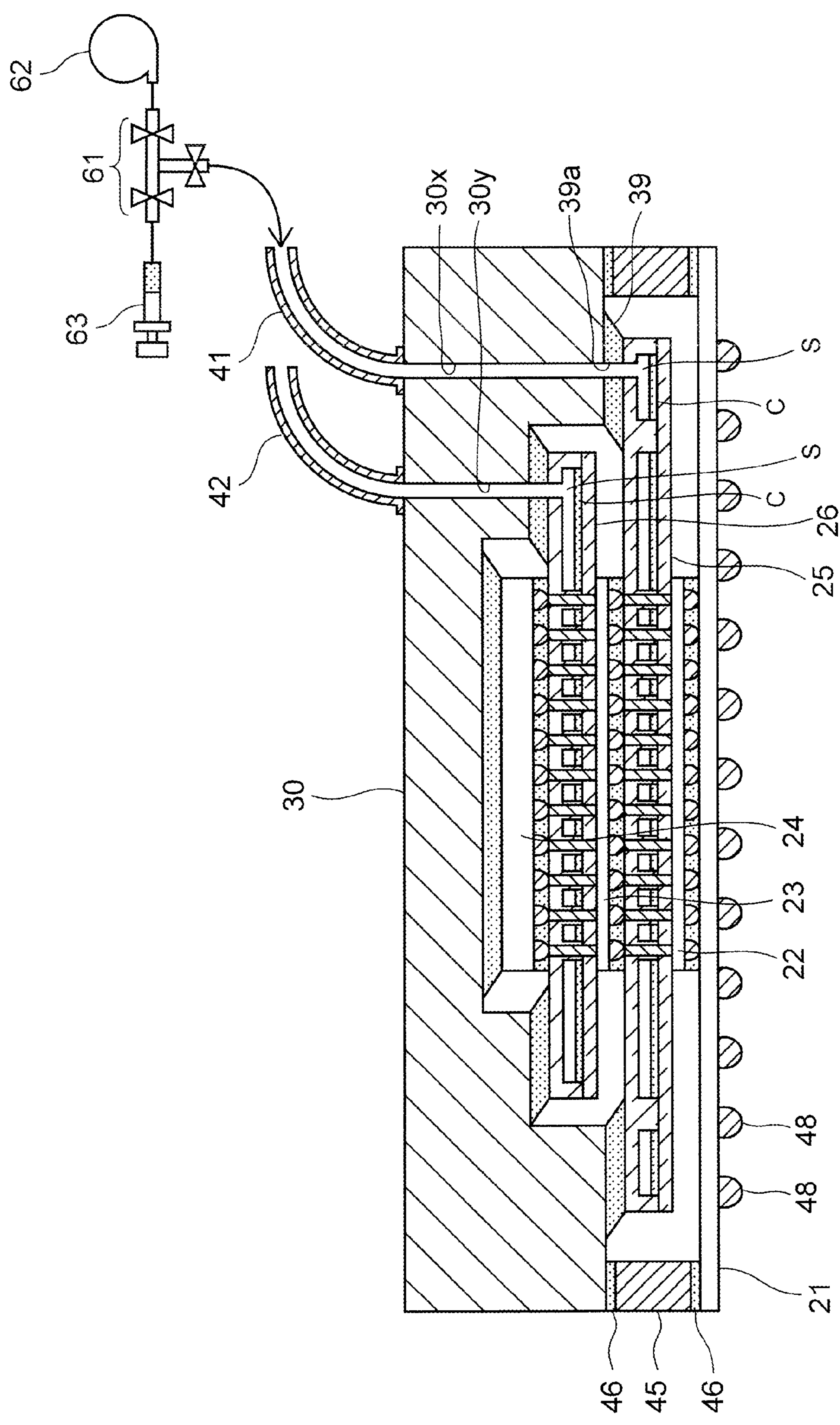

Next, a step illustrated in FIG. 8C is described.

First, a three-way valve 61 is prepared, and one of three conduit lines of the three-way valve 61 is connected to the first pipe 41. The other two conduit lines of the three-way valve 61 are connected respectively to a vacuum pump 62 and a coolant injecting unit 63.

Then, a flow passage of the three-way valve 61 is set such that a flow is directed from the coolant injecting unit 63 toward the first pipe 41, and the coolant C is thereby supplied from the coolant injecting unit 63 to the cavity S of the first substrate 25 via the first hole 30*x*.

Thereafter, the flow passage of the three-way valve 61 is set such that the flow is directed from the first pipe 41 toward the vacuum pump 62. Then, the vacuum pump 62 is activated in this state to reduce the pressure inside the cavity S via the first hole 30*x*.

The coolant C is supplied into the cavity S of the second substrate 26 via the second pipe 42 in the same way, and the pressure inside the cavity S is then reduced via the second pipe 42.

Figure 8D:
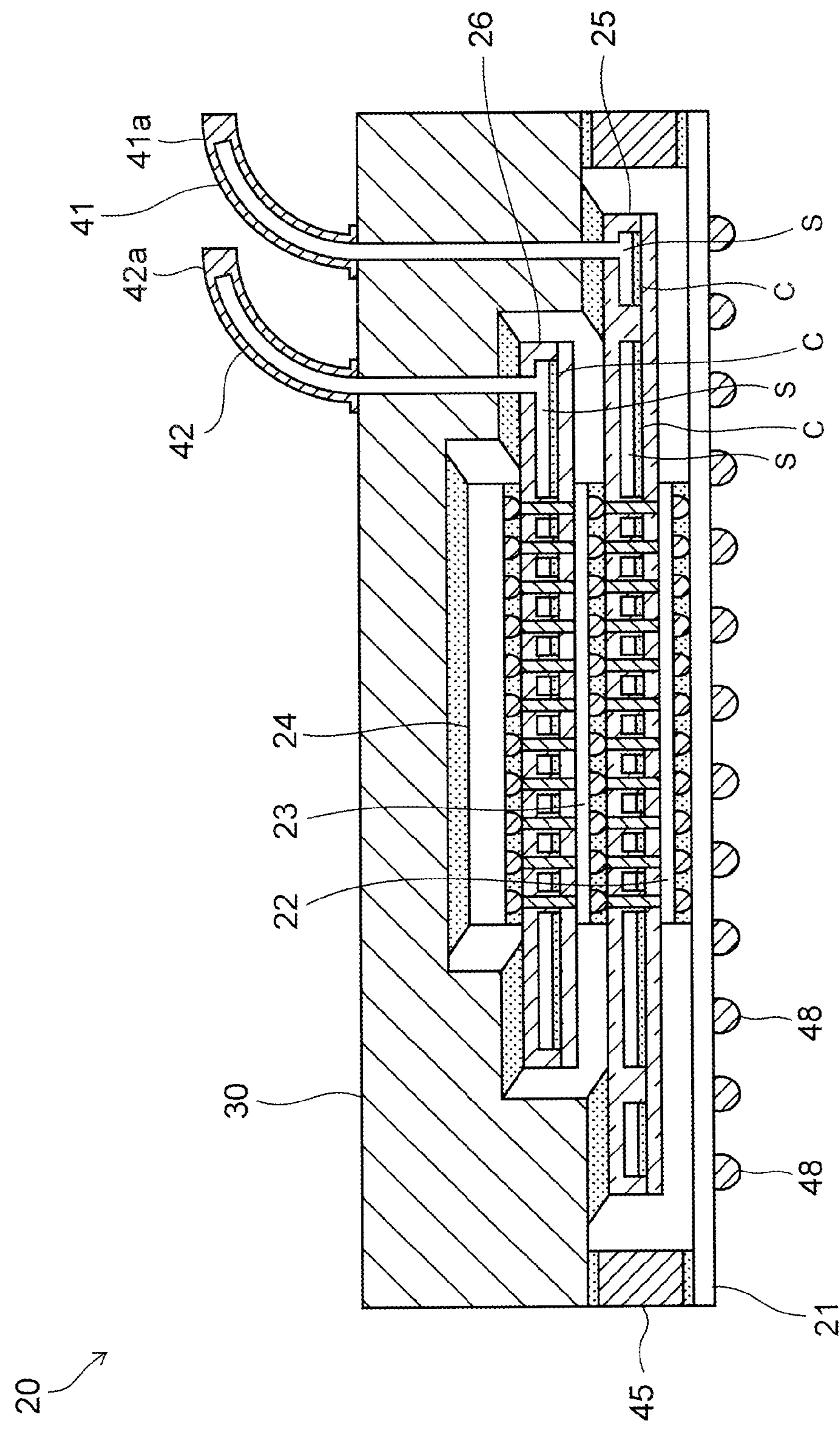

Next, as illustrated in FIG. 8D, the first pipe 41 and the second pipe 42 are closed by welding the terminal ends 41*a* and 42*a* respectively of the first pipe 41 and the second pipe 42. This maintains the reduced-pressure state inside the cavities S of the substrates 25 and 26 and also encapsulates the coolant C in the cavities S.

Thereafter, the plurality of solder bumps are bonded to the circuit board 21 as the external connection terminals 48.

The semiconductor device 20 according to the embodiment is thus completed.

According to the aforementioned method of manufacturing the semiconductor device, providing the holes 30*x* and 30*y* in the heat spreading member 30 as illustrated in FIG. 8C facilitates supplying of the coolant C into the cavities S of the substrates 25 and 26 and reduction of the pressure in the cavities S via the holes 30*x* and 30*y*. As a result, the first substrate 25 and the second substrate 26 which cool the three-dimensionally packaged first to third semiconductor elements 22 to 24 by using the latent heat of the coolant C may be easily achieved.

(Second Embodiment) In a second embodiment, heat generated in the semiconductor elements is rapidly released upward in the following way.

Figure 9:
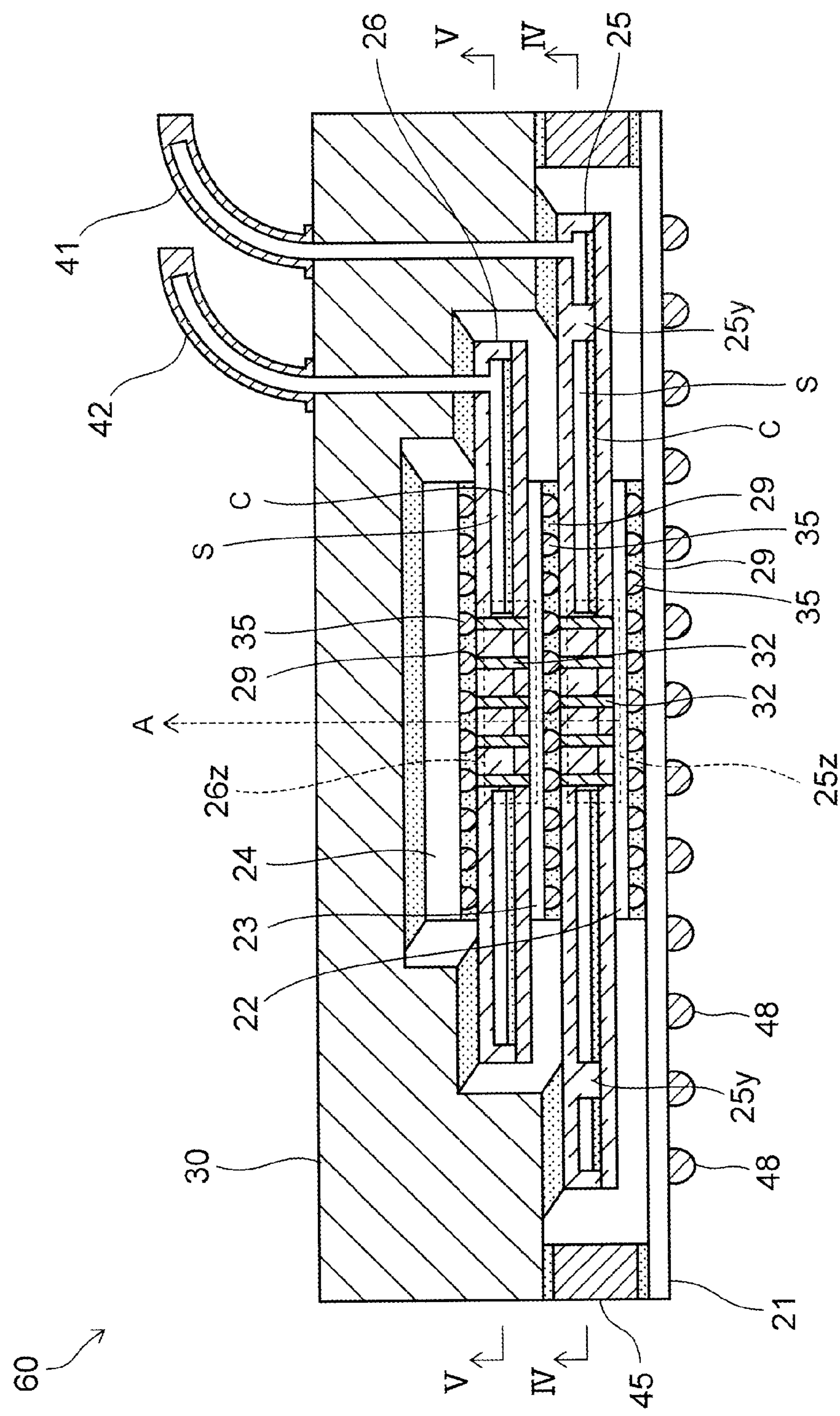
FIG. 9 is a cross-sectional view of a semiconductor device according to a second embodiment.

FIG. 9 is a cross-sectional view of a semiconductor device 60 according to the embodiment. Note that, in FIG. 9, the same elements as those described in the first embodiment are denoted by the same reference numerals as those in the first embodiment and description thereof are omitted hereafter.

As illustrated in FIG. 9, in the embodiment, a filling body 25*z* filling a portion of the cavity S is formed in a center portion of the first substrate 25. The filling body 25*z* is a portion of the first silicon substrate 51 (see FIG. 7A), and the plurality of second conductive plugs 32 pass through the filling body 25*z*.

In the embodiment, providing the filling body 25*z* above the first semiconductor element 22 causes the heat generated in the first semiconductor element 22 to be rapidly released upward via the filling body 25*z* as depicted by the arrow A.

Moreover, a filling body 26*z* filling a portion of the cavity S of the second substrate 26 is provided in the second substrate 26, and the heat generated in the second semiconductor element 23 is released upward via the filling body 26*z*.

Figure 10:
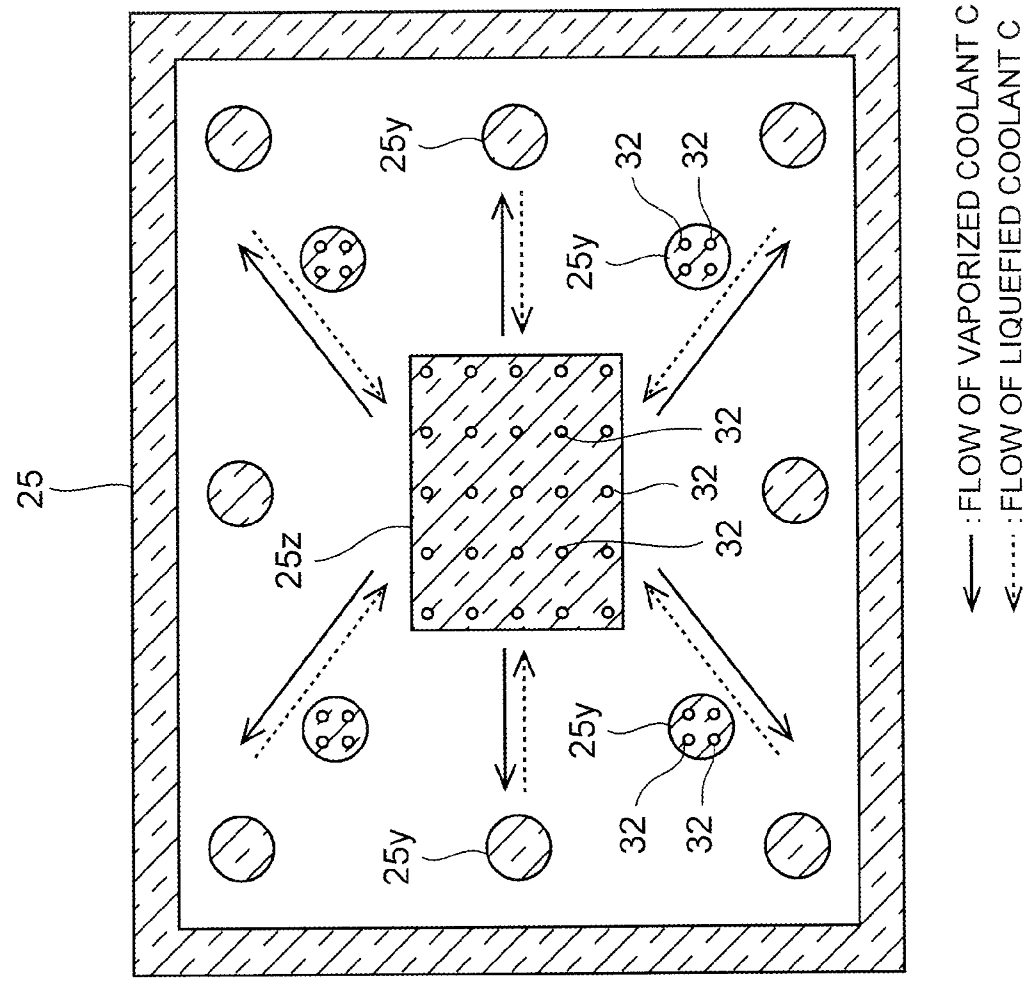
FIG. 10 is a plan view of the first substrate according to the second embodiment in which the first substrate is cut along the line IV-IV in FIG. 9.

FIG. 10 is a plan view of the first substrate according to the embodiment in which the first substrate 25 is cut along the line IV-IV in FIG. 9.

As illustrated in FIG. 10, the aforementioned filling body 25*z* has a rectangular shape in the plan view. The coolant C is vaporized near the filling body 25*z* by the heat of the first semiconductor element 22 (see FIG. 9), cooled and liquefied in the peripheral edge of the first substrate 25, and returns to a portion near the filling body 25*z*.

Figure 11:
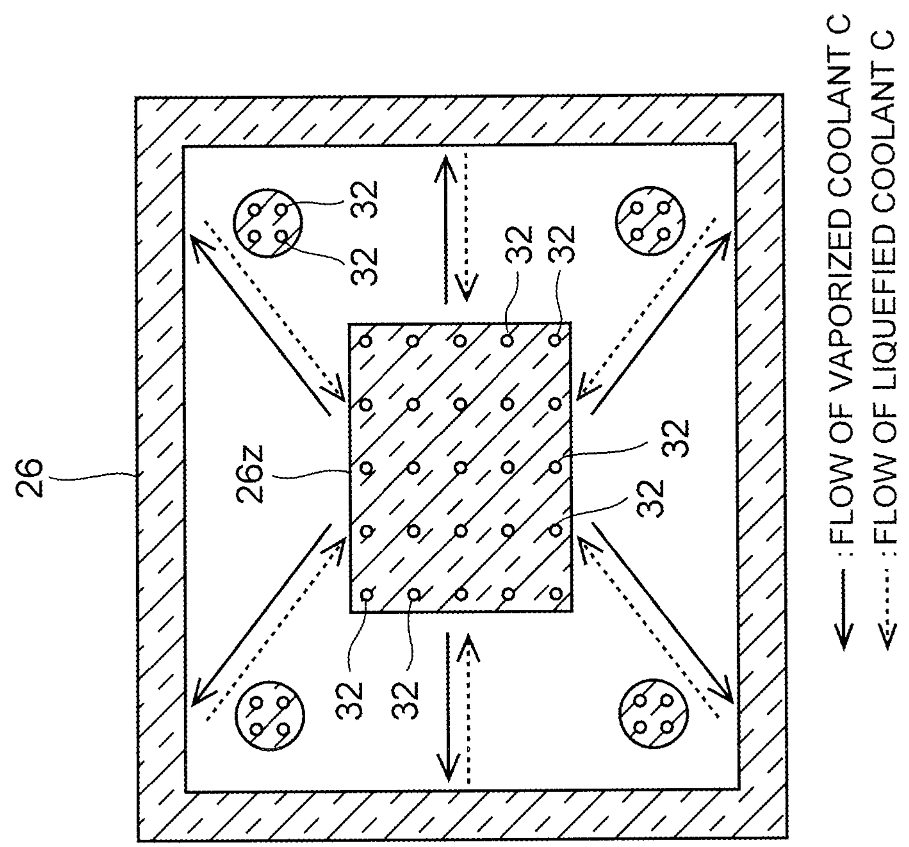
FIG. 11 is a plan view of the second substrate according to the second embodiment in which the second substrate is cut along the line V-V in FIG. 9.

FIG. 11 is a plan view of the second substrate 26 according to the embodiment in which the second substrate 26 is cut along the line V-V in FIG. 9.

As illustrated in FIG. 11, the filling body 26*z* of the second substrate 26 also has a rectangular shape in the plan view, and the coolant C circulates between a portion near the filling body 26*z* and the peripheral edge of the second substrate 26.

As described above, in the embodiment, providing the filling bodies 25*z* and 26*z* in the first substrate 25 and the second substrate 26 allows the heat generated in the semiconductor elements 22 and 23 to be rapidly released to the outside via the filling bodies 25*z* and 26*z*.

(Third Embodiment) In a third embodiment, the flow rate of the coolant sealed in each of the substrates is increased in the following way.

Figure 12:
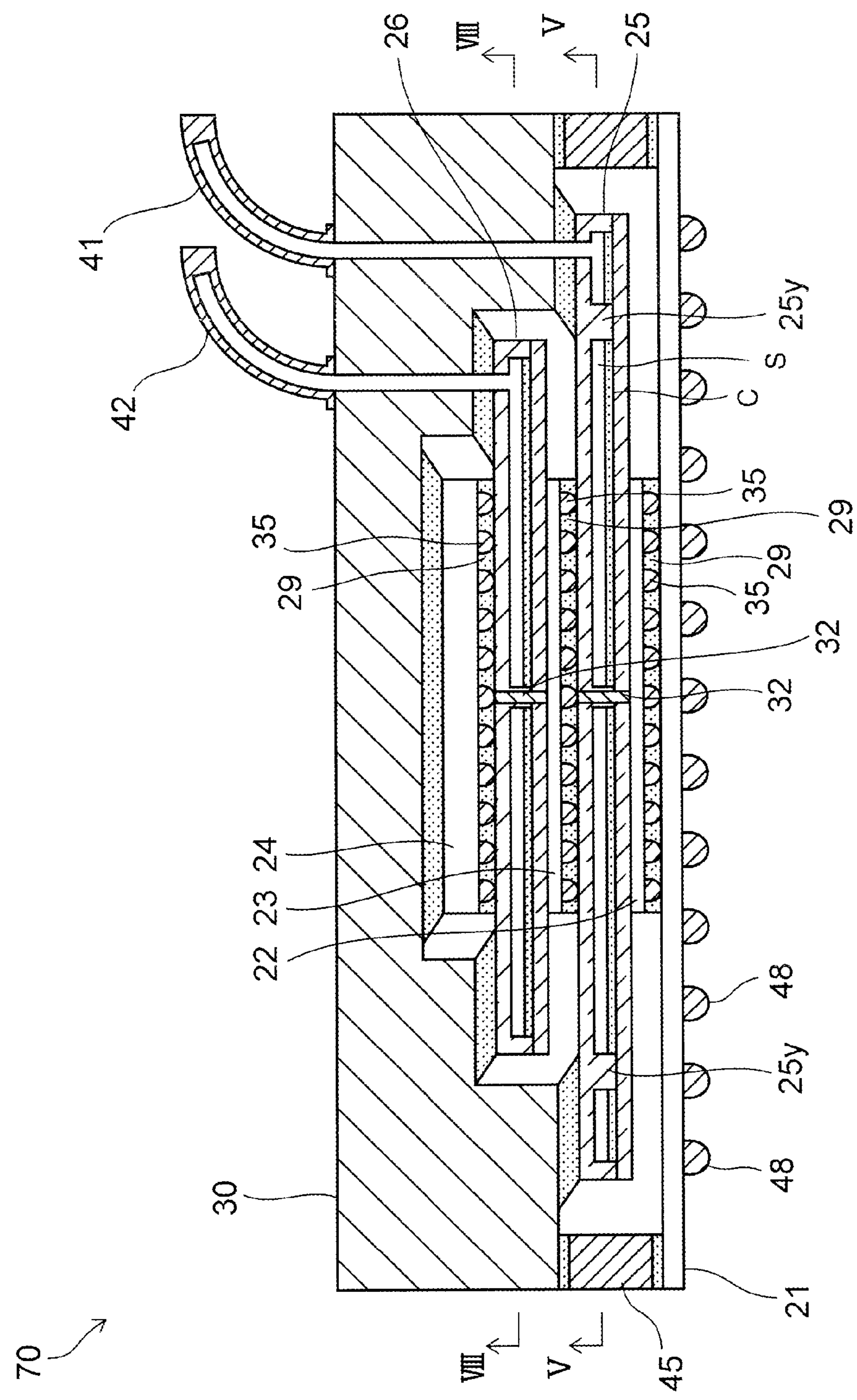
FIG. 12 is a cross-sectional view of a semiconductor device according to a third embodiment.

FIG. 12 is a cross-sectional view of a semiconductor device 70 according to the embodiment. Note that, in FIG. 12, the same elements as those described in the first embodiment are denoted by the same reference numerals as those in the first embodiment and description thereof are omitted hereafter.

Figure 13:
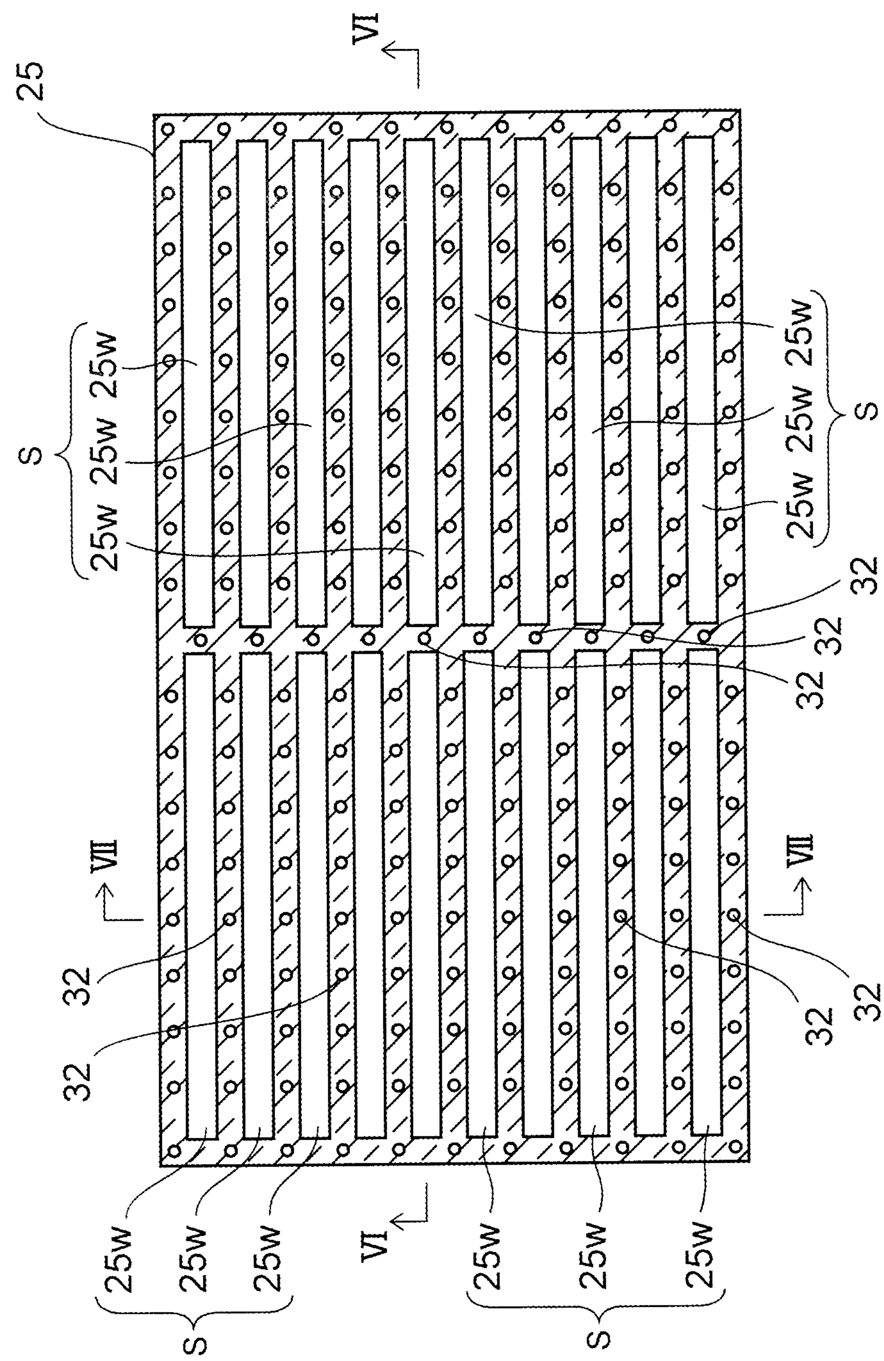
FIG. 13 is a plan view of the first substrate according to the third embodiment in which the first substrate is cut along the line V-V in FIG. 12.

Moreover, FIG. 13 is a plan view of the first substrate 25 according to the embodiment in which the first substrate 25 is cut along the line V-V in FIG. 12, and FIG. 12 corresponds to a cross-sectional view taken along the line VI-VI in FIG. 13.

Figure 14:
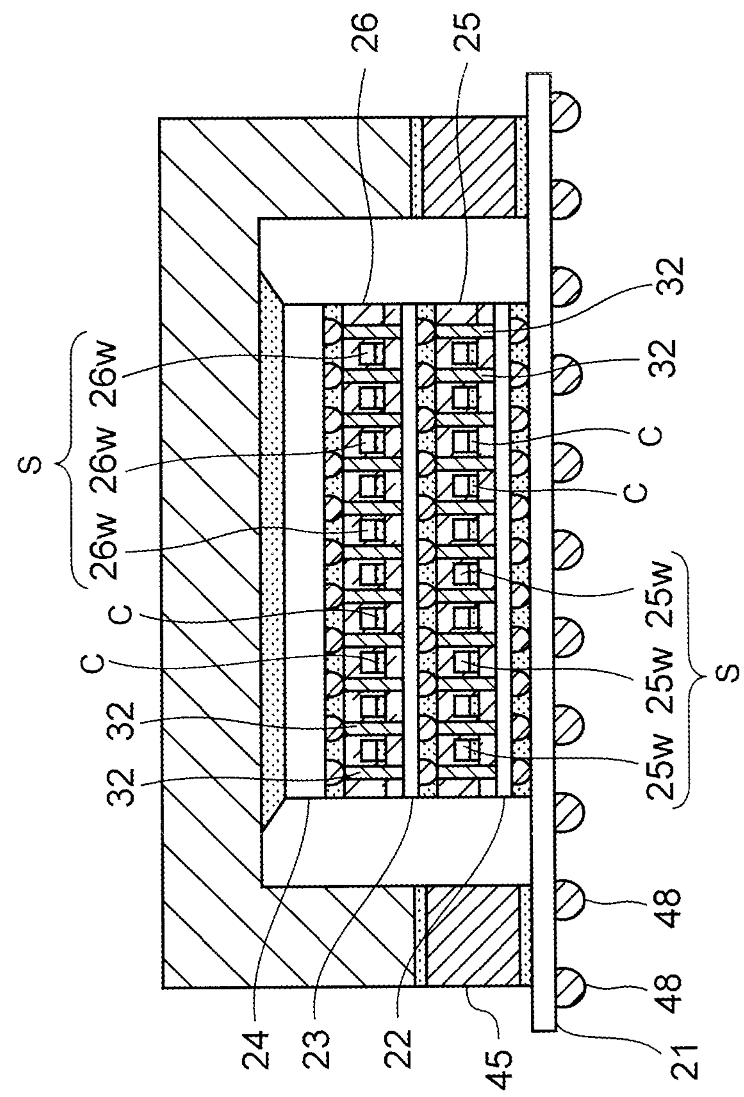
FIG. 14 is a cross-sectional view of the semiconductor device according to the third embodiment which is taken along the line VII-VII in FIG. 13.

FIG. 14 is a cross-sectional view of the semiconductor device 70 which is taken along the line VII-VII in FIG. 13.

As illustrated FIGS. 13 and 14, in the embodiment, the cavity S in the first substrate 25 is divided into a plurality of channels 25*w* extending from the center to the peripheral edge of the first substrate 25.

Movement of the coolant C sealed inside the cavity S is thereby limited to the inside of the channels 25*w* with small width. Accordingly, the flow rate of the coolant C increases as compared to the case where there are no channels 25*w*. As a result, it is possible to rapidly transfer the heat generated in the first semiconductor element 22 to the peripheral edge of the first substrate 25 by the coolant C and improve the cooling efficiency of the first semiconductor element 22.

Figure 15:
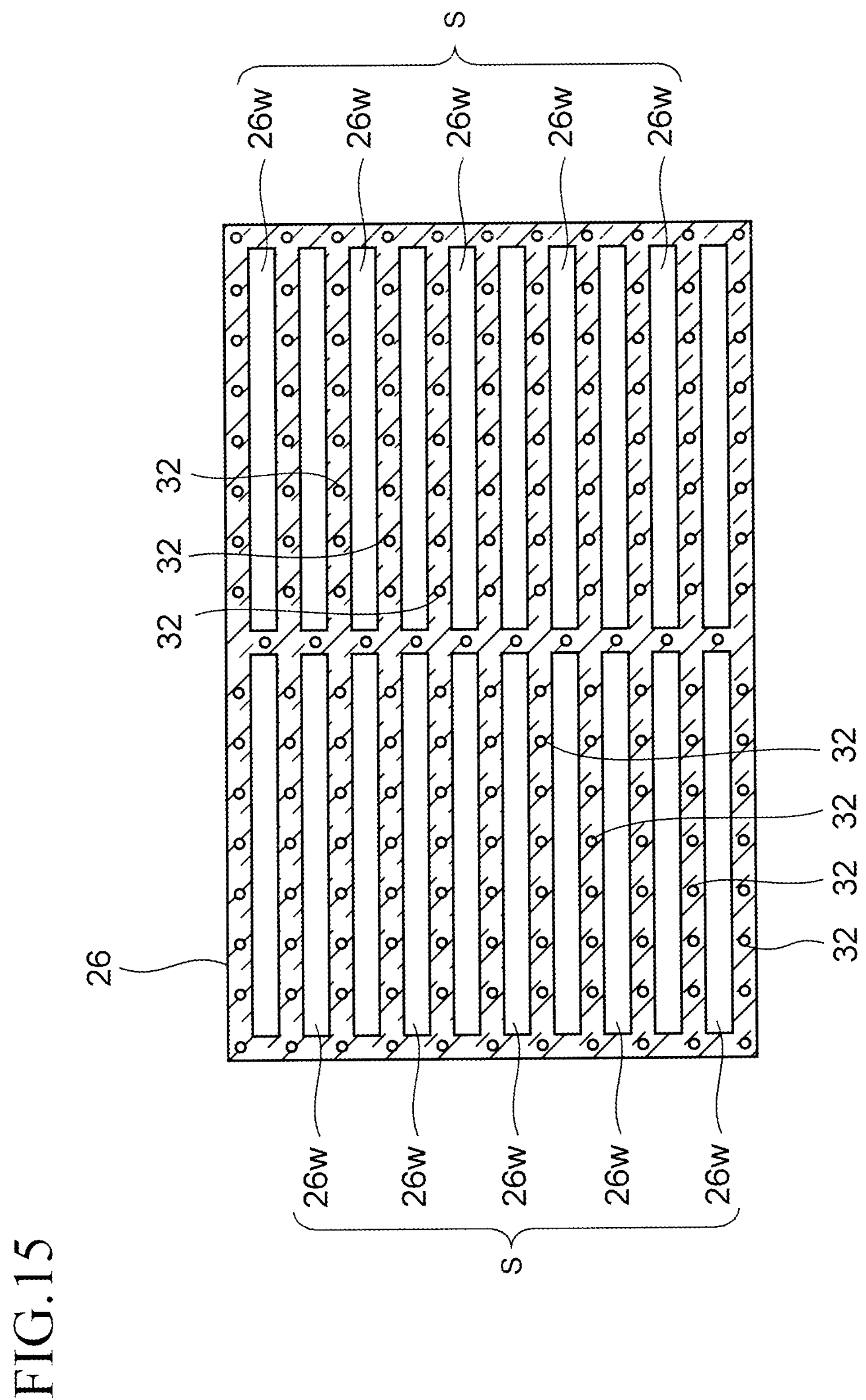
FIG. 15 is a plan view of the second substrate according to the third embodiment in which the second substrate is cut along the line VIII-VIII in FIG. 12.

Moreover, FIG. 15 is a plan view of the second substrate 26 according to the embodiment in which the second substrate 26 is cut along the line VIII-VIII in FIG. 12.

As illustrated in FIG. 15, the cavity S of the second substrate 26 is also divided into a plurality of channels 26*w*. The flow rate of the coolant C is thereby increased as in the first substrate 25. Accordingly, the amount of heat transferred by the coolant C increases and the second semiconductor element 23 may be rapidly cooled by the coolant C.

As described above, according to the embodiment, it is possible to increase the flow rate of the coolant C by dividing the cavities S of the first substrate 25 and the second substrate 26 into the plurality of channels 25*w* and 26*w*, and the cooling efficiency of the semiconductor elements 22 and 23 may be thereby improved.

(Fourth Embodiment) In a fourth embodiment, description is given of an electronic device including the semiconductor device described in the first embodiment.

Figure 16:
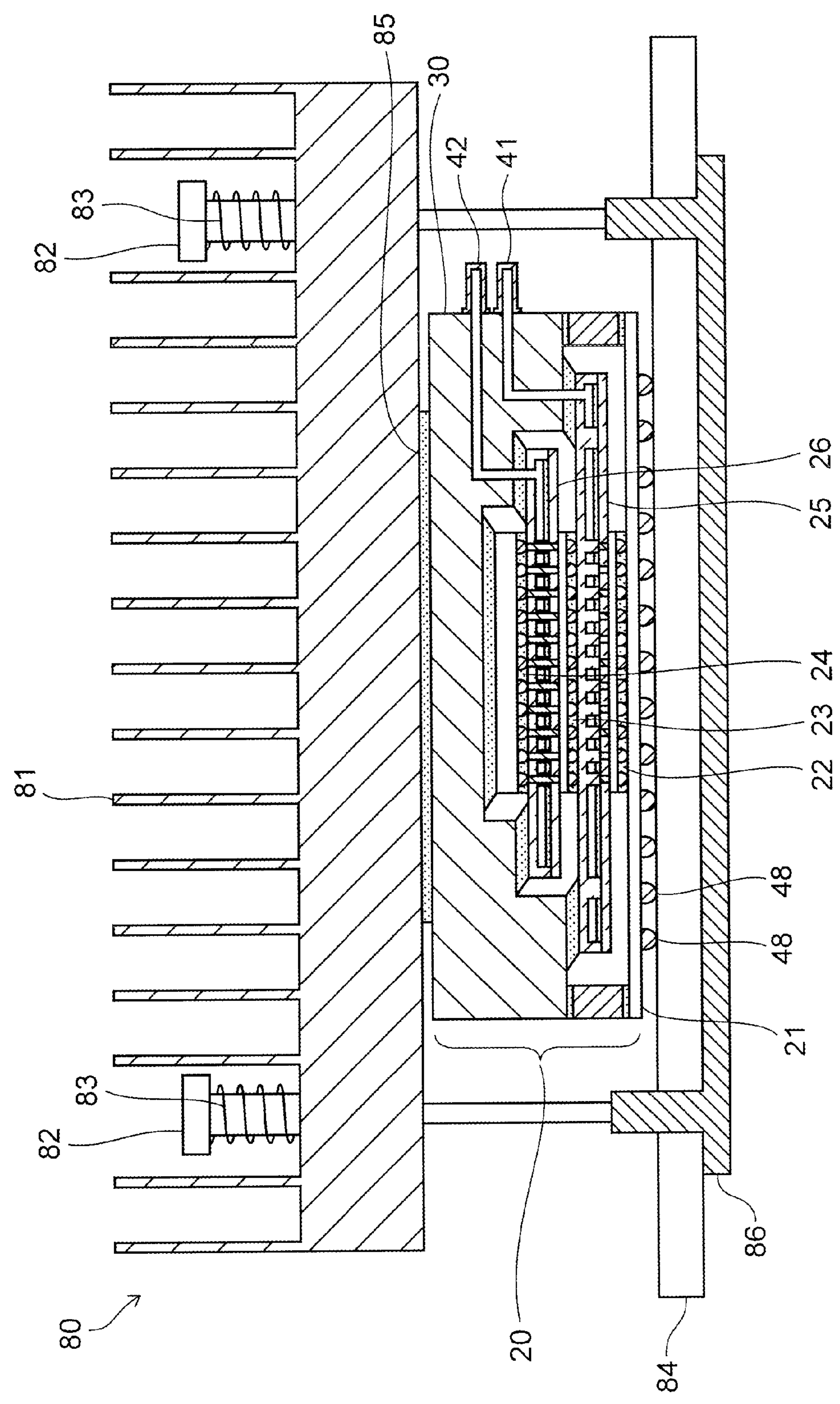
FIG. 16 is a cross-sectional view of an electronic device according to a fourth embodiment.

FIG. 16 is a cross-sectional view of the electronic device according to the embodiment.

The electronic device 80 is, for example, a server, a personal computer, or the like, and includes the semiconductor device 20 described in the first embodiment, a heat sink 81, and a circuit board 84.

Among them, the circuit board 84 is, for example, a motherboard, and the semiconductor device 20 is mounted on the circuit board 84 via the external connection terminals 48.

A bonding member 85 is provided on the heat spreading member 30 of the semiconductor device 20. The bonding member 85 is formed by containing carbon or ceramic filler having an excellent heat transfer property with a resin, and thermally connects the heat spreading member 30 and the heat sink 81 to each other.

The heat sink 81 is made of a material having an excellent heat transfer property such as copper, and has a function of rapidly releasing heat generated in the semiconductor device 20 to the outside by an air-cooling method.

Note that, in the embodiment, the first and second pipes 41 and 42 are provided on a side surface of the heat spreading member 30 so as not to interfere with the heat sink 81. Moreover, a loop heat pipe, a water-cooling cooling plate, or the like may be used instead of the air-cooling heat sink 81.

Screws 82 around which springs 83 are wound are made to pass through the heat sink 81. The screws 82 are fastened to a metal plate 86 disposed on a back surface of the circuit board 84. Then, the heat spreading member 30 is pressed against the semiconductor device 20 by biasing force of the springs 83. In addition, the semiconductor device 20 is also pressed against the circuit board 84, and the semiconductor device 20 and the circuit board 84 are electrically connected to each other.

According to the embodiment described above, the cooling efficiency of the semiconductor device 20 is increased by the first substrate 25 and the second substrate 26 as described in the first embodiment. Hence, it is possible to provide the highly-reliable electronic device 80 in which thermal runaway of the semiconductor device 20 is suppressed.

Note that the configuration of the embodiment is not limited to that described above. Although the semiconductor device 20 in the first embodiment is mounted on the electronic device 80 in the above description, the semiconductor device 60 in the second embodiment or the semiconductor device 70 in the third embodiment may be mounted instead.

(Fifth Embodiment) In the step of FIG. 8C in the first embodiment, the coolant C is supplied into the cavity S of the first substrate 25.

In a fifth embodiment, the case where the coolant C blocks the cavity S is suppressed in the following way.

Figure 17A:
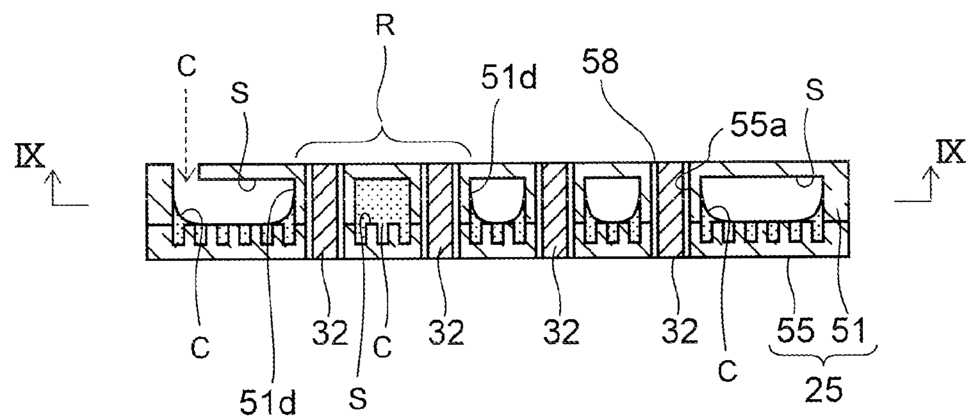
FIG. 17A is a cross-sectional view of the first substrate in which coolant is blocking a cavity during supplying of the coolant into the cavity.

FIG. 17A is a cross-sectional view of the first substrate 25 in which the coolant C is blocking the cavity S during the supplying of the coolant C into the cavity S. Moreover, FIG. 17B is a plan view of the first substrate 25 in which the first substrate 25 is cut along the line IX-IX in FIG. 17A.

Figure 17B:
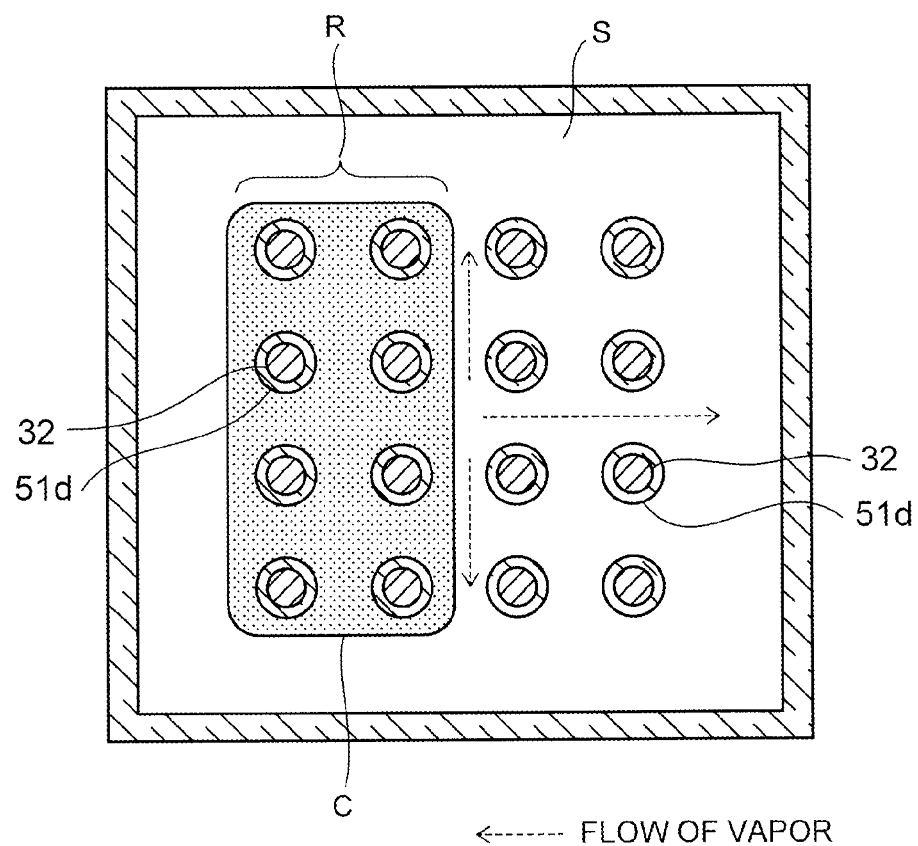
FIG. 17B is a plan view of the first substrate in which the first substrate is cut along the line IX-IX in FIG. 17A.

Note that, in FIGS. 17A and 17B, the same elements as those described in the first to fourth embodiments are denoted by the same reference numerals as those in the first to fourth embodiments, and description thereof is omitted hereafter.

As described in the first embodiment, the first substrate 25 is fabricated by bonding the first silicon substrate 51 and the second silicon substrate to each other. Moreover, the cavity S and the protrusions 51*d* are provided inside the first substrate 25 and the first conductive plugs 32 are provided as TSVs penetrating the protrusions 51*d*.

When the coolant C is supplied from the first opening 25*x* into the cavity S, a liquid surface of the coolant C curves into a meniscus shape due to capillary force, and one region R of the cavity S is sometimes blocked by the coolant C. Such phenomenon is likely to occur particularly when the space inside the cavity S is small due to existence of the plurality of protrusions 51*d*.

When the one region R is blocked by the coolant C as described above, the flow of vapor of the coolant C is hindered in the one region R as illustrated in FIG. 17B, and sufficient transfer of heat by the coolant C becomes difficult.

As a method of supplying the coolant C, there is also a method in which the cavity S is filled with the coolant C and thereafter excessive coolant C is vaporized and dispersed from the inside of the cavity S by heating the first substrate 25 in a not-illustrated vacuum chamber to leave a predetermined amount of the coolant C in the cavity S. However, in this method, it is difficult to leave the predetermined amount of coolant C in the cavity S by vaporization and dispersion caused by heating.

In view of this, blocking of the cavity S by the coolant C is suppressed in the following way in the embodiment.

Figure 18:
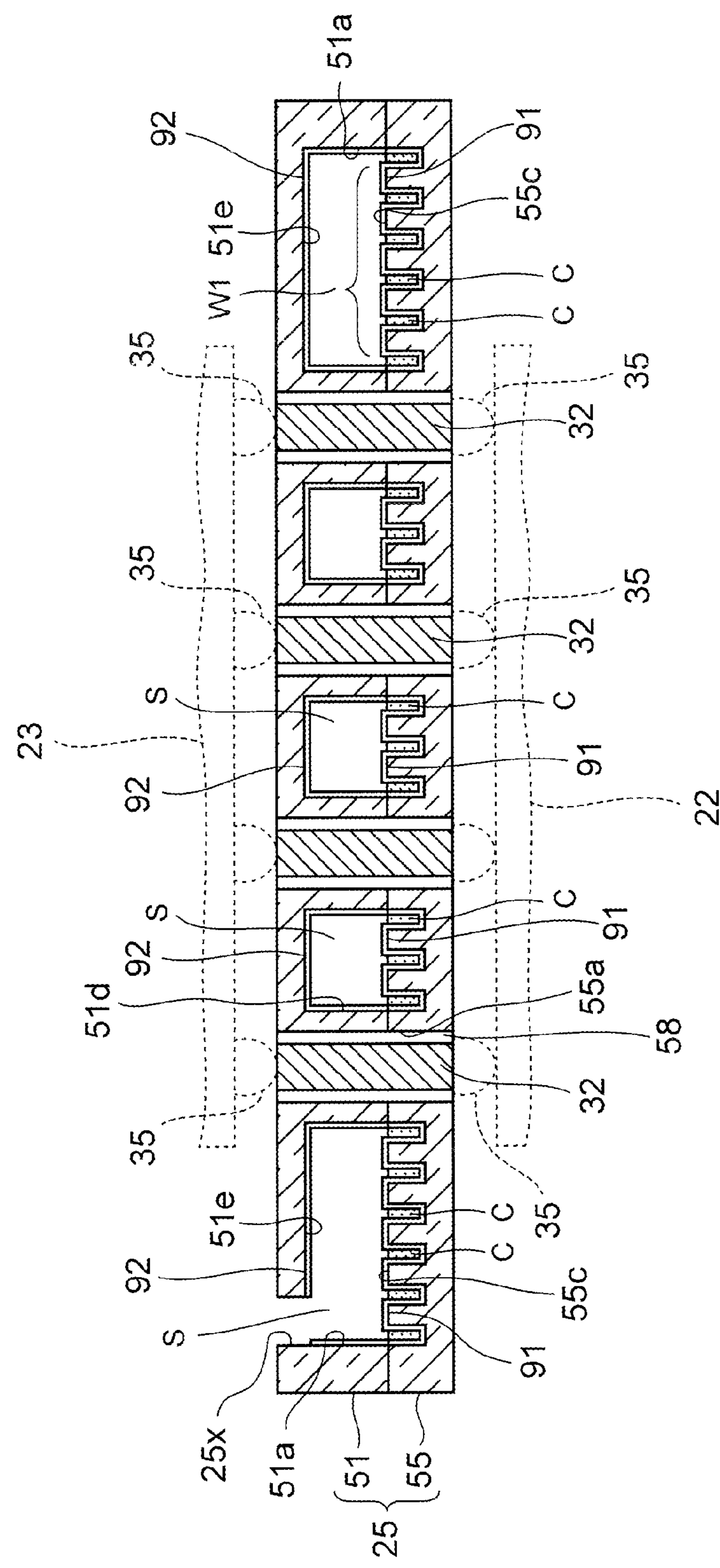
FIG. 18 is a cross-sectional view of the first substrate according to a fifth embodiment.

FIG. 18 is a cross-sectional view of the first substrate 25 according to the embodiment. Note that, in FIG. 18, the same elements as those in the first to fourth embodiments are denoted by the same reference numerals as those in the first to fourth embodiments and description thereof is omitted hereafter.

The cavity S of the first substrate 25 is partially defined by the recess portion 51*a* of the first silicon substrate 51 and stores the coolant C such as water.

Moreover, a surface of the cavity S includes a lower surface 55*c* close to the first semiconductor element 22 and a ceiling surface 51*e* close to the second semiconductor element 23. The lower surface 55c is provided with the first wicks W1 described in FIG. 7C in the first embodiment.

Furthermore, a hydrophilic layer 91 is formed on the lower surface 55*c* by hydrophilizing processing, and a hydrophobic layer 92 is formed on the ceiling surface 51*e* by hydrophobizing processing. The hydrophilic layer 91 may be formed by, for example, exposing the lower surface 55*c* to sulfuric acid-hydrogen peroxide mixture. Moreover, the hydrophobic layer 92 may be formed by, for example, exposing the ceiling surface 51*e* to hydrofluoric acid.

Due to this, when the coolant C is supplied into the cavity S, the coolant C spreads in an excellent manner on the lower surface 55*c* which is improved in hydrophilicity by the hydrophilic layer 91. Meanwhile, in the ceiling surface 51*e* whose hydrophilicity is reduced by the hydrophobic layer 92, the coolant C is repelled. As a result, the cavity S is less likely to be blocked by the coolant C, and a space through which the vapor of the coolant C flows is secured in the cavity S. Transferring of heat of the first semiconductor element 22 and the second semiconductor element 23 by the vapor is thereby facilitated.

Note that the configuration of the embodiment is not limited to the aforementioned configuration as long as the hydrophilicity of the lower surface 55*c* is higher than the hydrophilicity of the ceiling surface 51*e*. For example, instead of forming both of the hydrophilic layer 91 and the hydrophobic layer 92 as described above, one of these layers may be formed.

Next, examination performed by the inventors of the present application to check the effects of the embodiment is described.

Figure 19A:
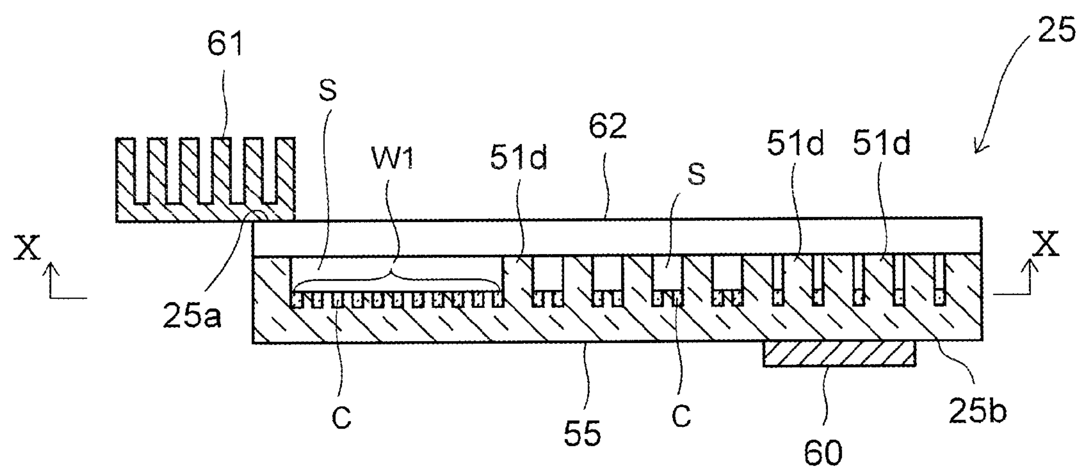
FIG. 19A is a cross-sectional view of the first substrate used in the examination of the fifth embodiment.

FIG. 19A is a cross-sectional view of the first substrate 25 used in the examination. Moreover, FIG. 19B is a plan view of the first substrate 25 in which the first substrate 25 is cut along the line X-X in FIG. 19A.

As illustrated in FIG. 19A, a heater 60 simulating the first semiconductor element 22 is fixedly attached to a back surface 25*b* of the first substrate 25. Moreover, a heat sink 61 for cooling the coolant C is fixedly attached to an end portion of the upper surface 25*a* of the first substrate 25.

A transparent glass substrate 62 is used instead of the first silicon substrate 51 so that behavior of the coolant C in the first substrate 25 may be visually observed. In this examination, water is used as the coolant C.

Figure 19B:
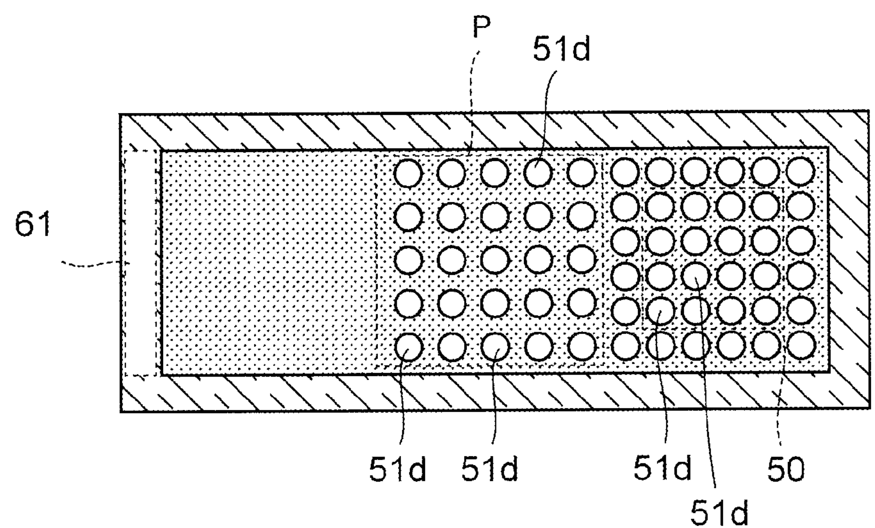
FIG. 19B is a plan view of the first substrate in which the first substrate is cut along the line X-X in FIG. 19A.

As illustrated in FIG. 19B, the plurality of protrusions 51*d* are provided in a center region P of the first substrate 25. The center region P is a 7 mm square region. The protrusions 51*d* each have a diameter of 150 μm and the plurality of protrusions 51*d* are provided in the center region P at intervals of 500 μm.

Two first substrates 25 configured as described above are prepared, and surfaces of the first wicks W1 in one of the first substrates 25 are hydrophilized while the surfaces of the first wicks W1 in the other first substrate are not.

Figures 20A, 20B:
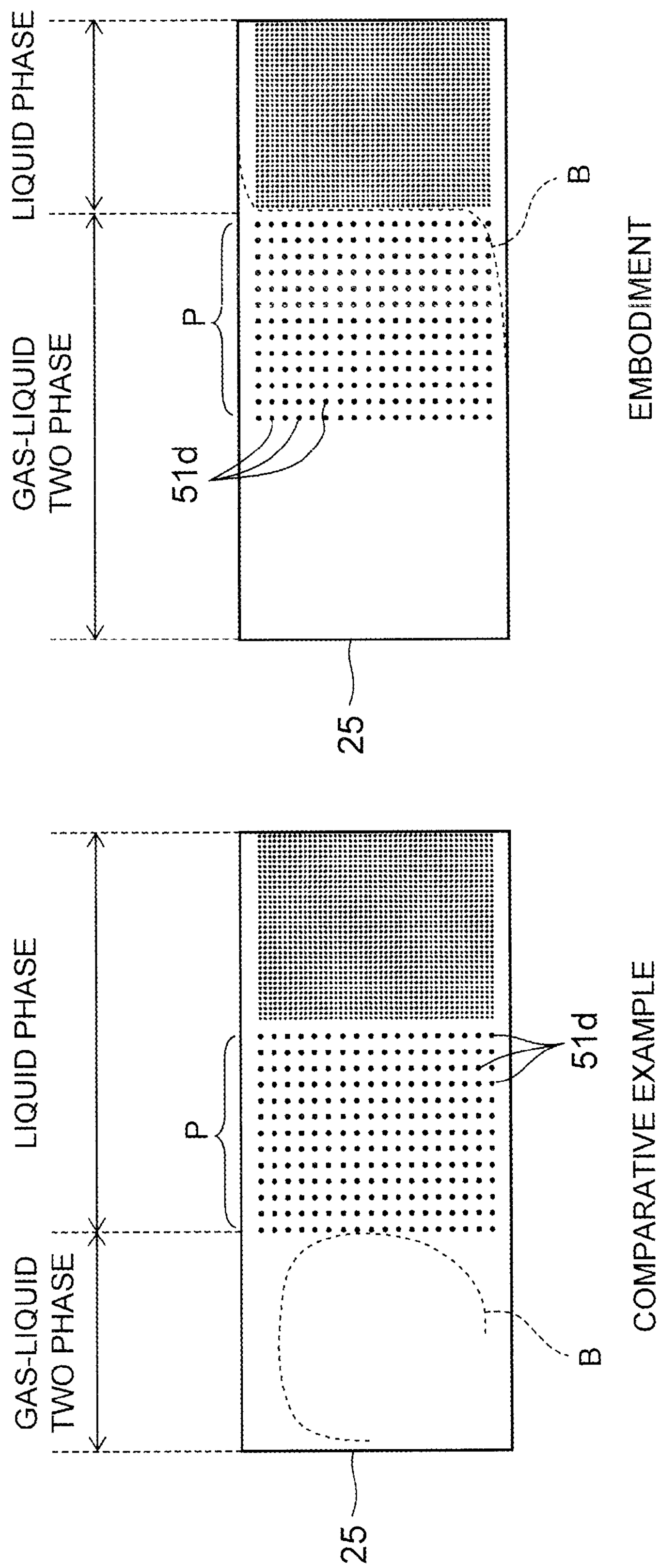
FIG. 20A is a plan view drawn based on an image of an inside of the first substrate according to a comparative example which is observed from above through a glass substrate.
FIG. 20B is a plan view drawn based on an image of an inside of the first substrate according to the fifth embodiment which is observed from above through a glass substrate.

FIGS. 20A and 20B are each a plan view drawn based on an image of an inside of the first substrate 25 observed from above through the transparent glass substrate 62. Among them, FIG. 20A_is an image according to a comparative example in which the first wicks W1 are not hydrophilized. Meanwhile, FIG. 20B is an image according to the embodiment in which the first wicks W1 are hydrophilized by sulfuric acid-hydrogen peroxide mixture.

As illustrated in FIG. 20A, in the comparative example in which no hydrophilization is performed, substantially the entire center region P is blocked by the water in liquid phase. Moreover, a gas-liquid interface B is at a position near an end portion of the first substrate 25, and the gas-liquid two phase state is achieved near this end portion.

Meanwhile, as illustrated in FIG. 20B, in the embodiment in which hydrophilization is performed, the region of the gas-liquid two phase state is larger than that in the comparative example.

From this, it is found that hydrophilizing the first wicks W1 as in the embodiment is effective in suppressing blocking by the water inside the first substrate 25.

Figure 21:
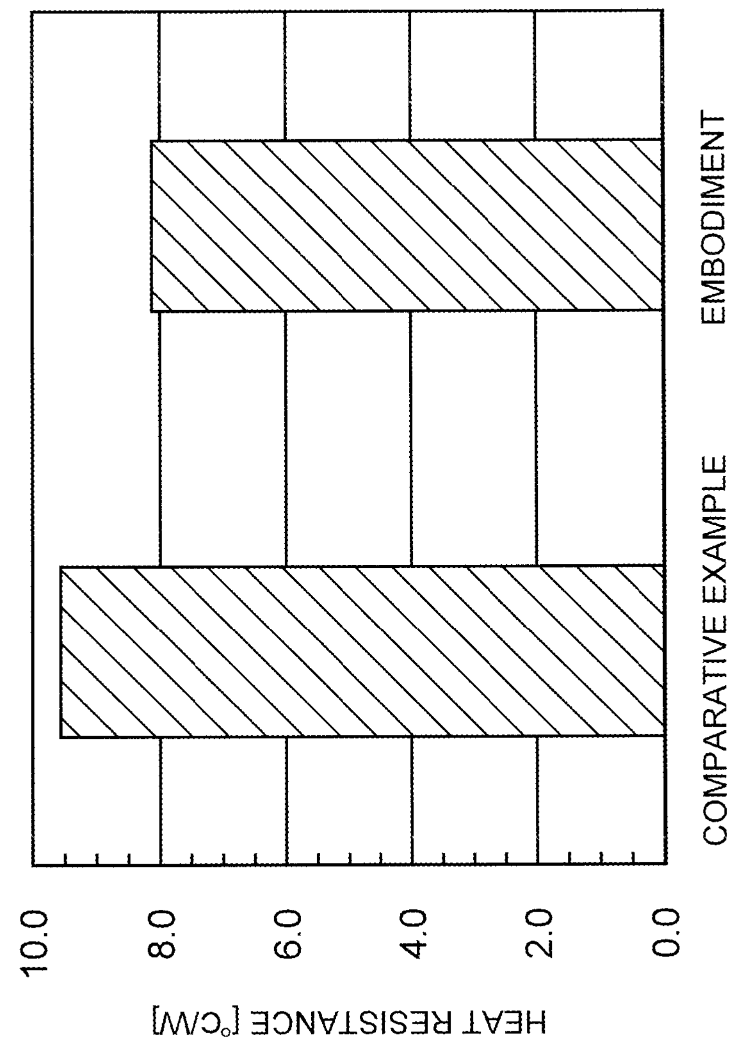
FIG. 21 is a graph obtained by calculating the heat resistances of the first substrates respectively in the comparative example and the fifth embodiment.

FIG. 21 is a graph obtained by calculating the heat resistances of the first substrates 25 respectively in the comparative example of FIG. 20A and the embodiment of FIG. 20B.

The heat resistance R is calculated by using the following formula (1).

[Math 1]

$$R=T_{center}-T_{bottom}/Q \quad (1)$$

In formula (1), $T_{center}$ is the temperature of a portion of the back surface 25*b* (see FIG. 19A) of the first substrate 25 where the heater 60 is fixedly attached, and $T_{bottom}$ is the temperature of a peripheral edge portion of the back surface 25*b* of the first substrate 25.

As depicted in FIG. 21, the thermal resistance in the embodiment in which the hydrophilization is performed is about 15% lower than that in the comparative example in which no hydrophilization is performed. A conceivable reason for this is because the blocking by the water inside the first substrate 25 is suppressed in the embodiment as described above and the efficiency of heat transfer is improved by the water in a gas phase.

Figure 22B:
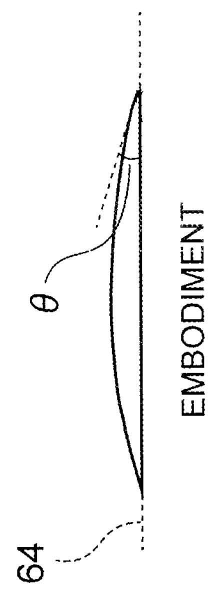
FIG. 22B is a view drawn based on an observation image obtained to examine a contact angle of water in the fifth embodiment.
Figure 22A:
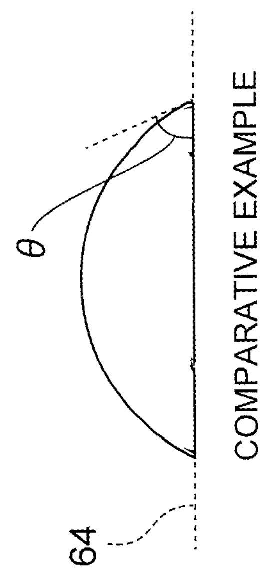
FIG. 22A is a view drawn based on an observation image obtained to examine a contact angle of water in the comparative example.

FIG. 22A is a view drawn based on an observation image obtained to examine a contact angle θ of water in the comparative example of FIG. 20A. Meanwhile, FIG. 22B is a view drawn based on an observation image obtained to examine a contact angle θ of water in the embodiment of FIG. 20B.

Note that, in the examination of FIGS. 22A and 22B, water droplets are dropped on surfaces of silicon substrates 64 varying in surface structure, and are observed in a substrate lateral direction.

In the comparative example (FIG. 22A), no processing is performed on the surface of the silicon substrate 64.

Meanwhile, in the embodiment (FIG. 22B), wicks are provided on the surface of the silicon substrate 64 and the surface is further hydrophilized by sulfuric acid-hydrogen peroxide mixture.

Figure 23:
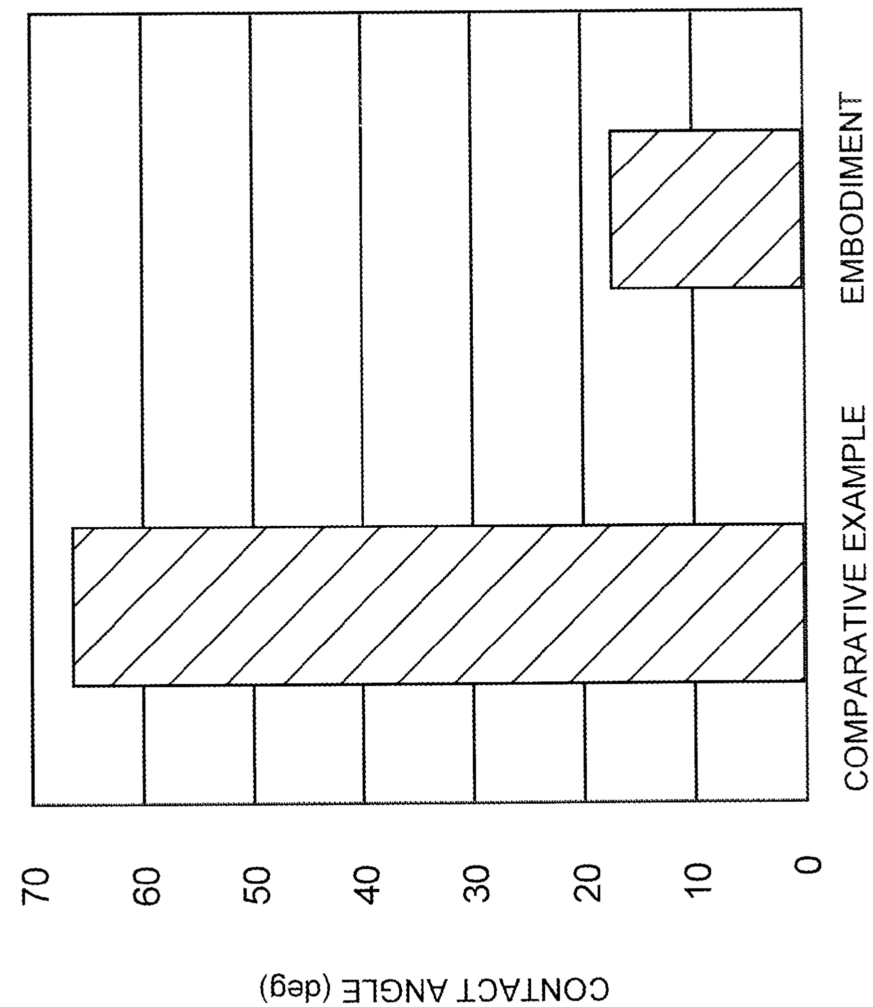
FIG. 23 is a graph of the contact angles of water respectively in the comparative example and the fifth embodiment.

Results of this examination are displayed in FIG. 23 in a form of graph.

As depicted in FIG. 23, the contact angle in the comparative example in which no hydrophilization is performed is about 66° while the contact angle in the embodiment in which the hydrophilization is performed is about 17°, and the difference between the two contact angles is about 49°.

Accordingly, the effect of reduction in heat resistance described in FIG. 21 may be expected when hydrophilization is performed such that the difference between the contact angle in the case where the hydrophilization is performed and the contact angle in the case where no hydrophilization is performed becomes 50° or more.

Next, a method of manufacturing the first substrate 25 according to the embodiment is described. Examples of the method of manufacturing the first substrate 25 include the following first to sixth examples.

(First Example) FIGS. 24A to 24I are cross-sectional views of the first substrate 25 in the course of manufacturing thereof according to the first example.

Figure 24A:
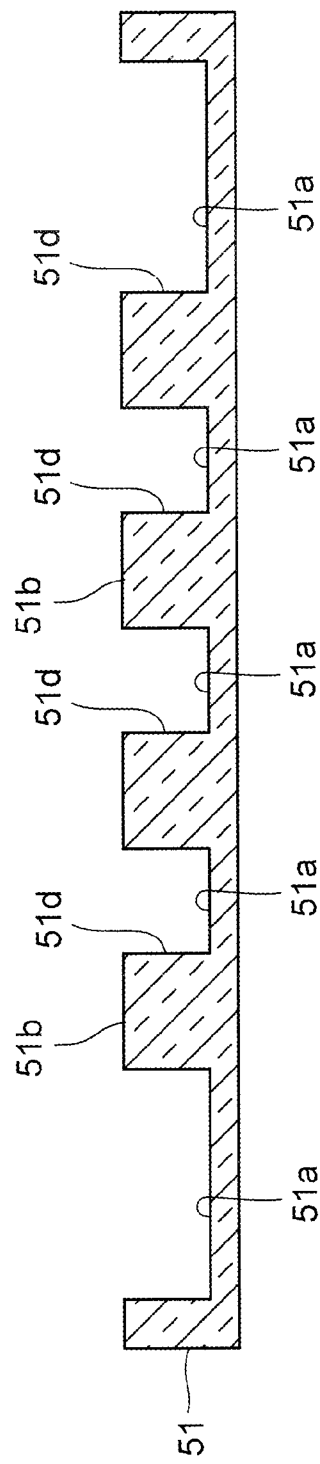
FIGS. 24A to 24I are cross-sectional views of the first substrate in the course of manufacturing thereof according to a first example of the fifth embodiment.

First, as illustrated in FIG. 24A, the step of FIG. 7A in the first embodiment is performed to form the recess portions 51*a* and the protrusions 51*d* in the upper surface 51*b* of the first silicon substrate 51.

Figure 24B:
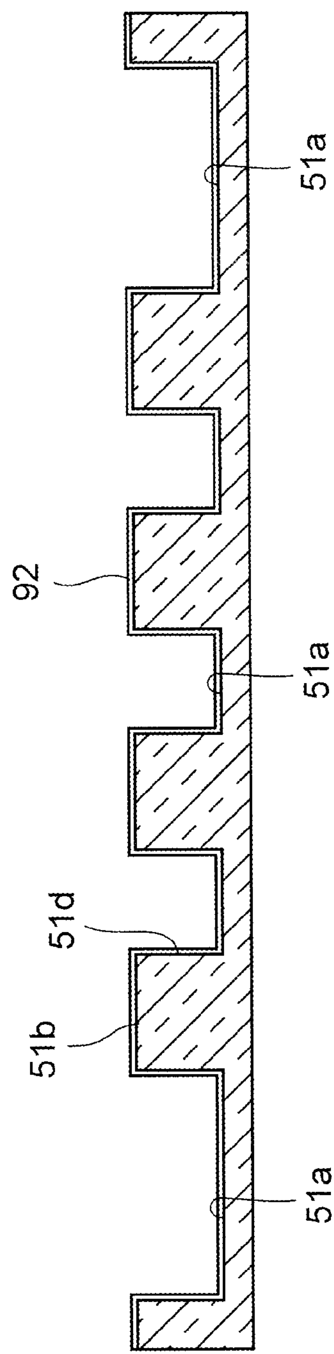

Then, as illustrated in FIG. 24B, the surfaces of the recess portions 51*a* are exposed to hydrofluoric acid, and the hydrophobic layer 92 is thereby formed on the surfaces. The hydrophobic layer 92 may be formed by applying a fluoride-based coating material onto the surfaces of the recess portions 51*a* and heating and curing the coating material. Examples of such a coating material include CYTOP produced by Asahi Kasei Corporation. This is the same for the other examples described below.

Furthermore, since the formation of the hydrophobic layer 92 is difficult if impurities such as etching residues exist in the recess portions 51*a*, the recess portions 51*a* are preferably cleaned in advance before the formation of the hydrophobic layer 92.

Figure 24C:
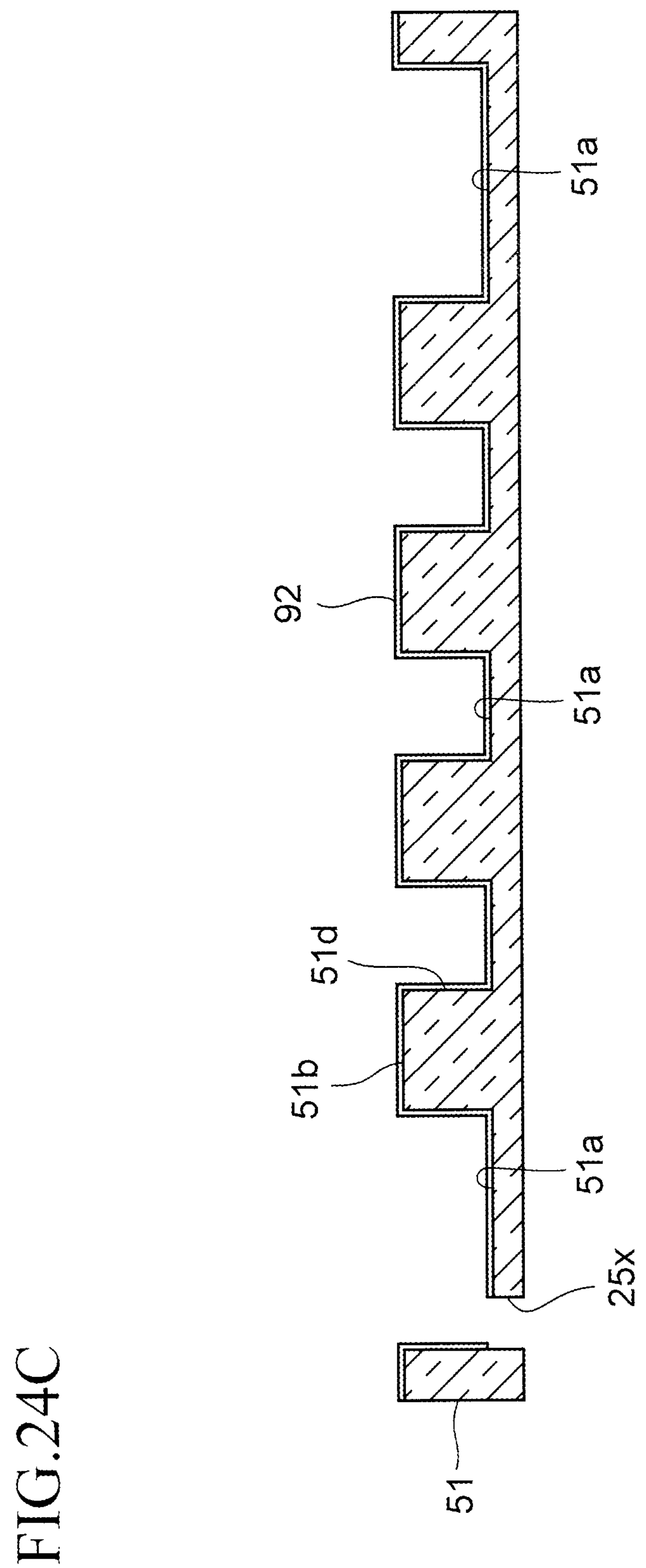

Next, as illustrated in FIG. 24C, the first opening 25*x* is formed in the first silicon substrate 51 as in the step of FIG. 7B in the first embodiment.

Figure 24D:
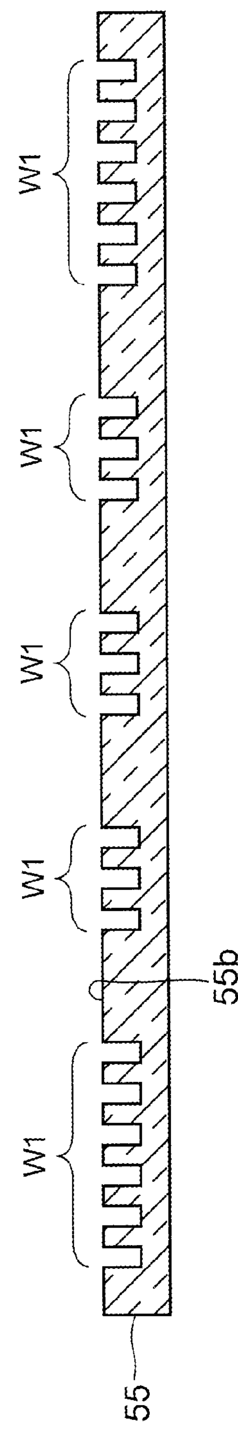

Subsequently, as illustrated in FIG. 24D, the step of FIG. 7C in the first embodiment is performed to form the first wicks W1 on the upper surface 55*b* of the second silicon substrate 55.

Figure 24E:
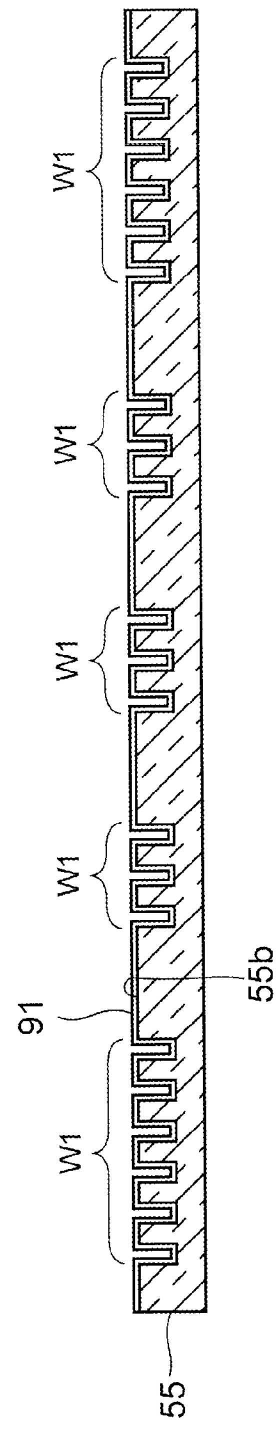

Then, as illustrated in FIG. 24E, the hydrophilic layer 91 is formed on the upper surface 55*b*. A method of forming the hydrophilic layer 91 is not limited to a particular method. For example, the hydrophilic layer 91 may be formed by exposing the upper surface 55*b* to sulfuric acid-hydrogen peroxide mixture.

Furthermore, as in the case of forming the hydrophobic layer 92, it is preferable to remove impurities such as etching residues from the upper surface 55*b* by cleaning to facilitate the formation of the hydrophilic layer 91.

Figure 24F:
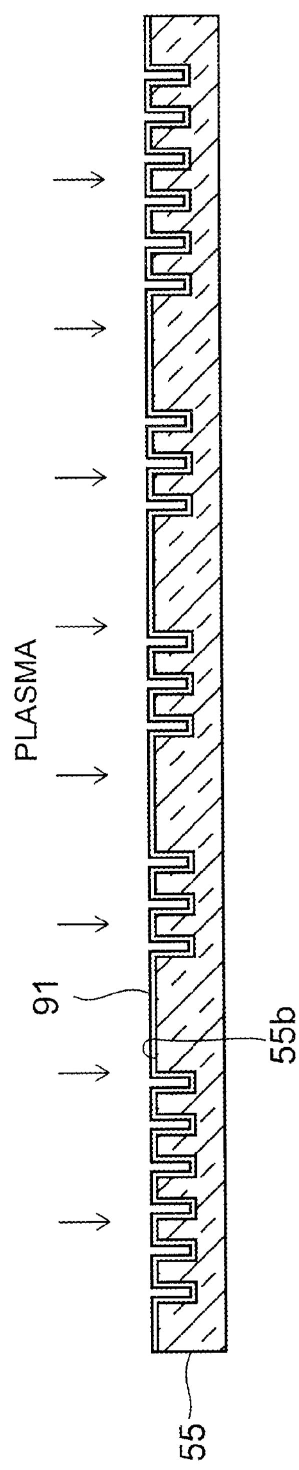

Next, as illustrated in FIG. 24F, the upper surface 55*b* of the second silicon substrate 55 is activated by being exposed to nitrogen plasma or oxygen plasma through the hydrophilic layer 91.

Figure 24G:
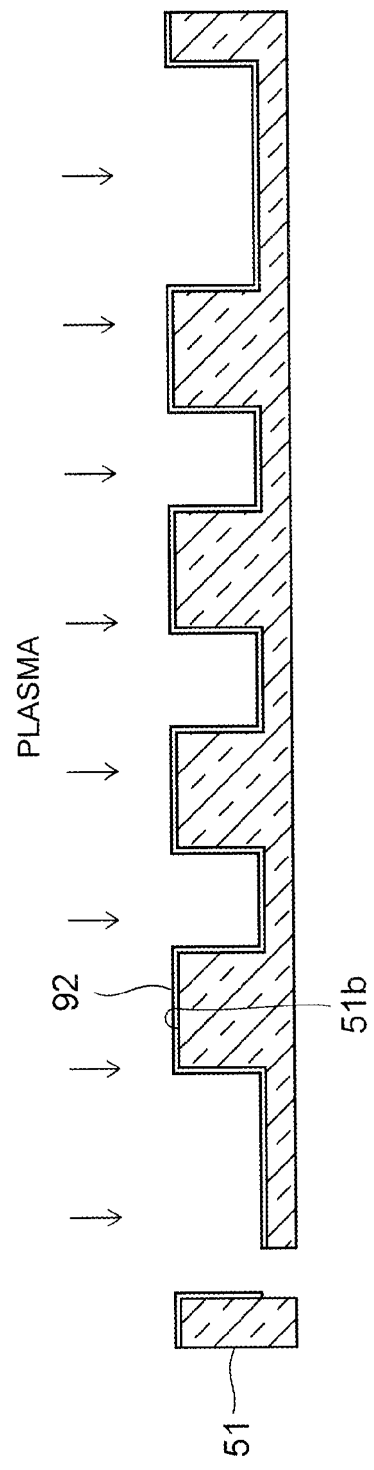

Then, as illustrated in FIG. 24G, the upper surface 51*b* of the first silicon substrate 51 is similarly activated by being exposed to nitrogen plasma or oxygen plasma through the hydrophobic layer 92.

Figure 24H:
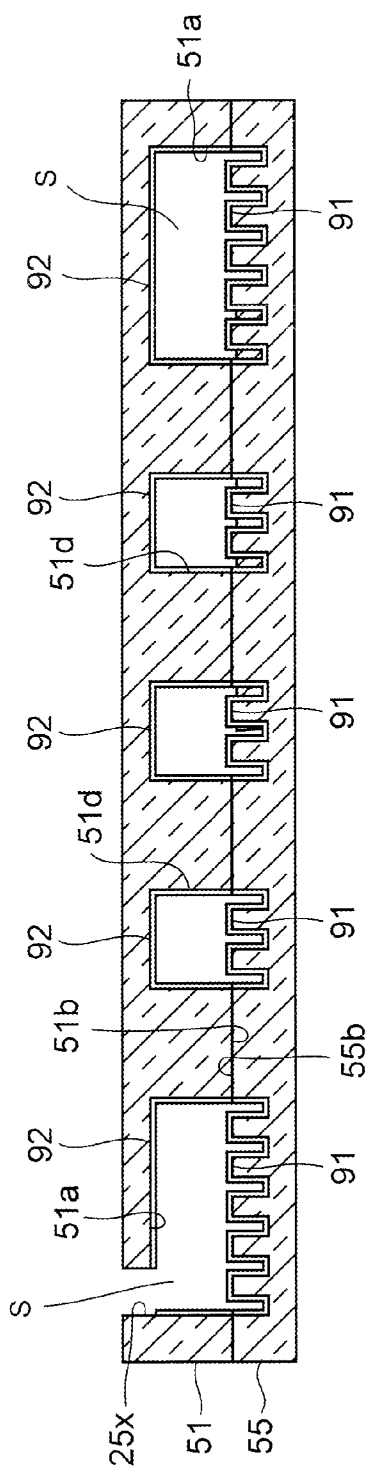

Next, description is given of steps performed to obtain a cross-sectional structure illustrated in FIG. 24H.

First, the first silicon substrate 51 and the second silicon substrate 55 are each cut into individual pieces by dicing.

Thereafter, the upper surfaces 51*b* and 55*b* of the silicon substrates 51 and 55 are bonded to each other by plasma activated bonding method. The bonding condition herein is not limited to a particular method. In the embodiment, the first silicon substrate 51 and the second silicon substrate 55 are bonded to each other by being heated at a temperature of about 300° C. for about two to three hours.

The cavity S partially defined by the recess portions 51*a* is formed by the aforementioned steps.

Figure 24I:
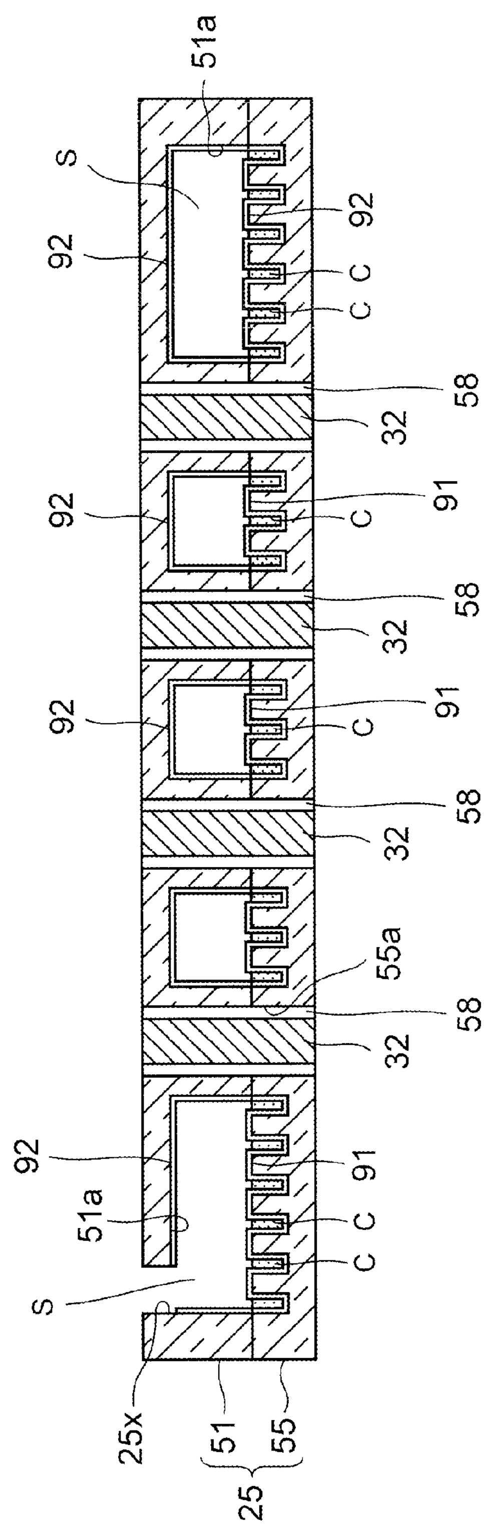

Thereafter, a basic structure of the first substrate 25 illustrated in FIG. 24I is obtained by performing the steps illustrated in FIG. 7F to FIG. 7H described in the first embodiment.

The coolant C such as water is supplied into the cavity S of the first substrate 25 via the first opening 25*x*.

(Second Example) FIGS. 25A to 25H are cross-sectional views of the first substrate 25 in the course of manufacturing thereof according to the second example.

In the example, the hydrophobic layer 92 is removed from the upper surface of the silicon substrate as described below.

Figure 25A:
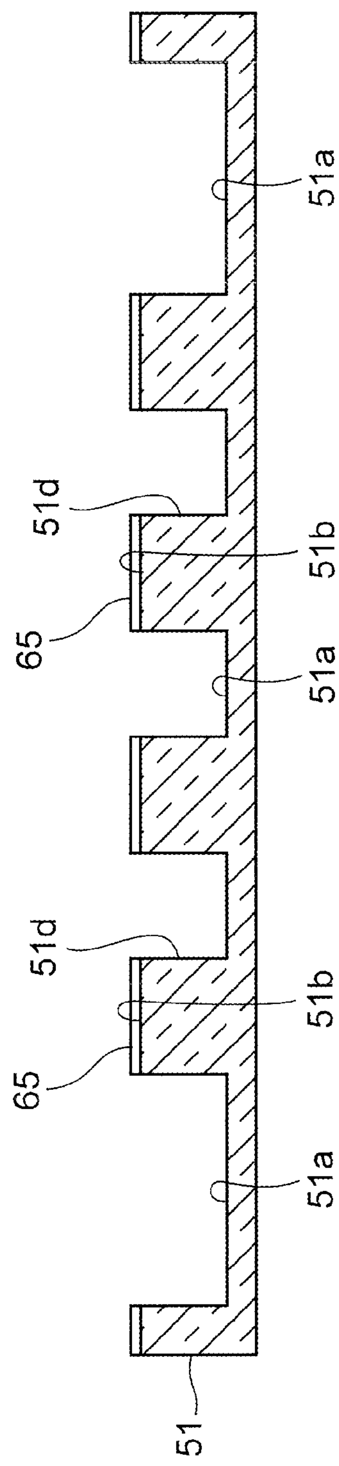
FIGS. 25A to 25H are cross-sectional views of the first substrate in the course of manufacturing thereof according to a second example of the fifth embodiment.

First, as illustrated in FIG. 25A, a silicon oxide film is formed on the upper surface 51*b* of the first silicon substrate 51 as a hard mask 65 to have a thickness of about 1 μm. The silicon oxide film may be formed by subjecting the upper surface 51*b* to thermal oxidation or by a CVD method.

Then, the hard mask 65 is patterned into a predetermined shape by dry etching using a not-illustrated resist film as a mask.

Thereafter, portions of the first silicon substrate 51 which are not covered with the hard mask 65 are dry-etched with a mixed gas of $SF_6$ gas and $C_4F_8$ gas used as the etching gas, and the plurality of recess portions 51*a* are thereby formed. A portion of the first silicon substrate 51 between each two adjacent recess portions 51*a* is the aforementioned protrusion 51*d*.

Figure 25B:
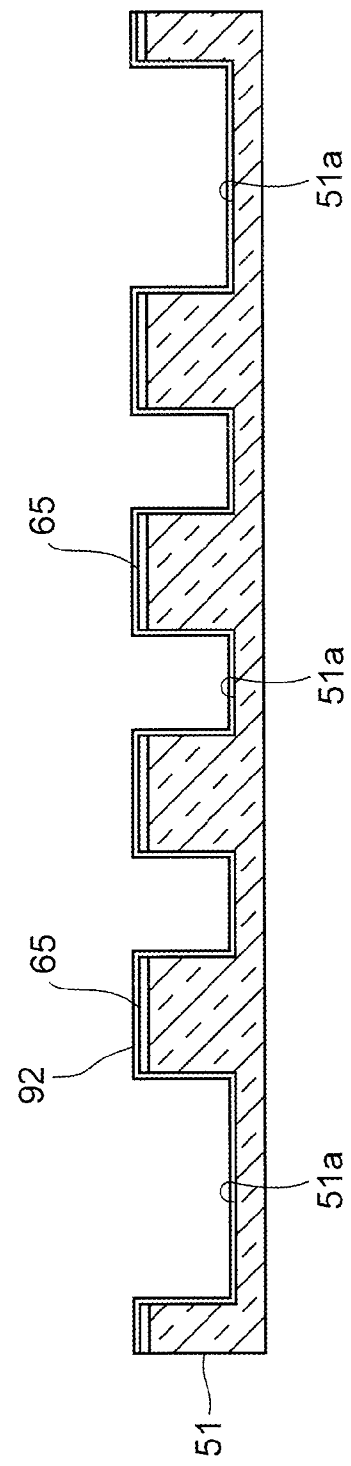

Next, as illustrated in FIG. 25B, the surfaces of the recess portions 51*a* and the hard mask are exposed to hydrofluoric acid, and the hydrophobic layer 92 is thereby formed on these surfaces.

Figure 25C:
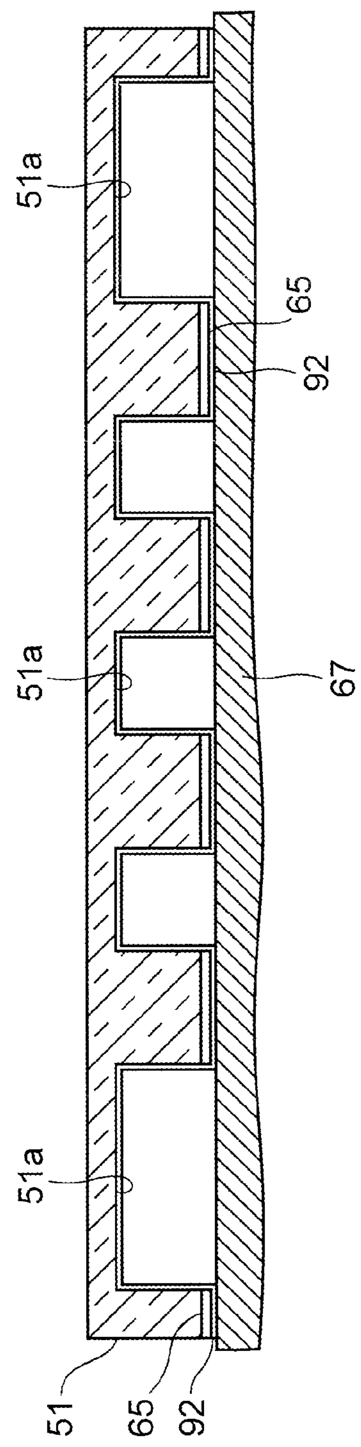

Next, as illustrated in FIG. 25C, a polishing pad 67 of a chemical mechanical polishing (CMP) apparatus is brought into sliding contact with the hydrophobic layer 92 with slurry supplied onto the polishing pad 67.

Figure 25D:
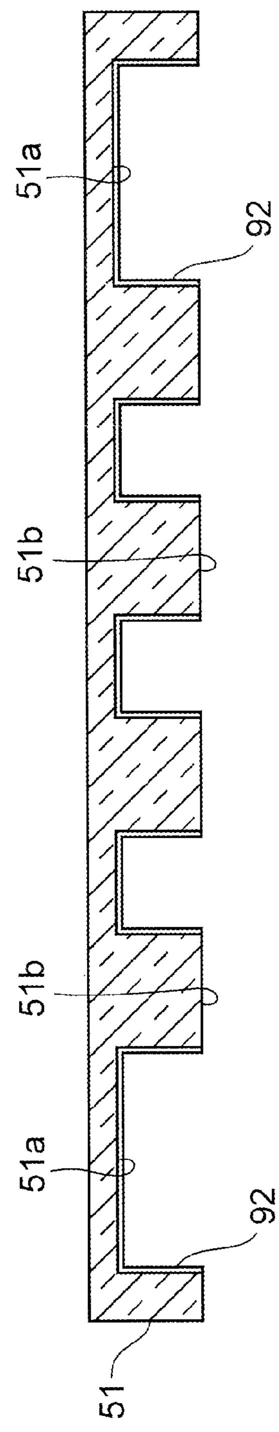

Then, the hard mask 65 is polished by a chemical mechanical polishing method, and the hard mask 65 and the hydrophobic layer 92 are thereby removed to expose the upper surface 51*b* of the first silicon substrate 51 as illustrated in FIG. 25D.

In this example, slurry by which the hard mask 65 is etched at a faster rate than the first silicon substrate 51 is is used as the slurry used in the chemical polishing method. Examples of such slurry include HS-S100 produced by Hitachi Chemical Co., Ltd.

Use of such slurry causes the upper surface 51*b* of the first silicon substrate 51 to act as a polishing stopper, and the polishing may be stopped at the upper surface 51*b*.

Furthermore, fine scratches formed on the upper surface 51*b* by abrasive grains may be prevented by using slurry including chemical solution and no abrasive grains as the slurry for the chemical polishing method. This may suppress decrease of bonding strength due to scratches on the upper surface 51*b* when the second silicon substrate 55 is bonded to the upper surface 51*b* by a plasma activated bonding method in the subsequent step.

Since the bonding strength between the upper surface 51*b* and the second silicon substrate 55 tends to decrease particularly when the surface roughness of the upper surface 51*b* exceeds 1 nm, it is preferable to keep the surface roughness of the upper surface 51*b* at 1 nm or less by using slurry including no abrasive grains as described above.

Figure 25E:
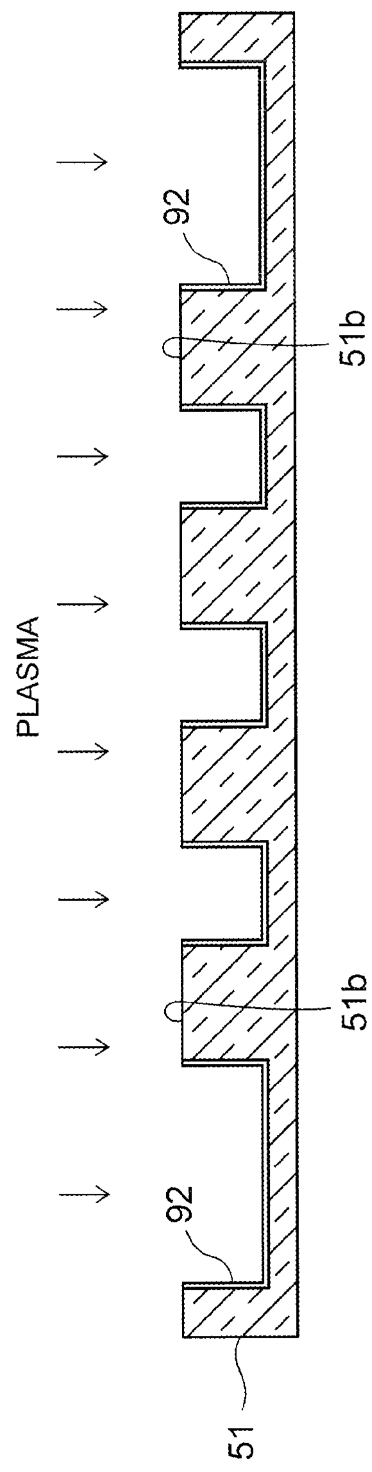

Next, as illustrated in FIG. 25E, the upper surface 51*b* of the first silicon substrate 51 is activated by being exposed to nitrogen plasma or oxygen plasma.

At this time, since the hydrophobic layer 92 is removed from the upper surface 51*b* in the embodiment, hindering of the activation of the upper surface 51*b* by the hydrophobic layer 92 is prevented.

Figure 25F:
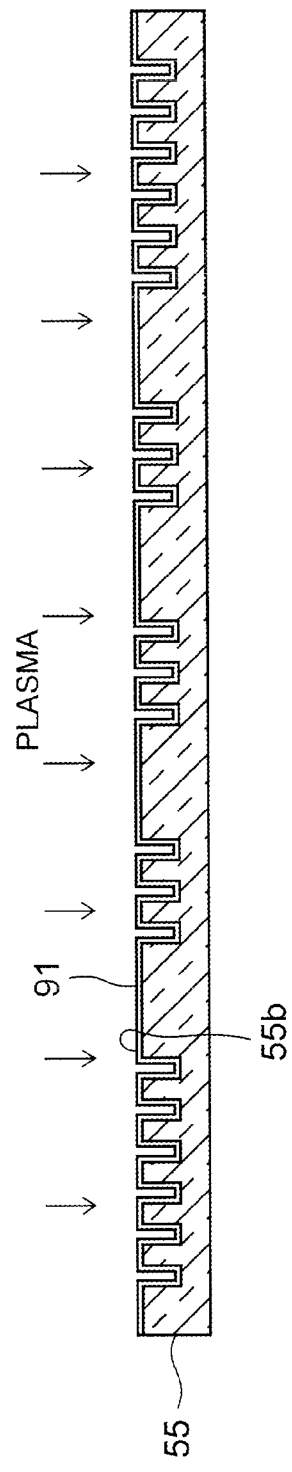

Then, as illustrated in FIG. 25F, the upper surface 55*b* of the second silicon substrate 55 is activated as in the case of the upper surface 51*b* by being exposed to nitrogen plasma or oxygen plasma through the hydrophilic layer 91.

Figure 25G:
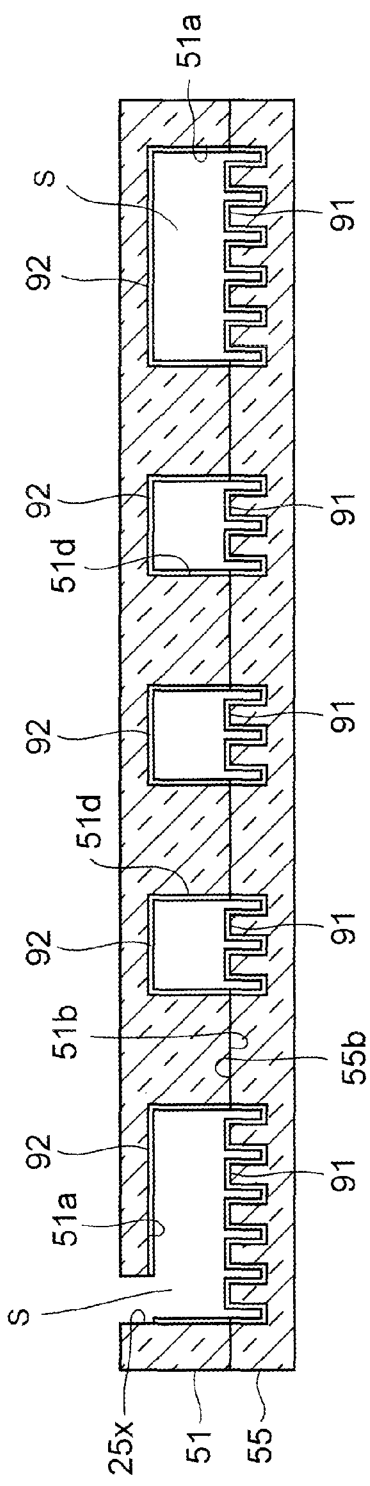

Next, description is given of steps performed to obtain a cross-sectional structure illustrated in FIG. 25G.

First, the first silicon substrate 51 and the second silicon substrate 55 are each cut into individual pieces by dicing.

Thereafter, the upper surfaces 51*b* and 55*b* of the silicon substrates 51 and 55 are bonded to each other by the plasma activated bonding method. For example, in the plasma activated bonding method, the first silicon substrate 51 and the second silicon substrate 55 are bonded to each other by being heated at a temperature of about 300° C. for about two to three hours.

In this case, since the hydrophobic layer 92 is removed in advance from the upper surface 51*b* of the first silicon substrate 51 in the embodiment, it is possible to suppress decrease of bonding strength between the silicon substrates 51 and 55 due to the hydrophobic layer 92.

Figure 25H:
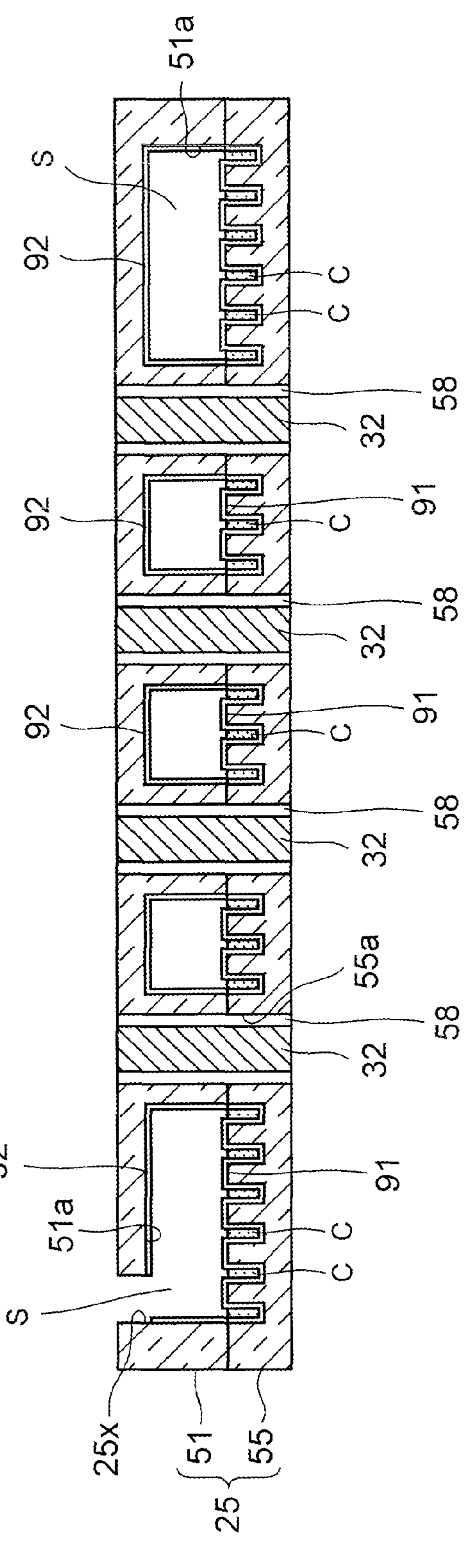

Thereafter, a basic structure of the first substrate 25 illustrated in FIG. 25H is obtained by performing the steps illustrated in FIG. 7F to FIG. 7H described in the first embodiment.

The coolant C such as water is supplied into the cavity S of the first substrate 25 via the first opening 25*x*.

(Third Example) FIGS. 26A to 26G are cross-sectional views of the first substrate 25 in the course of manufacturing thereof according to the third example.

The upper surface 51*b* of the first silicon substrate 51 is exposed by the CMP method also in this example as in the second example.

Figure 26A:
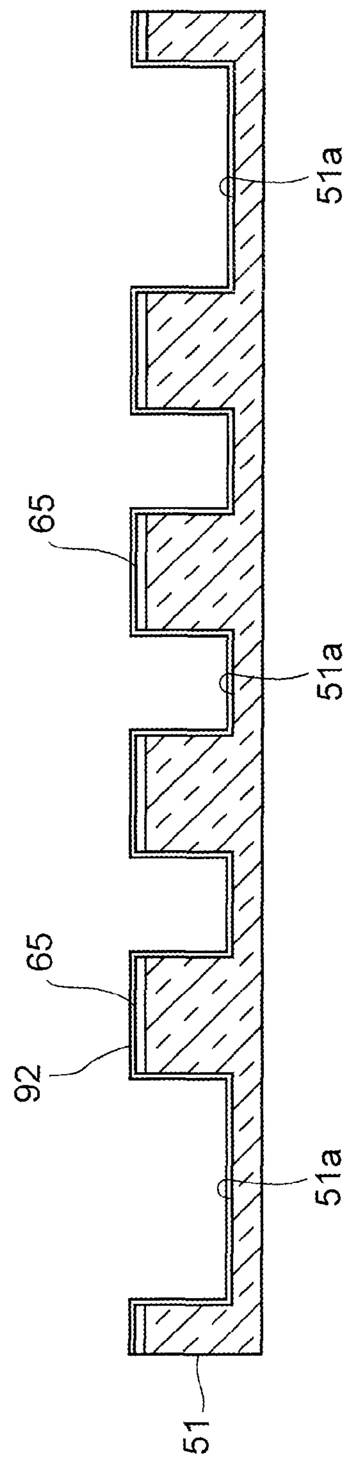
FIGS. 26A to 26G are cross-sectional views of the first substrate in the course of manufacturing thereof according to a third example of the fifth embodiment.

First, as illustrated in FIG. 26A, the hydrophobic layer 92 is formed on the surfaces of the hard mask 65 and the recess portions 51*a* as in the second example (see FIG. 25B).

Figure 26B:
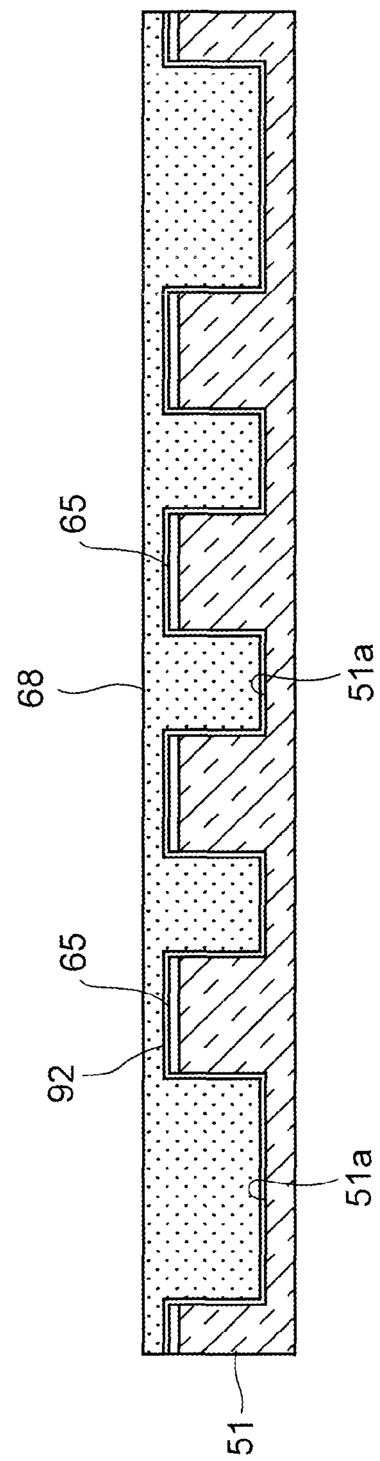

Next, as illustrated in FIG. 26B, a resist film 68 is formed on the hydrophobic layer 92, and the recess portions 51*a* and the hard mask 65 are thereby covered with the resist film 68.

Figure 26C:
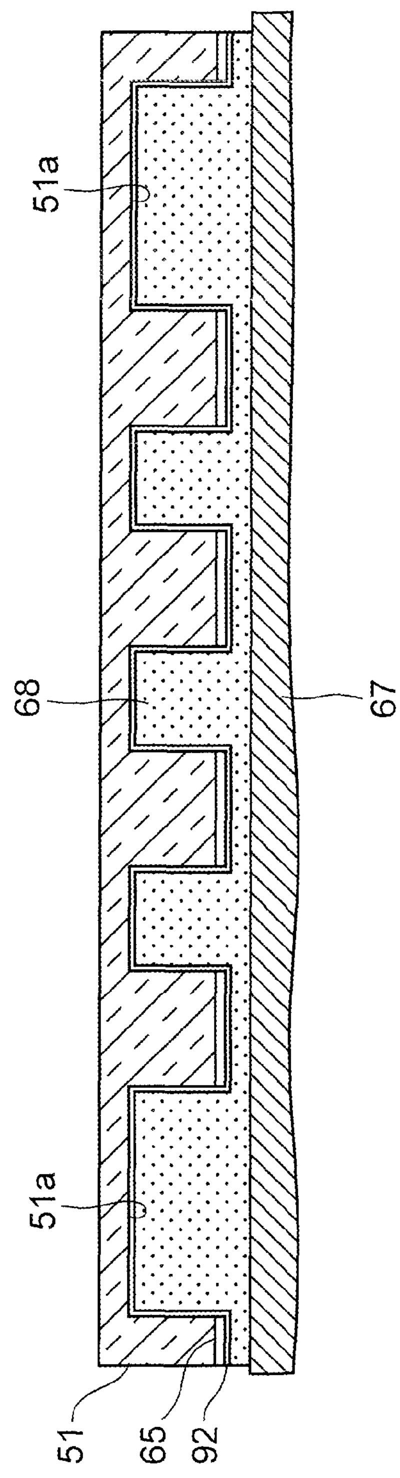

Then, as illustrated in FIG. 26C, the resist film 68 is brought into sliding contact with the polishing pad 67 of the chemical mechanical polishing (CMP) apparatus with slurry supplied onto the polishing pad 67.

Figure 26D:
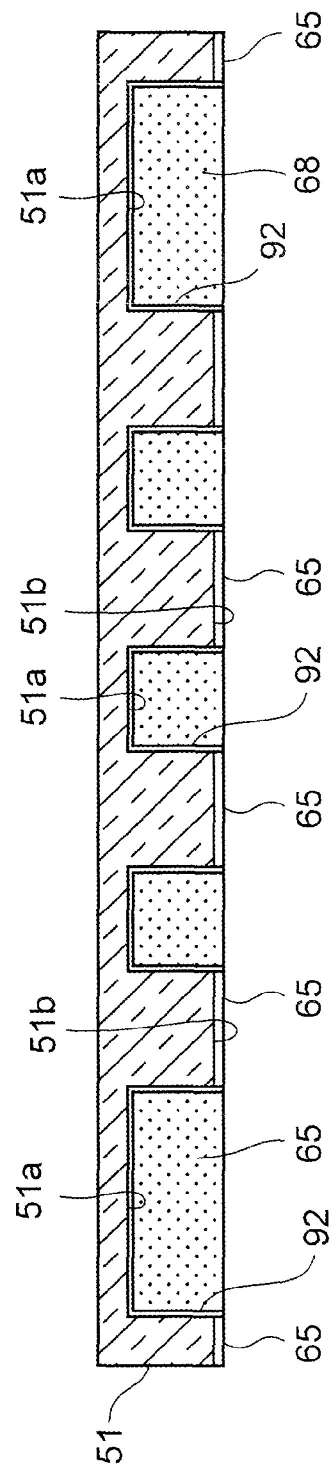

Then, as illustrated in FIG. 26D, the resist film 68 is polished by the chemical mechanical polishing method, and the hard mask 65 is thereby exposed.

The slurry used in this step is not limited to particular slurry. However, it is preferable to use slurry by which the resist film 68 is etched at a faster rate than the hard mask 65 is, so that the polishing may be stopped on the hard mask 65 and the upper surface 51*b* of the first silicon substrate 51 may be thus prevented from being damaged by the polishing. Examples of such slurry include HS-J700-1 produced by Hitachi Chemical Co., Ltd.

Figure 26E:
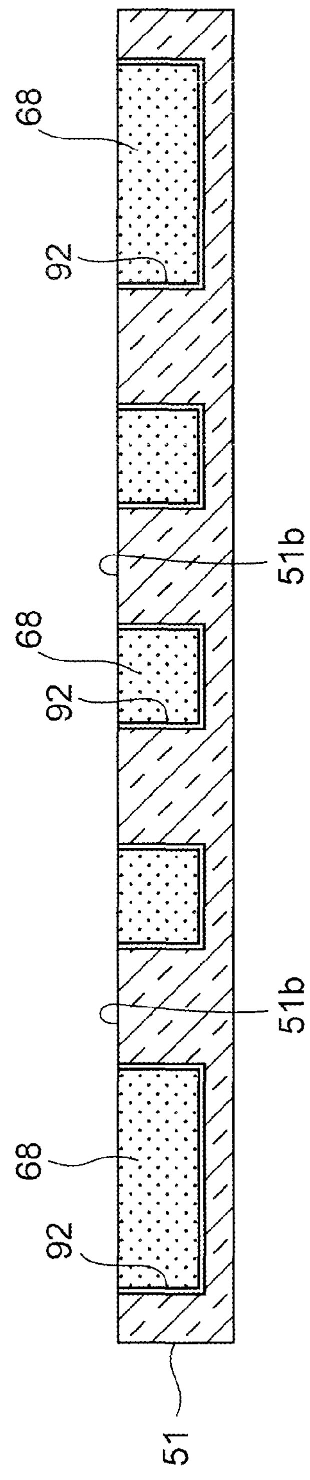

Next, as illustrated in FIG. 26E, the hard mask 65 is removed by wet etching, and the upper surface 51*b* of the first silicon substrate 51 is thereby exposed. Examples of etchant used in this wet etching include hydrofluoric acid.

In the example, since the hard mask 65 is removed by wet etching as described above, the upper surface 51*b* receives no mechanical damage in the removal of the hard mask 65, and roughness in the upper surface 51*b* caused by this damage may be prevented.

Figure 26F:
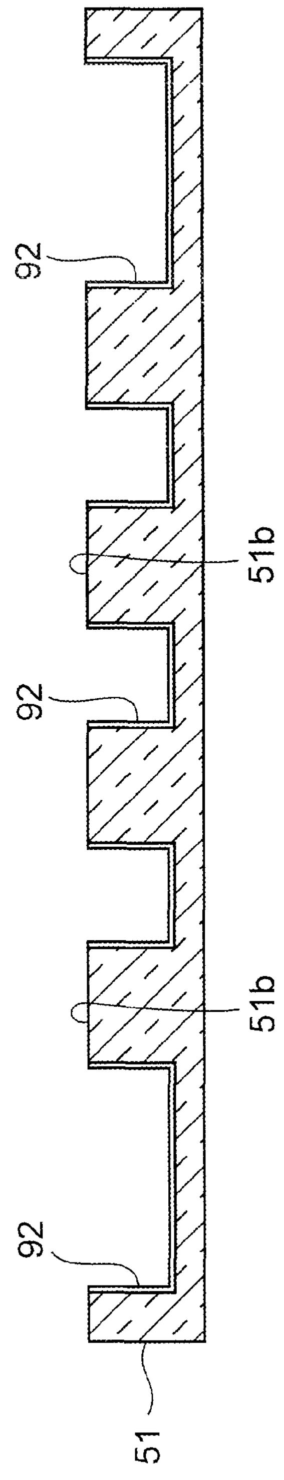

Thereafter, as illustrated in FIG. 26F, the resist film 68 is removed.

Figure 26G:
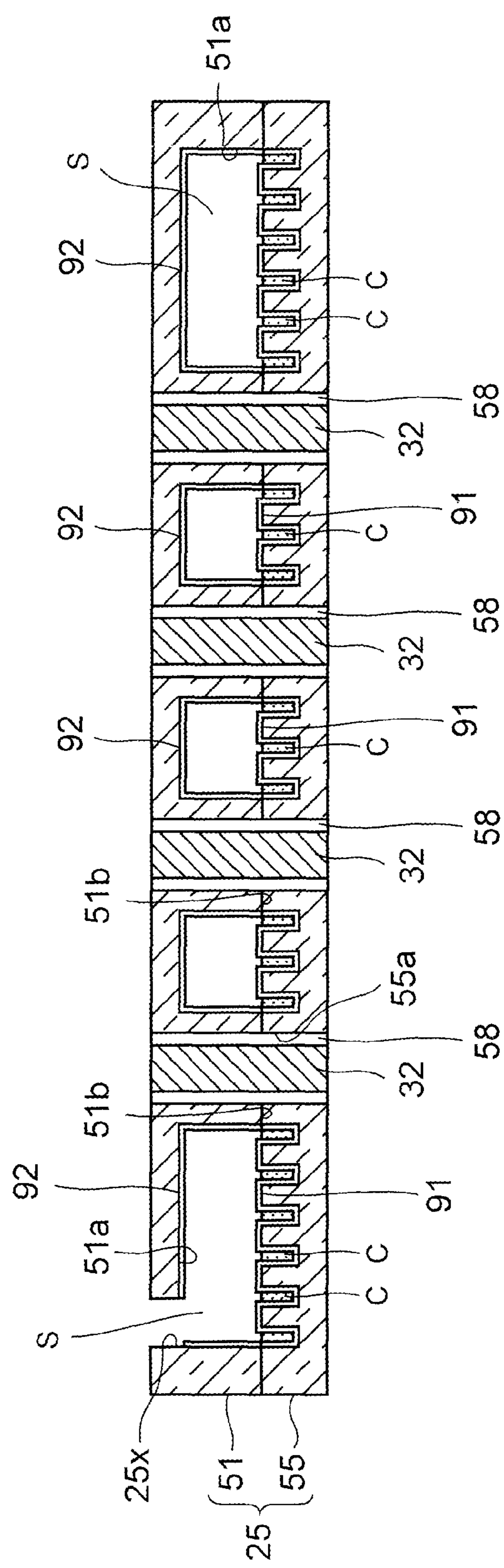

Then, a basic structure of the first substrate 25 illustrated in FIG. 26G is completed by performing steps illustrated in FIG. 25E to FIG. 25H described in the second example.

The silicon substrates 51 and 55 are bonded to each other by the plasma activated bonding method.

In the example, since the upper surface 51*b* receives no mechanical damage as described above, the silicon substrates 51 and 55 may be bonded to each other in an excellent manner.

(Fourth Example) In the fourth example, the upper surface 51*b* of the first silicon substrate 51 is selectively activated as follows.

Figure 27A:
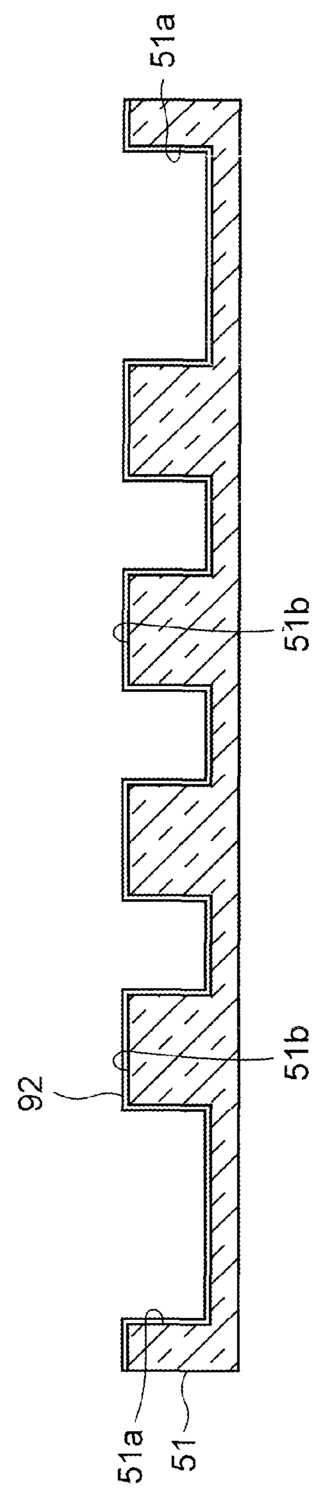
FIGS. 27A to 27C are cross-sectional views of the first substrate in the course of manufacturing thereof according to a fourth example of the fifth embodiment.
Figure 27B:
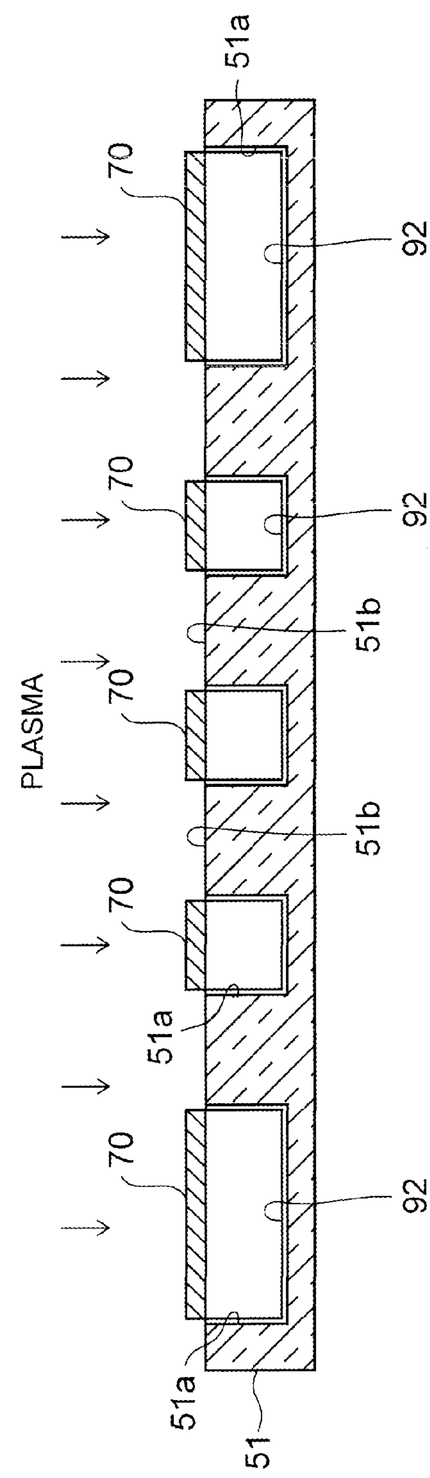
Figure 27C:
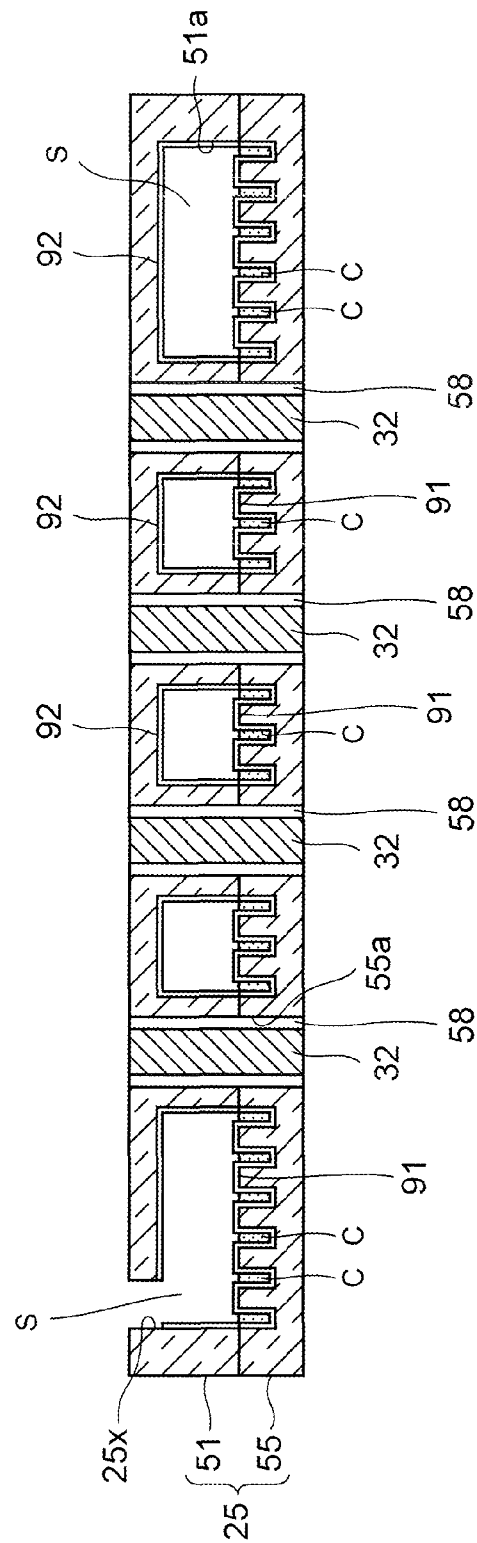

FIGS. 27A to 27C are cross-sectional views of the first substrate 25 in the course of manufacturing thereof according to the example.

First, as illustrated in FIG. 27A, a structure in which the hydrophobic layer 92 is formed in each of the recess portions 51*a* and the upper surface 51*b* of the first silicon substrate 51 is fabricated by performing the steps of FIG. 24A to FIG. 24B described in the first example.

Next, as illustrated in FIG. 27B, the recess portions 51*a* are covered with a mask 70 such as silicon substrates. Then, portions of the upper surface 51*b* which are not covered with the mask 70 is selectively exposed to nitrogen plasma or oxygen plasma to remove the hydrophobic layer 92 from the upper surface 51*b* and to activate the upper surface 51*b*.

The upper surface 51*b* of the first silicon substrate 51 may be thereby selectively activated with the hydrophobic layer 92 in the recess portions 51*a* prevented from being degraded by the plasma.

The upper surface 51*b* may be activated by exposing the upper surface 55*b* to an ion beam such as an argon ion beam instead the aforementioned nitrogen plasma or oxygen plasma.

Thereafter, a basic structure of the first substrate 25 illustrated in FIG. 27C is completed by performing steps illustrated in FIG. 25F to FIG. 25H described in the second example.

(Fifth Example) In the first example, the hydrophobic layer 92 is formed on the surfaces of the recess portions 51*a* by using hydrofluoric acid or fluoride-based coating material as described with reference to FIG. 24B. Instead of performing such chemical processing, the hydrophobic layer 92 is physically formed in the fifth example.

Figure 28:
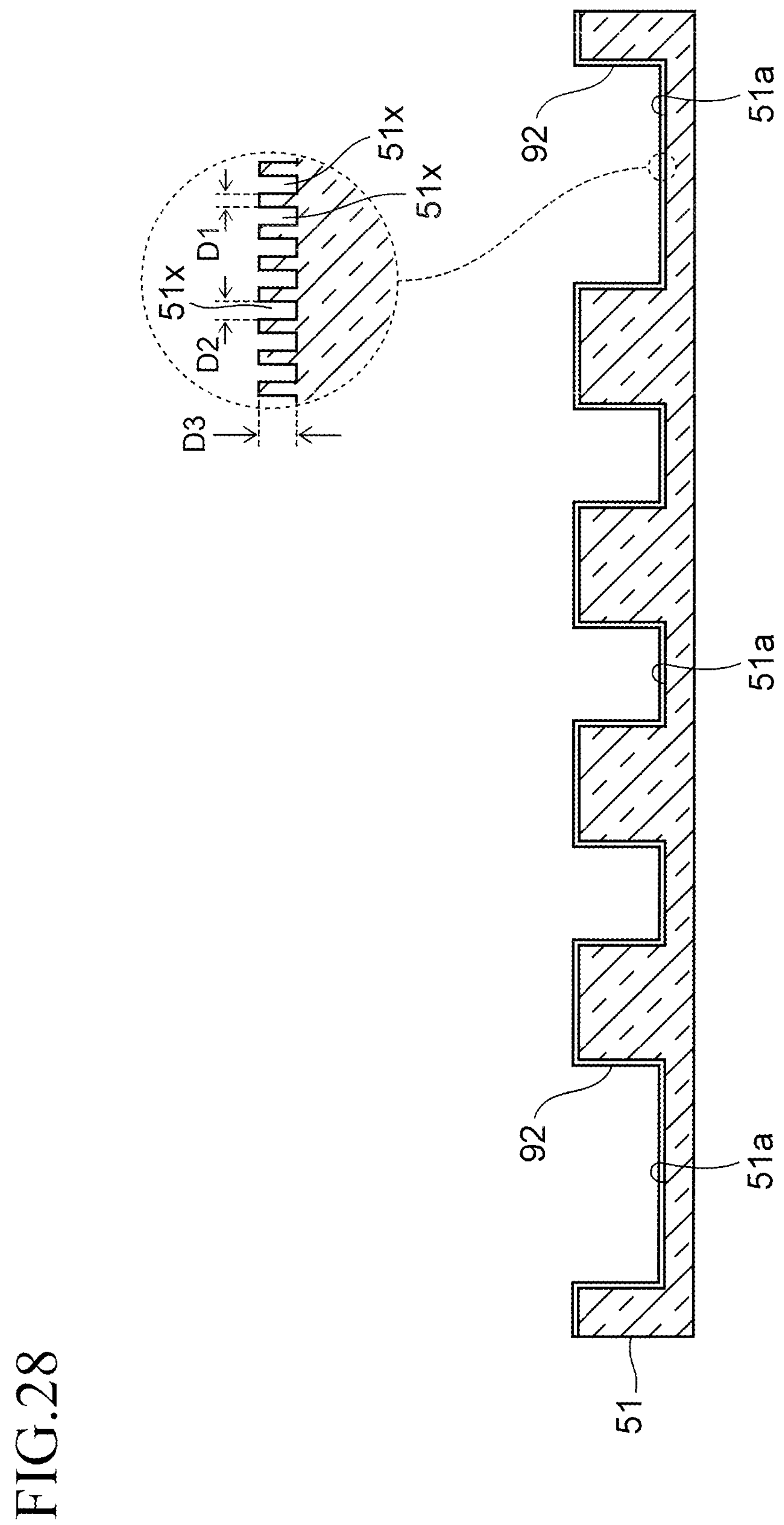
FIG. 28 is a cross-sectional view for explaining a method of forming a hydrophobic layer according to a fifth example of the fifth embodiment.

FIG. 28 is a cross-sectional view for explaining a method of forming the hydrophobic layer according to the example.

As illustrated in FIG. 28, a plurality of fine grooves 51*x* are formed on the surfaces of the recess portions 51*a* in the example and are used as the hydrophobic layer 92.

The width D1 of each groove 51*x* is about 1 nm to 20 nm, and the interval D2 between each two adjacent grooves 51*x* is about 500 nm to 1000 nm. Moreover, depth D3 of each groove 51*x* is about 500 nm to 1000 nm.

Such a pattern of the fine grooves 51*x* is also called nanopattern and may be formed by dry-etching the surfaces of the recess portions 51*a* with a not-illustrated resist mask used as a mask.

This method may eliminate the step of exposing the surfaces of the recess portions 51*a* to hydrofluoric acid to hydrophobize the surfaces.

(Sixth Example) In the sixth example, blocking of the cavity S by the coolant C is more effectively prevented in the following way.

Figure 29A:
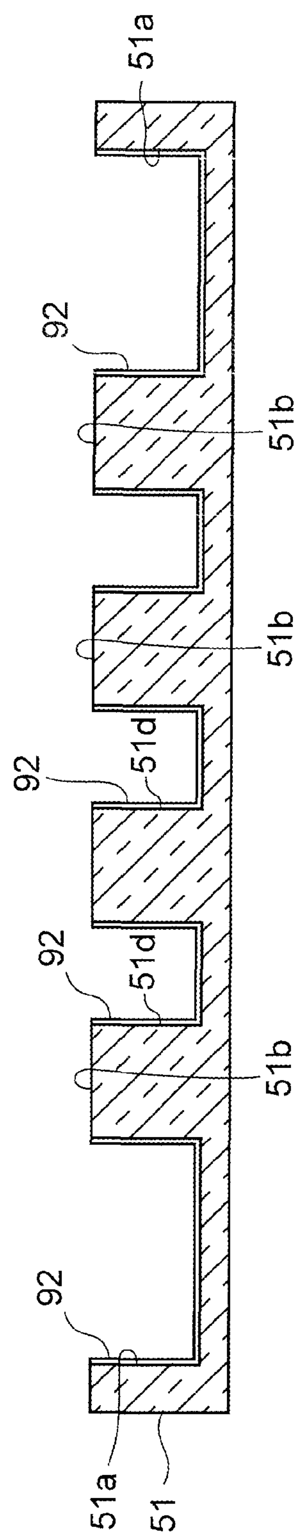
FIGS. 29A to 29C are cross-sectional views of the first substrate in the course of manufacturing thereof according to a sixth example of the fifth embodiment.
Figure 29B:
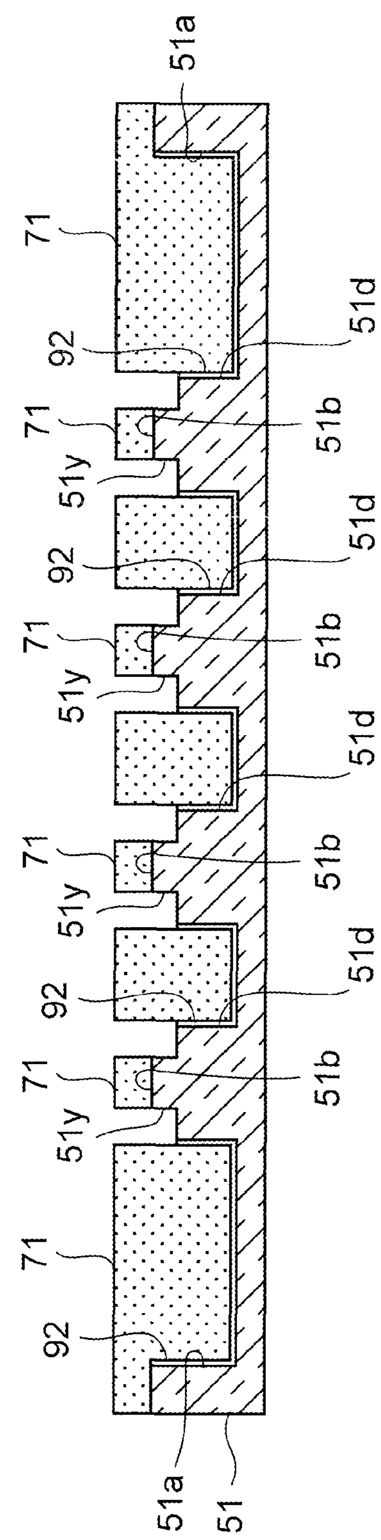
Figure 29C:
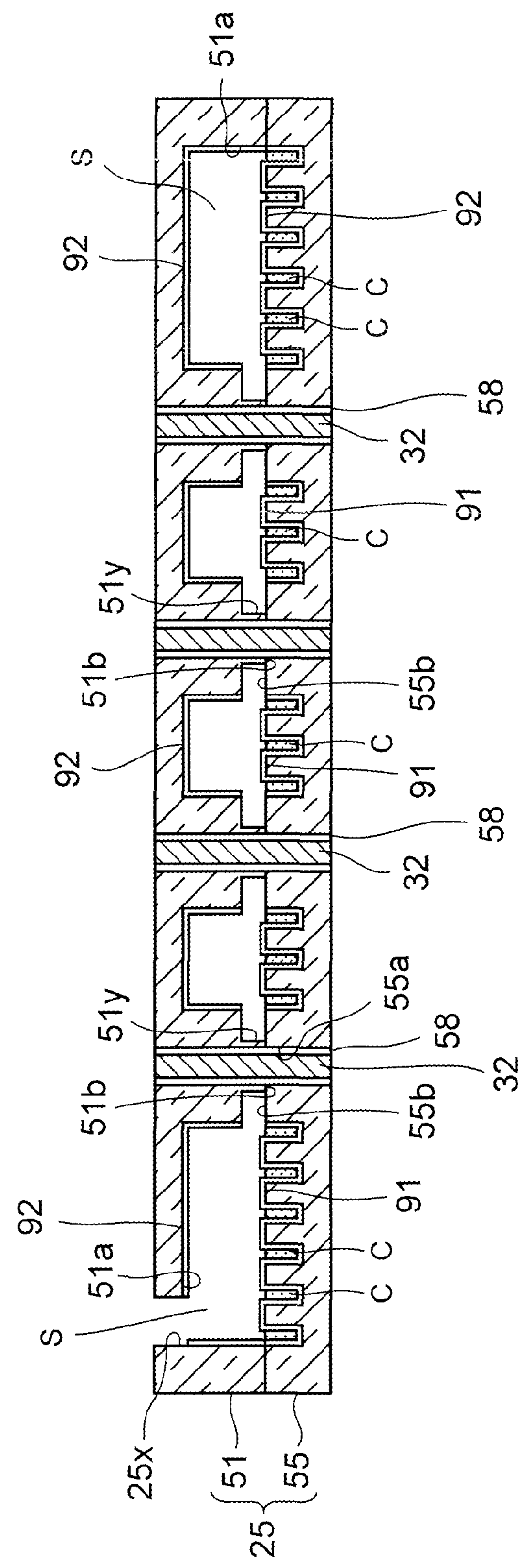

FIGS. 29A to 29C are cross-sectional views of the first substrate 25 in the course of manufacturing thereof according to the sixth example.

First, as illustrated in FIG. 29A, a structure in which the hydrophobic layer 92 is formed on the surfaces of the recess portions 51*a* of the first silicon substrate 51 is obtained by performing the steps of FIG. 25A to FIG. 25D in the second example. In this stage, it is preferable that the hydrophobic layer 92 is formed on the surfaces of the recess portions 51*a*, and the hydrophobic layer 92 may be formed on the surfaces of the recess portions 51*a* by using any of the methods described in the aforementioned first, third, and fourth examples.

Next, as illustrated in FIG. 29B, a resist film 71 in which portions of the upper surface 51*b* in peripheral edges of the protrusions 51*d* are exposed is formed. Then, the portions of the upper surface 51*b* in peripheral edges of the protrusions 51*d* are dry-etched with the resist film 71 used as a mask, and protruding portions 51*y* are thereby formed in the upper surface 51*b*. Examples of gas usable in this dry etching include the mixed gas of $SF_6$ gas and $C_4F_8$ gas.

Thereafter, the resist film 71 is removed.

Then, a basic structure of the first substrate 25 as illustrated in FIG. 29C is completed by performing the steps of FIG. 25E to FIG. 25H described in the second example.

In the first substrate 25, the upper surface 51*b* in the protruding portions 51*y* and the upper surface 55*b* of the second silicon substrate 55 are bonded to each other by the plasma activated bonding method. Then, the second conductive plugs 32 are provided to penetrate the protruding portions 51*y*.

Figure 30:
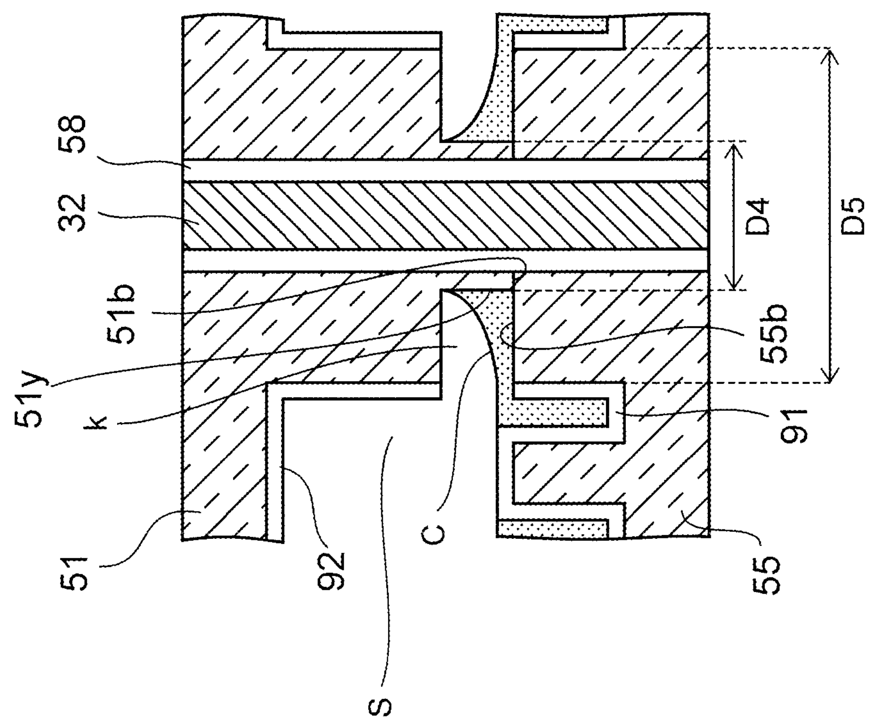
FIG. 30 is an enlarged cross-sectional view of a protruding portion 51*y* and its vicinity, the protruding portion 51*y* included in the first substrate according to the sixth example of the fifth embodiment.

FIG. 30 is an enlarged cross-sectional view of the protruding portion 51*y* and its vicinity.

As illustrated in FIG. 30, providing the protruding portion 51*y* forms a gap K lateral to the protruding portion 51*y*. Accordingly, even when the coolant C climbs upward toward an upper portion of the cavity S, the coolant C is trapped in the gap K and the blocking of the cavity S by the coolant C may be thereby effectively suppressed.

Furthermore, since the width D4 of the upper surface 51*b* in the protruding portion 51*y* is smaller than the width D5 of the upper surface 55*b* of the second silicon substrate 55, the protruding portion 51*y* is less likely to protrude out from the upper surface 55*b* of the second silicon substrate 55 even when the silicon substrates 51 and 55 are misaligned. As a result, the second conductive plugs 32 may be easily made to penetrate the portion where the protruding portion 51*y* and the upper surface 55*b* are bonded to each other, and the alignment accuracy of the silicon substrates 51 and 55 may be relaxed.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:

a first semiconductor element;

a first substrate provided on the first semiconductor element and including a cavity with reduced pressure;

a coolant held inside the cavity;

a second semiconductor element provided on the first substrate; and a heat spreading member thermally connected to the first substrate, wherein a hole is formed inside the heat spreading member, where the hole being communicated with the cavity, the first substrate has an upper surface extending beyond the second semiconductor element, the heat spreading member has a first lower surface and a second lower surface, where the first lower surface being connected to a portion of the upper surface extending beyond the second semiconductor element, and the second lower surface being positioned higher than the first lower surface, and being connected to an upper surface of the second semiconductor element.

2. The semiconductor device according to claim 1, wherein the heat spreading member is provided with a pipe communicated with the hole.

3. The semiconductor device according to claim 1, further comprising:

a second substrate provided on the second semiconductor element.

4. The semiconductor device according to claim 1, wherein the first substrate has a wick configured to hold the coolant, on an inner surface of the cavity.

5. The semiconductor device according to claim 1, wherein the cavity is divided into a plurality of channels extending from a center of the first substrate to a peripheral edge of the first substrate.

6. The semiconductor device according to claim 1, wherein the first substrate has a pillar inside the cavity.

7. The semiconductor device according to claim 1, further comprising:

a conductive plug penetrating the first substrate, wherein the first semiconductor element and the second semiconductor element are electrically connected to each other via the conductive plug.

8. The semiconductor device according to claim 7, wherein a plurality of the conductive plugs are provided at intervals in a plan view, and a filler body which fills a portion of the cavity and through which the plurality of conductive plugs pass is provided in the cavity above the first semiconductor element.

9. The semiconductor device according to claim 1, wherein the cavity is larger than the first semiconductor element in a plan view.

10. The semiconductor device according to claim 1, wherein a surface of the cavity includes a lower surface close to the first semiconductor element and a ceiling surface close to the second semiconductor element, and hydrophilicity of the lower surface is higher than hydrophilicity of the ceiling surface.

11. An electronic device comprising:

a semiconductor device including a first semiconductor element, a substrate provided on the first semiconductor element and including a cavity with reduced pressure, a coolant held inside the cavity, a second semiconductor element provided on the substrate, and a heat spreading member thermally connected to the substrate, wherein a hole is formed inside the heat spreading member, where the hole being communicated with the cavity, the substrate has an upper surface extending beyond the second semiconductor element, the heat spreading member has a first lower surface and a second lower surface, where the first lower surface being connected to a portion of the upper surface extending beyond the second semiconductor element, and the second lower surface being positioned higher than the first lower surface, and being connected to an upper surface of the second semiconductor element.

12. The electronic device according to claim 11, wherein a surface of the cavity includes a lower surface close to the first semiconductor element and a ceiling surface close to the second semiconductor element, and hydrophilicity of the lower surface is higher than hydrophilicity of the ceiling surface.

* * * * *